(12) United States Patent
Saarinen et al.

(10) Patent No.: US 10,324,132 B2
(45) Date of Patent: Jun. 18, 2019

(54) SYSTEMS AND METHODS FOR POWER LINE EVENT ZONE IDENTIFICATION

(75) Inventors: Kari Saarinen, Västerås (SE);
Mirrasoul Mousavi, Cary, NC (US);
James Stoupis, Durham, NC (US);
John McGowan, Allentown, PA (US)

(73) Assignee: ABB Inc., Zurich (CH)

( * ) Notice: Subject to any disclaimer, the term of this patent is extended or adjusted under 35 U.S.C. 154(b) by 168 days.

(21) Appl. No.: 13/155,249

(22) Filed: Jun. 7, 2011

(65) Prior Publication Data
US 2012/0004869 A1 Jan. 5, 2012

Related U.S. Application Data

(60) Provisional application No. 61/437,309, filed on Jan. 28, 2011, provisional application No. 61/392,065, (Continued)

(51) Int. Cl.
*G01R 31/327* (2006.01)
*G01R 31/08* (2006.01)
(Continued)

(52) U.S. Cl.
CPC ....... *G01R 31/3274* (2013.01); *G01R 31/021* (2013.01); *G01R 11/25* (2013.01);
(Continued)

(58) Field of Classification Search
CPC . G01R 31/3274; G01R 31/086; Y02E 60/724; Y04S 10/522
See application file for complete search history.

(56) References Cited

U.S. PATENT DOCUMENTS 5,341,268 A * 8/1994 Ishiguro ................. H02H 7/261
361/62
5,396,180 A 3/1995 Hampton
(Continued)

FOREIGN PATENT DOCUMENTS

CA 2320565 A1 3/2002
EP 2192416 A1 6/2010
(Continued)

OTHER PUBLICATIONS

I. Jedlicska, International Searching Authority (EPO), International Search Report and Written Opinion of the International Searching Authority for International Application No. PCT/US2011/039480, European Patent Office, dated Oct. 11, 2011.
(Continued)

*Primary Examiner* — John C Kuan
(74) *Attorney, Agent, or Firm* — Taft Stettinius & Hollister LLP; J. Bruce Schelkopf

(57) ABSTRACT

Systems and methods for power line event zone identification are disclosed. Power line event zone identification may include receiving measured data corresponding to a signal measured on a power line, determining from the measured data that a power line event has occurred, and identifying a probable one of at least two monitoring zones in which the power line event occurred. The at least two monitoring zones may be defined for an Intelligent Electronic Device (IED). The systems may include an IED connected to the power line and a processor linked to the IED.

17 Claims, 33 Drawing Sheets

Related U.S. Application Data filed on Oct. 12, 2010, provisional application No. 61/351,981, filed on Jun. 7, 2010.

(51) Int. Cl.
*G01R 31/02* (2006.01)
*G01R 11/25* (2006.01)

(52) U.S. Cl.
CPC ............ *G01R 31/02* (2013.01); *G01R 31/086* (2013.01); *Y02E 60/724* (2013.01); *Y04S 10/522* (2013.01)

(56) References Cited

U.S. PATENT DOCUMENTS

| | | | |
|---|---|---|---|
| 5,477,408 | A | 12/1995 | Schweitzer |
| 5,859,596 | A | 1/1999 | McRae |
| 5,973,899 | A | 10/1999 | Williams |
| 6,065,136 | A | 5/2000 | Kuwabara |
| 6,160,477 | A | 12/2000 | Sandelman |
| 6,199,018 | B1 | 3/2001 | Quist |
| 6,298,377 | B1 | 10/2001 | Hartikainen |
| 6,369,996 | B1 | 4/2002 | Bo |
| 6,601,001 | B1 | 7/2003 | Moore |
| 6,654,216 | B2 | 11/2003 | Horvath |
| 6,697,894 | B1 | 2/2004 | Mitchell |
| 6,745,154 | B2 | 6/2004 | Mifune |
| 6,751,562 | B1 | 6/2004 | Blackett |
| 6,782,345 | B1 | 8/2004 | Siegel |
| 6,795,799 | B2 | 9/2004 | Deb |
| 6,832,169 | B2 | 12/2004 | Wakida |
| 6,996,483 | B2 | 2/2006 | Parsons |
| 7,400,150 | B2* | 7/2008 | Cannon .................. 324/522 |
| 7,558,703 | B2 | 7/2009 | Stoupis |
| 7,672,812 | B2 | 3/2010 | Stoupis |
| 7,725,295 | B2 | 5/2010 | Stoupis |
| 8,000,910 | B2 | 8/2011 | Bickel |
| 9,217,775 | B2 | 12/2015 | Mousavi et al. |
| 2004/0243636 | A1 | 12/2004 | Hasiewicz |
| 2005/0078425 | A1 | 4/2005 | Morris |
| 2006/0235574 | A1 | 10/2006 | Lapinski |
| 2007/0059986 | A1 | 3/2007 | Rockwell |
| 2007/0211401 | A1 | 9/2007 | Mak |
| 2008/0100307 | A1 | 5/2008 | Stoupis |
| 2008/0130182 | A1* | 6/2008 | Anderson et al. .......... 361/78 |
| 2008/0165461 | A1 | 7/2008 | Paik |
| 2009/0085574 | A1 | 4/2009 | Pan |
| 2009/0091441 | A1* | 4/2009 | Schweitzer, III ... G01M 13/028 340/531 |
| 2010/0161835 | A1 | 6/2010 | Syed |
| 2011/0066391 | A1 | 3/2011 | AbuAli et al. |
| 2011/0144931 | A1 | 6/2011 | Smit |
| 2011/0184671 | A1 | 7/2011 | Abiprojo |
| 2011/0264388 | A1* | 10/2011 | Gong ............. G01R 31/086 702/58 |
| 2013/0218353 | A1 | 8/2013 | San Andres |
| 2013/0218354 | A1 | 8/2013 | San Andres |

FOREIGN PATENT DOCUMENTS

| | | |
|---|---|---|
| EP | 2390980 A1 | 11/2011 |
| WO | 9912048 | 3/1999 |
| WO | 0039904 | 7/2000 |
| WO | 03023426 | 3/2003 |
| WO | 2008063043 | 5/2008 |
| WO | 2008134995 A1 | 11/2008 |
| WO | 2008151740 A1 | 12/2008 |
| WO | 2009151740 A1 | 12/2009 |
| WO | 2010077830 A2 | 7/2010 |

OTHER PUBLICATIONS

I. Jedlicska, International Searching Authority (EPO), International Search Report and Written Opinion of the International Searching Authority for International Application No. PCT/US2011/039471, European Patent Office, dated Dec. 21, 2011.

S. Santoso and T. A. Short, "Identification of Fuse and Recloser Operations in a Radial Distribution System," IEEE Transactions on Power Delivery, Oct. 2007, pp. 2370-2377, vol. 22, No. 4.

M. Chaganti and B. H. Chowdhury, "Data mining of Substation Relay Data," Power Engineering Society General Meeting, 2004. IEEE, pp. 369-375, vol. 1, Jun. 6-10, 2004.

M. Kezunovic, T. Popovic, D.R. Sevcik and A. Chitambar, "Automated Fault Analysis Using Advanced Information Technology for Data Integration and Information Exchange," CIGRE, vol. B5-102, 2004.

L. E. Smith, "Analysis of Substation Data", A report by Working Group I-19 to the Relaying Practices Subcommittee, of the Power System Relaying Committee, Power Engineering Society of the IEEE. PSRC Report, 2002.

A. P. Apostolov and S. Richards, "Event Driven Maintenance Based on Protective Relays Data," Developments in Power System Protection, Conference Publication No. 479, pp. 25-28, IEEE 2001.

D. P. Buse, P. Sun, Q. H. Wu and J. Fitch, "Agent-Based Substation Automation," Power and Energy Magazine, IEEE, vol. 1, No. 2, pp. 50-55, Mar.-Apr. 2003.

J. M. Pond and A. Makki, "A Universal Approach for Retrieving, and Analyzing Event and Fault Records," National Grid USA and SoftStuf, Inc., DistribuTech 2005.

M. Kezunovic and G. Latisko, "Automated Monitoring Functions for Improved Power System Operation and Control," IEEE MELECON 2004, May 12-15, 2004, Dubrovnik, Croatia, pp. 877-880.

M. Kezunovic, I. Rikalo, C. W. Fromen, D. R. Sevcik, "New Automated Fault Analysis Approaches Using Intelligent System Technologies," International Conference on Power System Technology, Beijing, China, Oct. 1994.

U.S. Appl. No. 13/155,274.

U.S. Appl. No. 13/155,236.

I. Jedlicska, International Searching Authority (EPO), International Search Report and Written Opinion of the International Searching Authority for corresponding International Application No. PCT/US2011/039488, European Patent Office, dated Oct. 12, 2011.

R. Moghe, M. Mousavi, J. Stoupis and J. McGowan, "Field Investigation and Analysis of Incipient Faults Leading to a Catastrophic Failure in an Underground Distribution Feeder," Power Systems Conference and Exposition, 2009, IEEE/PES, New Jersey, USA, pp. 1-6, Mar. 15, 2009.

E. Styvaktakis, M. H. J. Bollen and I. Y. H. Gu, "A fault location technique for two and three terminal lines using high frequency fault clearing transients," Electric Power Engineering, PowerTech Budapest 99, Aug. 29-Sep. 2, 1999, IEEE, New Jersey, USA, Aug. 29, 1999, p. 255.

Timothy Hwang, United States Patent and Trademark Office, Non-Final Office Action for related U.S. Appl. No. 13/155,236, dated May 17, 2013.

Yoshifusa Ito, Cidambi Srinivasan and Hiroyuki Izumi, "Discriminant Analysis by a Neural Network with Mahalanobis Distance," Computer Science, vol. 4132, 2006, pp. 350-360.

Yagang Zhang, Jinfang Zhang, Jing Ma and Zengping Wang, "Fault Detection Based on Discriminant Analysis Theory in Electric Power System," International Conference on Sustainable Power Generation and Supply, 2009, (SUPERGEN '09), Apr. 6-7, 2009.

Mahalanobis Metric, http://www.cs.princeton.edu/courses/archive/fall08/cos436/Duda/PR_mahal/M_metric.htm, May 2, 2013.

S. A. Soliman and M. Belkhayat, "Power Systems Fault Type Identification Based on Park's Transformation Algorithm," Large Engineering Systems Conference on Power Engineering, Jul. 26-28, 2006, pp. 141-145.

P. Conti and A. Farcomeni, "Distributional convergency of robust Mahalanobis distances obtained from the Forward Search," Book of Abstracts, 2009.

"Multivariate normal distribution," Wikipedia, The Free Encyclopedia, "http://en.wikipedia.org/wiki/Multivariate_normal_distribution," Sep. 24, 2010.

"Mahalonobis distance," Wikipedia, The Free Encyclopedia, "http://en.wikipedia.org/wiki/Mahalanobis_distance," Sep. 24, 2010.

(56) References Cited

OTHER PUBLICATIONS

Amendment "B" in Response to Office Action dated May 17, 2013 for related U.S. Appl. No. 13/155,236, filed Oct. 24, 2013.
U.S. Appl. No. 13/750,469.
U.S. Appl. No. 13/745,269.
U.S. Appl. No. 14/099,659.
Timothy Hwang, United States Patent and Trademark Office, Non-Final Office Action for related U.S. Appl. No. 13/155,274, dated Dec. 5, 2013.
Quadrelec Engineering Corp., Fuse Time/Current Curve; accessed Dec. 12, 2013; http://www.quadrelec.com/images/sample%20workbook%20pages.pdf.
Naodovic, "Influence of Instrument Transformers on Power System Protection," May 2005, pp. 66-71.
Amendment "B" in Response to Office Action dated Dec. 5, 2013 for related U.S. Appl. No. 13/155,274, filed Jun. 5, 2014.
Timothy Hwang, United States Patent and Trademark Office, Non Final Office Action for related U.S. Appl. No. 13/155,236, dated Sep. 24, 2014.
Amendment "D" in Response to Office Action dated Sep. 24, 2014, U.S. Appl. No. 13/155,236, filed Mar. 24, 2015.
Timothy Hwang, United States Patent and Trademark Office, Non Final Office Action for related U.S. Appl. No. 13/155,274, dated Aug. 28, 2014.
Amendment "C" in Response to Final Office Action dated Aug. 28, 2014 for related U.S. Appl. No. 13/155,274, filed Mar. 2, 2015.
Timothy Hwang, United States Patent and Trademark Office, Final Office Action for related U.S. Appl. No. 13/155,236, dated Jan. 23, 2014.
Amendment "C" in Response to Final Office Action dated Jan. 23, 2014, U.S. Appl. No. 13/155,236, filed Jun. 23, 2014.
Timothy Hwang, United States Patent and Trademark Office, Final Office Action for related U.S. Appl. No. 13/155,274, dated Mar. 23, 2015.
Nejjari, et al., "Monitoring and Diagnosis of Induction Motors Electrical Faults Using a Current Park's Vector Pattern Learning Approach", IEEE Transactions on Industry Applications, vol. 36, Issue 3, May 2000, pp. 730-735.
USPTO Office Action dated Oct. 27, 2015 in related U.S. Appl. No. 13/155,236.
Nejjari, et al., "Monitoring and Diagnosis of Induction Motors Electrical Faults Using a Current Park's Vector Pattern Learning Approach", IEEE Transactions on Industry Applications, vol. 36, Issue 3, May 2000, pp. 730-735. (Abstract submitted herewith. Document available in U.S. Appl. No. 13/155,236.).
Kulkarni, S.; Duehee Lee; Allen, A.J.; Santoso, S.; Short, T.A.; "Waveform characterization of animal contact, tree contact, and lightning induced faults;" 2010 IEEE Power and Energy Society General, pp. 1-7, 2010.
Estima et al. Recent Advances in Fault Diagnosis by Park's Vector Approach, IEEE, 2013, pp. 279-288.

\* cited by examiner

SYSTEMS AND METHODS FOR POWER LINE EVENT ZONE IDENTIFICATION

CROSS REFERENCE TO RELATED APPLICATION(S)

This application claims the benefit of and priority to U.S. Provisional Patent Application Ser. No. 61/351,981, filed on Jun. 7, 2010 and entitled "System for Zone Identification in a Power Substation Environment;" to U.S. Provisional Patent Application Ser. No. 61/392,065, filed on Oct. 12, 2010 and entitled "Systems and Methods for Characterizing Fault-Clearing Devices;" and to U.S. Provisional Patent Application Ser. No. 61/437,309, filed on Jan. 28, 2011 and entitled "Systems and Methods for Classifying Power Line Events." The complete disclosures of the above-identified patent applications are hereby incorporated by reference for all purposes.

FIELD OF THE DISCLOSURE

The present disclosure relates to power systems, and more particularly to power transmission or distribution system power line event analysis.

BACKGROUND

In electrical power transmission and distribution system operations, any number of power line events and/or disturbances are inevitable and may require an operator's immediate attention. These events may include, for example, various types of faults, abnormal switching transients, and asset failures on primary lines or on single-phase or three-phase laterals. The operator's reaction to an event may be driven by identification of the zone in which the event occurred, the nature or classification of the event, the impact area and/or the characteristics of devices that have operated in response to an event, such as to clear a fault or mitigate a disturbance. When automated and integrated into real-time operations, the reliable extraction of event information from digital data may provide decision support information, which an operator, or the computers and systems in fully-automated control and protection systems, may use to assess the significance of events, make intelligent decisions, and react proactively and reliably.

Examples of fault detection systems and methods are disclosed in U.S. Pat. Nos. 6,996,483; 7,672,812 and 7,725,295. The complete disclosures of these and all other publications referenced herein are incorporated by reference in their entirety for all purposes.

SUMMARY

In some examples, methods for power line event zone identification may include receiving measured data corresponding to a signal measured on a power line, determining from the measured data that a power line event has occurred, and identifying a probable one of the monitoring zones in which the power line event occurred. The at least two monitoring zones may be defined for an Intelligent Electronic Device (IED).

In some examples, systems for power line event zone identification may include an IED and a processor configured to execute instructions to perform a method. The IED may be connected to a power line and may be configured to measure a signal on the power line. At least two monitoring zones may be defined for the IED. The instructions may include instructions to determine from the measured signal that a power line event has occurred in at least one phase and instructions to identify a probable one of the monitoring zones in which the power line event occurred.

In some examples, computer readable storage media may have embodied thereon a plurality of machine-readable instructions configured to be executed by a computer processor to identify in which of a plurality of monitoring zone defined for an IED a power line event occurred. The plurality of machine-readable instructions may include instructions to receive measured data corresponding to a signal measured on a power line, instructions to determine from the measured data that the power line event has occurred, and instructions to identify a probable one of the monitoring zones in which the power line event occurred.

DETAILED DESCRIPTION

Figure 1:
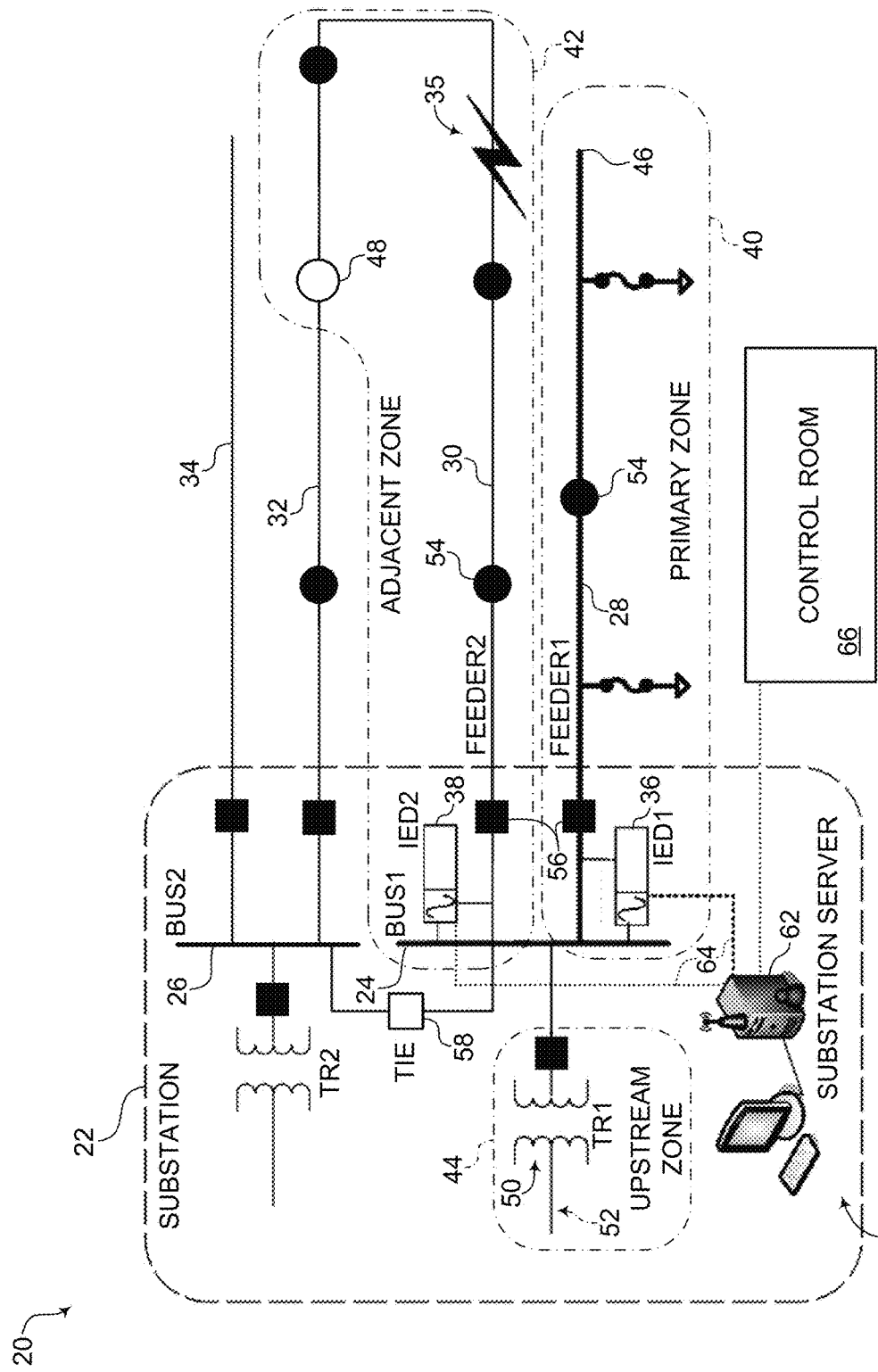
FIG. 1 is a simplified schematic of an electrical power distribution system that includes automation and control systems that may be suitable for use with the systems and methods disclosed herein.

The disclosed systems and methods may provide or support automated analysis of power line disturbance and/or event data, which may have been recorded by an Intelligent Electronic Device, or IED, in a substation or field environment. As used herein, an "IED" or "intelligent electronic device" may refer to or include any intelligent electronic device, such as, for example, any one or combination of a central processing unit (CPU), a CPU-based relay and/or protective relay, a communication processor, a digital fault recorder, a generic data collector, a phasor measurement unit (PMU), a phasor measurement and control unit (PMCU), a phasor data concentrator (PDC), a power quality meter (PQM), a protection IED, a switch controller, a relay with phasor measurement capabilities, a Supervisory Control and Data Acquisition (SCADA) system, or any other device or system capable of monitoring, and/or numerically processing sampled values in, an electrical power system.

The disclosed systems and methods may be applied to various electrical power systems, including mesh-, open-loop-, radial- and/or otherwise-configured power systems. The various electrical power systems may include electrical power transmission and/or distribution systems. As used herein, power lines may refer to, for example, distribution feeders and/or transmission lines, with power line events including, for example, various distribution feeder events and/or transmission line events.

By way of a nonexclusive illustrative example, the disclosed systems and methods may be applied to radial or radially-operated electrical power distribution systems, which may have overhead and/or underground feeders that may be protected by one or more fault-clearing or interrupting devices, such as circuit breakers, reclosers, lateral fuses, or the like, as well as one or more protection and/or control IEDs. These IEDs may be set to capture a snapshot of a material feeder event, such as one that may require immediate operator attention. Examples of such events may include short circuit faults, incipient faults, both on main circuit lines as well as on the laterals, repetitive self-clearing faults, feeder switching events, and abnormal inrush/load pickups.

Event information, such as when made available online and in real-time, may help determine the scope, significance and/or relevance of an event as well as appropriate follow-up actions, which may be useful for outage management systems. Furthermore, real-time event information, such as when made available online, may enable a utility to proactively address power line problems, such as impending, momentary and/or incipient faults or events, and proactively initiate just-in-time maintenance to avoid costly unscheduled outages and/or asset failures. In addition, event information may be used to verify and/or validate customer complaints regarding outages or even benign events such as power line switching or other intentional field switching operations. As used herein, real-time refers to providing the intended output within a specified time frame at all times, such as within a few seconds or minutes rather than many minutes or hours.

Event information may be particularly useful when a utility operator must manage a number of cascaded or independent event reports within a tight time-window. In addition to real-time applications, the disclosed systems and methods may be useful in enterprise offline or post-mortem event analysis studies. System engineers and planning crew may use the information to sort through system-wide event reports and classify them readily in terms of the impact area and/or relevance to distribution operations.

In the era of Smart Grids, data received from various IEDs that are installed, or being installed, throughout the grid may be used to provide or support advanced and/or optimized operations and maintenance in the electric utility market. Furthermore, automated data analysis may readily transform raw data into actionable information upon which utility dispatchers and crews can act.

The disclosed systems and methods may use existing infrastructure to expand or enhance control room operational intelligence and situational awareness beyond traditional Supervisory Control and Data Acquisition (SCADA) and substation automation, such as by automatically generating and providing real-time decision support information about power line events, including those that might otherwise be undetected. Such events may include incipient faults and events, fuse-cleared faults, faults cleared by unintelligent and/or uncommunicative devices, single-phase faults, and meter insensitive events that may otherwise be unreported due to the lack of an immediate outage or which become known only after customer calls.

The event information, which may be manifested in transient current measurements, may be extracted through various signal processing and/or pattern analysis methods. A plurality of aspects associated with an event such as a disturbance or fault may be determined from the event information and output or displayed to an operator. For example, the disclosed systems and methods may be used to determine or identify the zone in which an event originated; the phases involved in an event; the characteristics of a device that operated in response to an event, such as the type, size or fault-clearing capacity of a device that operated to interrupt and/or clear a fault; whether the event is sustained, temporary or incipient; the cause of the event; and/or an event classification or type, which can be broadly categorized as fault versus non-fault. In some examples, the disclosed systems and methods may also determine a relative probability value for correctly making the aforementioned determinations and/or identifications based on model probability distributions. Although not discussed in detail herein, other features and/or modules may be provided and integrated into some examples of the disclosed systems and methods.

The availability of real-time information regarding the event zone, involved phases, interrupting device characteristics, and/or the event type or classification may improve situational awareness for an operator or otherwise. Furthermore, such information may provide an early indication of incipient problems such that the problems may be addressed before becoming significant or even catastrophic. For example, although events such as load changes or mild switching events may be relatively benign and warrant a relatively lower level of attention, other events, such as faults and asset failures, may warrant significant and/or prompt attention, which may be enabled by the availability of real-time event information.

The systems and methods disclosed herein may be illustrated with reference to the simplified, generic electrical power distribution system 20 illustrated in FIG. 1. The electrical power distribution system 20 includes a substation 22 with two buses 24, 26, and four radially-operated feeders 28, 30, 32, 34, which may be overhead, underground, or any suitable combination thereof. Although discussed with reference to the four radially-operated feeders in the electrical power distribution system 20, it should be understood that the systems and methods disclosed herein may be used with, or be a part of, any suitably configured electrical power distribution and/or transmission system and/or the power lines thereof.

One or more of the feeders in the system 20 may be protected by an IED, which may be set to capture or record feeder events, such as a fault 35, occurring in a defined monitoring zone for the IED. In some examples, the IEDs may be housed inside the substation control/switch room or securely mounted in a control cabinet outside the substation, such as along the power lines or feeders and/or at customer locations. Although each feeder may be protected by an IED, only the IEDs 36, 38 protecting the feeders 28 and 30 are shown in FIG. 1.

The monitoring zones may be defined and identified with reference to a particular IED. For example, FIG. 1 illustrates three monitoring zones defined with respect to the IED 36, which is identified as "IED1." The monitoring zones defined for the IED 36 include a primary monitoring zone (PMZ) 40, an adjacent monitoring zone (AMZ) 42, and an upstream monitoring zone (UMZ) 44. As the substation configuration changes, such as due to planned maintenance or loss optimization, the monitoring zones may also change to reflect the latest substation configuration.

The PMZ for a given IED may include the primary power line and/or feeder monitored by that IED. As shown in FIG. 1, the PMZ 40 for IED 36 includes the feeder 28 (identified as "FEEDER1" in FIG. 1), which extends from the substation bus 24 to a normally open point 46.

The AMZ for a given IED may include any adjacent power lines and/or feeders connected to the same substation bus. As shown in FIG. 1, the AMZ 42 for IED 36 includes the feeder 30 (identified as "FEEDER2" in FIG. 1), which extends from the substation bus 24 to a normally open switch 48.

The UMZ for a given IED may be defined so as to monitor for events in the upstream network for that IED, which may include any transformers connected to the bus associated with the IED, as well as the upstream transmission grid. As shown in FIG. 1, the UMZ 44 for IED 36 includes the transformer 50 (identified as "TR1" in FIG. 1) connected to the bus 24 and the associated upstream transmission grid 52.

As shown in FIG. 1, the feeders may include one or more switches 54 and/or breakers 56, which may be normally closed. Furthermore, the two buses 24, 26 of the substation 22 may be connected by a normally open tie breaker 58.

As shown in FIG. 1, a substation automation system 60 may be connected to the IEDs by way of a real-time server/gateway 62 and communications links 64. As will be discussed below, some examples of the disclosed systems and methods may be executed in an embedded system such as an IED or in a substation automation platform for real-time operation. In some examples, the disclosed systems and methods can be executed in an offline mode as a computer application for post-mortem studies. When integrated into the automation platforms with built-in communication channels, a real-time notification can be sent to dispatchers, who may be located in a control room 66, and/or to other utility systems. Such real-time notification may permit proactive event management and impact assessment.

Figure 2:
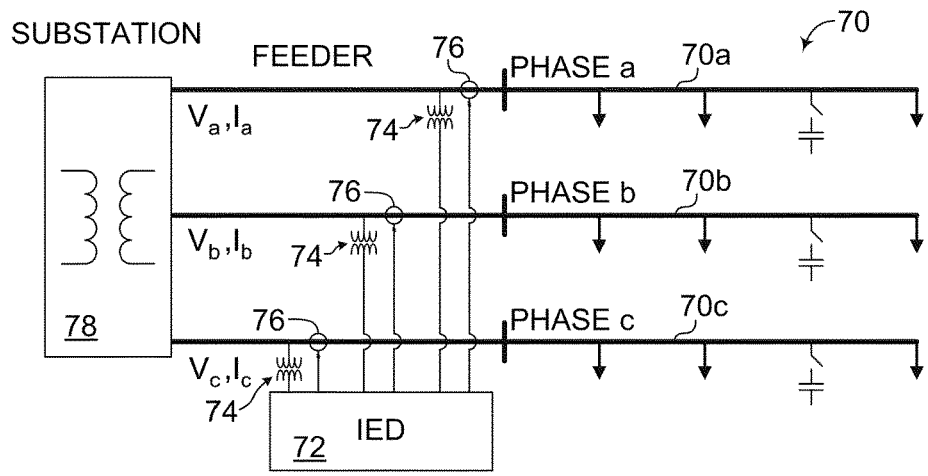
FIG. 2 is a simplified schematic view of an illustrative power line in the form of a distribution feeder, showing illustrative measurement locations.

A nonexclusive illustrative example of power line measurement locations is illustrated in FIG. 2 on a power line in the form of a simplified example of a three-phase power distribution feeder 70, having phases a, b and c, which are respectively labeled as 70a, 70b and 70c. As shown, an IED 72 is configured to receive voltage and current measurements from corresponding voltage and current transformers 74, 76 connected to each of phases 70a, 70b and 70c. As may be understood, the voltage and current transformers 74, 76 may be within, proximate, or even distant from the substation 78. As will be more fully discussed below, the input signals for the disclosed systems and methods may, for example, be the three-phase currents $I_a$, $I_b$ and $I_c$ (collectively $i_{abc}(t)$), which may reduce or even eliminate any need for voltage sensors; network, feeder or power line modeling; and/or network, feeder, power line or load modeling data. The IED 72 may measure the three-phase currents ($i_{abc}(t)$) within the substation, such as proximate the substation bus or on the feeder/power line head, and/or outside the substation at a suitable point or points along the power line, such as at or proximate one or more recloser locations.

Because the disclosed systems and methods can operate or be performed without using voltage measurements, voltage sensors and wires may be eliminated from the system. However, if voltage measurements are available in a given system, the measured voltage signals may be used for other purposes such as for breaker operations.

In some examples, the digitized current signals may initially be validated and/or processed to reduce computational complexity and/or to estimate the beginning of a transient or fault current caused by an event, which may be referred to as transient or disturbance isolation. As will be more fully set out below, the isolated event or disturbance signal may be used as the input for some examples of the disclosed systems and methods.

Figure 3:
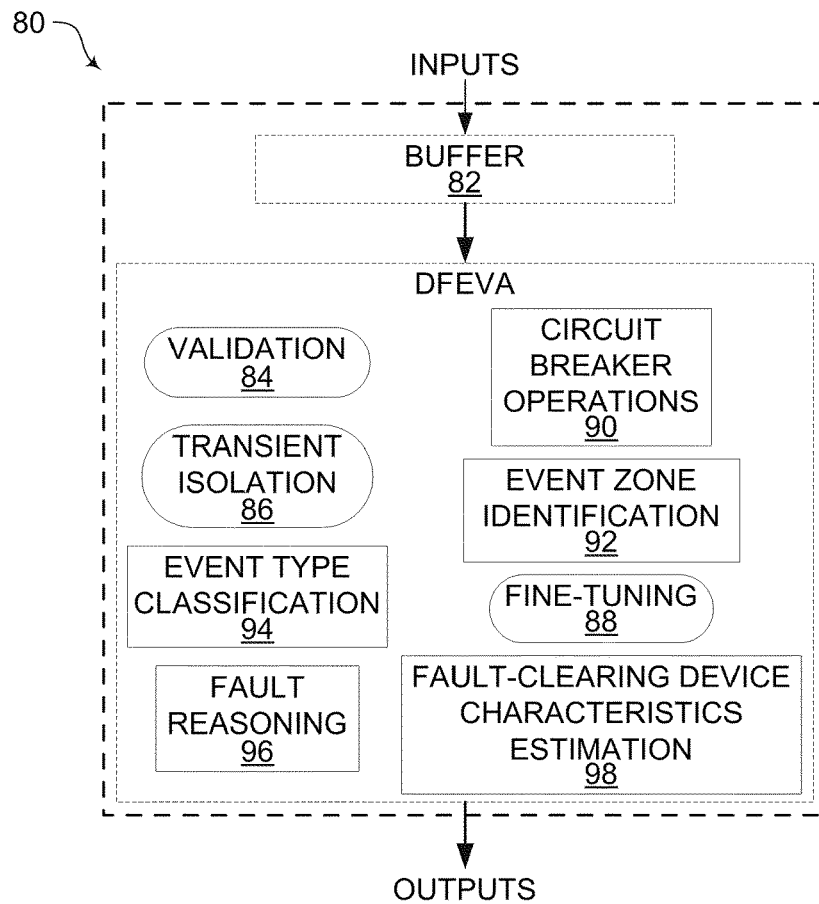
FIG. 3 is a block diagram of a nonexclusive illustrative example of a system that may embody the systems and methods disclosed herein.

A nonexclusive illustrative example of a Distribution Feeder Event Analysis System (DFEVAS) that may embody the systems and methods disclosed herein is shown generally at 80 in FIG. 3. Unless otherwise specified, the system 80 may, but is not required to, include at least one of the structure, components, functionality, and/or variations described, illustrated, and/or incorporated herein.

The inputs to the system 80 and/or to any of the components thereof may be in the form of signals, such as voltages or currents, measured in a feeder or other power line, such as proximate a substation bus, as measured by and/or received from an IED. In some examples, a buffer 82 may be provided for the current measurements, which may support subsequent event analysis. The system 80 may include, or be divided into, a plurality of analysis and decision-making modules.

In the illustrated system 80, the analysis modules include a validation module 84, a transient isolation module 86, and a fine-tuning module 88. However, some examples of the system 80 may include other or additional analysis modules, while some examples of the system 80 may omit one or more of the analysis modules shown for the system 80 illustrated in FIG. 3. The validation module may ensure that the incoming data is valid and not an outlier, while the fine-tuning module may fine-tune event beginning and end times to support accurate event duration determination. The analysis modules include computational functions that produce outputs that are internal to the system 80 but are used in the decision-making modules. Although the analysis modules do not produce a system output per se, their analysis operations support the final system outputs.

In the illustrated system 80, the decision-making modules, which are the main decision-making blocks producing the user outputs from the system 80, include a circuit breaker operations module 90, an event zone identification module 92, an event type classification module 94, a fault reasoning module 96, and a fault-clearing or event responsive device characteristics estimation module 98. However, some examples of the system 80 may include other or additional decision-making modules, while some examples of the system 80 may omit one or more of the decision-making modules shown for the system 80 illustrated in FIG. 3. The circuit breaker operations module 90 may identify and classify events that cause a breaker to operate. The functions of the other decision-making modules will be discussed in more detail below.

Depending on the particular implementation of the system 80, the various modules thereof may correspond to one or more hardware components, or the various modules may be implemented as software modules or components, which may be executed at a single site or by way of distributed computing, with various portions of the modules being performed at various locations. As will be understood, such software modules may be executed wherever sufficient processing power and appropriate data exist or are accessible. For example, the software modules may be executed or performed by a processor located in a control room and linked to the IED or, in some examples, by a processor within the IED. As used herein, a software module or component may include any type of computer instruction or computer executable code located within a memory device and/or transmitted as electronic signals over a system bus or wired or wireless network. A software module may, for instance, comprise one or more physical or logical blocks of computer instructions, which may be organized as a routine, program, object, component, data structure, etc., that performs one or more tasks or implements particular abstract data types.

In some examples, the system 80 may analyze all events captured in the PMZ, AMZ or UMZ, or at least those of the captured events that merit an operator's attention, which may be determined by one or more of the decision-making modules. For example, a detailed analysis may be performed on such events to determine the most affected phases and/or the event duration, which may rely on output from the fine-tuning module 88. Such output may include identifying within the recording the start and end indices for the event.

As will be more fully set out below, the event zone identification module 92 may use digital event data or signals from one or more IEDs to determine a probable, or even a most probable, zone in which an event occurred, such as whether the event occurred in the PMZ, AMZ or UMZ. This information may be output to a utility operator/system and/or may be utilized in other functional components of the system 80.

As will be more fully set out below, the event type classification module 94 may identify the nature or classification of an event by identifying a cluster to which a data point corresponding to the event most closely belongs based on estimates of a suitable probability density function, such as a normal probability density function.

Classification based on largest density function values may be equivalent to using a smallest suitable distance measure, such as the Mahalanobis distance, relative to one or more cluster centers. Estimates of the probability density functions may be described by cluster parameters in a form that facilitates calculating the distance measure and probability values. For example, squared Mahalanobis distances to the cluster centers may be chi-squared ($\chi^2$) distributed random variables that correspond to the sums of squares of normally distributed variables that have zero means and unit standard deviations.

The data dependent Mahalanobis distance $d_M$ between vectors x and y of the same distribution is defined using equation (1).

$$d_M(x,y,\Sigma) = \sqrt{[x-y]^T \Sigma^{-1} [x-y]} \quad (1)$$

where $\Sigma$ is the covariance/variance matrix of the distribution. The squared Mahalanobis distance $d_M^2$ is defined using equation (2):

$$d_M^2(x,y,\Sigma) = [d_M(x,y,\Sigma)]^2 = [x-y]^T \Sigma^{-1} [x-y]. \quad (2)$$

The fault reasoning module 96 may output the most probable reason for a fault, which may be at least partially based on empirical evidence gathered during a calibration period. The reasons may include certain classes of power line disruptions, faults or events that convey characteristics similar to those empirically observed in field data. For example, when the power line is an underground feeder, the reasons may include certain classes of animal/vegetation contact, moisture ingress, and cable fault cases, and when the power line is an overhead line, the reasons may include abnormal events due to public/animal/vegetation, high winds, ice on the lines, lightning, and flashovers. A positive identification of, for example, a cable/feeder fault, icing, or an animal/vegetation contact case can help derive the fault location by infrastructure in which the goal is to determine whether the fault is on an overhead or underground power line section. Knowledge of the most probable reason for a fault may improve the fault response, such as by permitting dispatch of a repair crew suitable for a particular type of fault without needing to first visually inspect the actual fault to determine its type.

As will be more fully set out below, the fault-clearing or event responsive device characteristics estimation module 98 may use digital event data from IEDs to estimate characteristics of the device that operated in response to an event, such as to interrupt or clear a fault. For example, when used in conjunction with a radial, or radially operated, distribution feeder, such as those shown in FIGS. 1 and 2, the fault-clearing device characteristics estimation module 98 may estimate type and size information based on a PMZ fault or event record. In some examples, the estimations may additionally be based on the Time-Current Characteristics (TCC) curves for various fault-clearing devices. As used herein, an interrupting, operating, or fault-clearing, device could be a fuse, switch, circuit breaker, recloser or any other device capable of responding to an event, such as by clearing or interrupting a fault on a feeder, power line or elsewhere.

In examples where the fault-clearing or event responsive device characteristics estimation module 98 provides real-time estimation of fault-clearing or event responsive device characteristics, real-time information of characteristics, such as the type and size of the fault-clearing device, may provide an immediate indication of the magnitude and/or scope of any outage associated with a fault. For example, if the module estimates that a fault was cleared by a 200 A fuse, the system operator can immediately infer that the impact area involves more than a few customers and tag the outage as a high priority one. Being able to rapidly prioritize events based on estimated fault-clearing device characteristics would be useful when, for example, an operator has to handle a number of cascaded or independent outages within a tight time window. In particular, an operator may use the device size information to assess the impact of multiple concurrent outages and objectively prioritize them for restoration purposes. Furthermore, characteristics information for the fault-clearing device, such as type and size, may assist with fault location because the estimated characteristics for the fault-clearing device may narrow the number of possible candidates for the fault-clearing device. The fault-clearing device type and size estimation may also be useful in offline and/or post-mortem analysis and protection coordination studies where protection engineers and planning crews may use the information to verify coordination of the protection system and determine whether it is operating as designed or expected.

Figure 4:
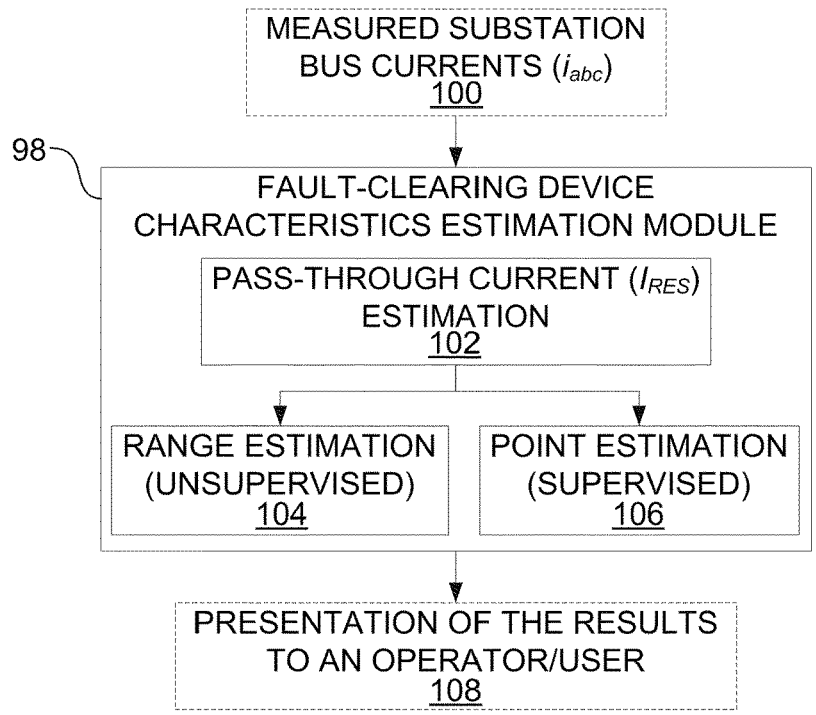
FIG. 4 is a block diagram of a nonexclusive illustrative example of a fault-clearing or event responsive device characteristics estimation module along with associated inputs and outputs.

A nonexclusive illustrative example of a fault-clearing or event responsive device characteristics estimation module 98, which may embody the systems and methods for characterizing fault-clearing devices, is shown in FIG. 4 along with nonexclusive illustrative examples of inputs to, and outputs from, the module. The fault-clearing device characteristics estimation module 98 receives input 100 in the form of a signal, such as for example, three-phase substation bus currents ($i_{abc}$), measured proximate a substation bus. In some examples, the input signal may optionally include a voltage measured at or proximate the substation bus. The signal may be measured by an IED connected to a power line, such as a feeder, and configured to measure, for example, current along the power line proximate the substation bus. In some examples, the three-phase substation bus currents ($i_{abc}$) may be measured outside the substation, such as at any suitable location along the power line or feeder.

The module 98 includes a pass-through current estimator or estimation module 102 and one or more device characteristic estimators or estimation modules. As will be more fully set out below, the pass-through current estimation module 102 processes the measured three-phase substation bus currents to estimate the fault duration and the fault current passed through the device that operated to clear the fault. The characteristic estimators, which may be independent from one another, determine various characteristics of the fault-clearing device based on the estimated fault current passed through the fault-clearing device. Nonexclusive illustrative examples of such device characteristics include the device size, rating, type, age, estimated remaining lifespan, as well as any other device characteristic that could be estimated and/or determined based at least partially on the estimated fault current passed through the fault-clearing device.

As shown in FIG. 4, the characteristic estimators may include a range estimator or estimation module 104 and a point estimator or estimation module 106, which may be independent of the range estimator. As will be apparent from the description that follows, the range and point estimators, which may rely on the estimated fault current passed through the fault-clearing device, may operate without using network, power line or feeder modeling and/or without using power line, feeder or load modeling data, which data may be difficult to obtain or maintain. Accordingly, the range and point estimators may be unaffected by modeling and/or modeling data errors, such as those that may occur for faults located relatively far from measurements taken proximate the substation bus or where the modeled data fails to properly account for component aging. Furthermore, avoiding the use of network or feeder modeling and/or the use of feeder or load modeling data may simplify the estimation algorithms, which may allow for a corresponding reduction in the processing power used to perform the estimations.

The range estimator or estimation module 104, as will be discussed in more detail below, may provide an estimated range within which the particular characteristic should lie, such as between discrete minimum and maximum values. In some examples, the range estimator provides the minimum and maximum discrete device sizes for the device that operated to clear a PMZ fault. Some examples of the range estimator provide an unsupervised approach that does not require any calibration data, can operate independently of any information or fault records regarding prior events, and/or does not rely on any template operating points.

The point estimator or estimation module 106, as will be discussed in more detail below, may provide an estimated and/or most-probable value for the characteristic. Some examples of the point estimator provide a supervised approach that uses information and/or data regarding prior faults or other events and/or relies on template operating points. If prior fault or event data is not available, one or more range estimations from the range estimator may be used to provide one or more templates for use by the point estimator, such as for tuning the supervised approach.

Although shown with both range and point estimation modules, it should be understood that some examples of the fault-clearing device characteristics estimation module 98 may include plural range estimation modules, plural point estimation modules and/or other types of estimation modules. Furthermore, some examples of the fault-clearing device characteristics estimation module 98 may omit the range estimation module and/or the point estimation module. Likewise, some examples of the fault-clearing device characteristics estimation module 98 may include any suitable combination of supervised and unsupervised characteristic estimation modules.

As indicated at 108, the fault-clearing device characteristics estimation module 98 produces results or output, which may be presented to an operator/user and/or utilized by other aspects of the electrical power distribution automation system. The outputs may be in the form of a range estimate and/or a more specific point estimate for the characteristic of the fault-clearing device.

Figure 5:
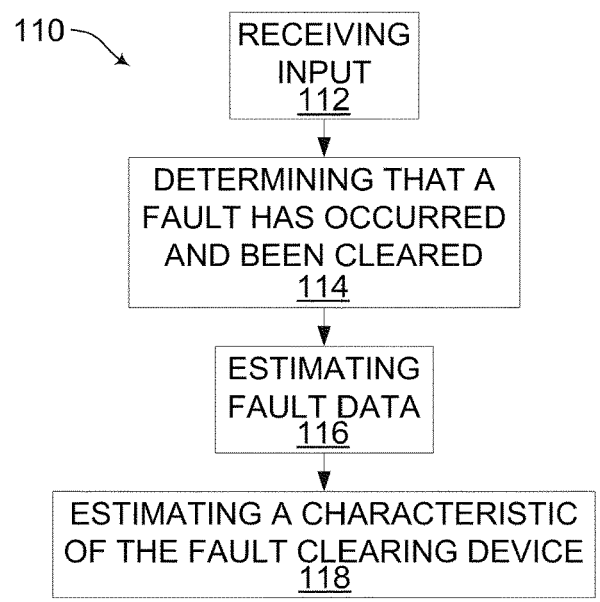
FIG. 5 is a flow chart showing a nonexclusive illustrative example of a method for characterizing fault-clearing or event responsive devices.

A nonexclusive illustrative example of a method or process for characterizing fault-clearing devices is schematically illustrated in a flow chart at 110 in FIG. 5. Although the actions of the process may be performed in the order in which they are presented below, it is within the scope of this disclosure for the following actions, either alone or in various combinations, to be performed before and/or after any of the other following actions. The process 110 includes receiving input at block 112, determining that a fault has occurred and been cleared at block 114, estimating fault data at block 116, and estimating a characteristic of the fault clearing device at block 118. The details of the process 110 are explained in further detail below with reference to the feeder shown in FIG. 2.

When receiving input data, the systems and methods disclosed herein may receive measured data corresponding to a current or currents measured along a power line, such as a feeder, such as proximate a substation bus. For example, measured three-phase substation bus currents ($i_{abc}$) may be received from the IED 72 shown in FIG. 2, which is connected to the feeder 70 and configured to measure current along the feeder 70 proximate the substation 78. The subscripts a, b and c of $i_{abc}$ correspond to the three phases 70a, 70b and 70c of the feeder 70. In some examples, the data measured for $i_{abc}$ may be digitally sampled.

The measured data, such as that corresponding to the currents along a power line, such as a feeder, proximate a substation bus, may be used to determine that the event was a fault that occurred in at least one phase of the power line and that the fault has been cleared, such as by a downstream clearing device such as a fuse or recloser. In some examples, the systems and methods disclosed herein may be initiated upon detection of an event and/or the subsequent clearance thereof, such as by the IED, using pre-existing detections methods, which are well-known and will not be discussed in detail herein. For example, the bus currents $i_{abc}$ may be monitored, with data being recorded, until occurrence of a violation lasting for at least a specified time and/or number of cycles, at which point the system 80 may implement one or more of its modules and/or execute the corresponding process or processes, such as on a captured window of data, while data recording continues. In such examples, the captured window of data may be of any suitable length, such as, for example, about 256 samples. In some examples, the system 80 may implement the modules and/or execute the processes substantially continuously on a sliding window of data (such as, for example, about 256 samples) that is being continuously recorded. Other nonexclusive illustrative examples of methods, techniques and methods that may be used, such as by an IED, to determine that an event, such as a fault, has occurred may include the detection of overcurrent bursts, voltage deviations and/or overcurrent element trips, which are explained in more detail in U.S. Pat. No. 7,725,295, titled "Cable Fault Detection," the complete disclosure of which is incorporated by reference in its entirety for all purposes.

In some examples, a pass-through current estimator may approximate or estimate a fault current passed through a fault-clearing device by subtracting a reference current from the current ($i_{abc}$) measured proximate the substation bus. In particular, reference data or a reference signal is subtracted from the data or signal measured proximate the substation bus to estimate residual fault data or a residual signal for the fault-clearing device. The residual fault data/signal may approximate the fault current passed through the fault-clearing device.

In some examples, the pass-through current estimator operates using a fault record that includes at least a few cycles of measured substation bus current $i_{abc}$ captured prior to a fault. Such pre-fault substation current data can be modeled and used as reference data. In particular, the data corresponding to the measured substation bus current $i_{abc}$ captured prior to the fault may be extended over the entire record to provide a set of reference data, which is then subtracted from the measured data corresponding to the measured substation bus current $i_{abc}$ to estimate residual fault data for the fault-clearing device. When the measured and reference data each include a plurality of samples, the reference data may be subtracted from the measured data sample by sample, as in equation (3), to provide a set of residual fault data.

$$i_{f,k}[n] = i_k[n] - s_k[n], k \in \{a,b,c\},$$

$$n \in \{\text{samples taken during the faulted condition}\} \quad (3)$$

In equation (3), $i_{f,k}[n]$ denotes the residual fault data, which approximates the fault current passed through the fault-clearing device; $i_k[n]$ denotes the measured data, which corresponds to the measured substation bus current $i_{abc}$; $s_k[n]$ denotes the reference data, which was extrapolated from the measured data captured prior to the fault and may be sinusoidal; and a, b and c denote the three phases of the power line or feeder. Using such an estimation for fault current through the fault-clearing device may improve the estimation accuracy, such as for faults on laterals closer to the feeder end and/or further from the substation bus.

Figure 6:
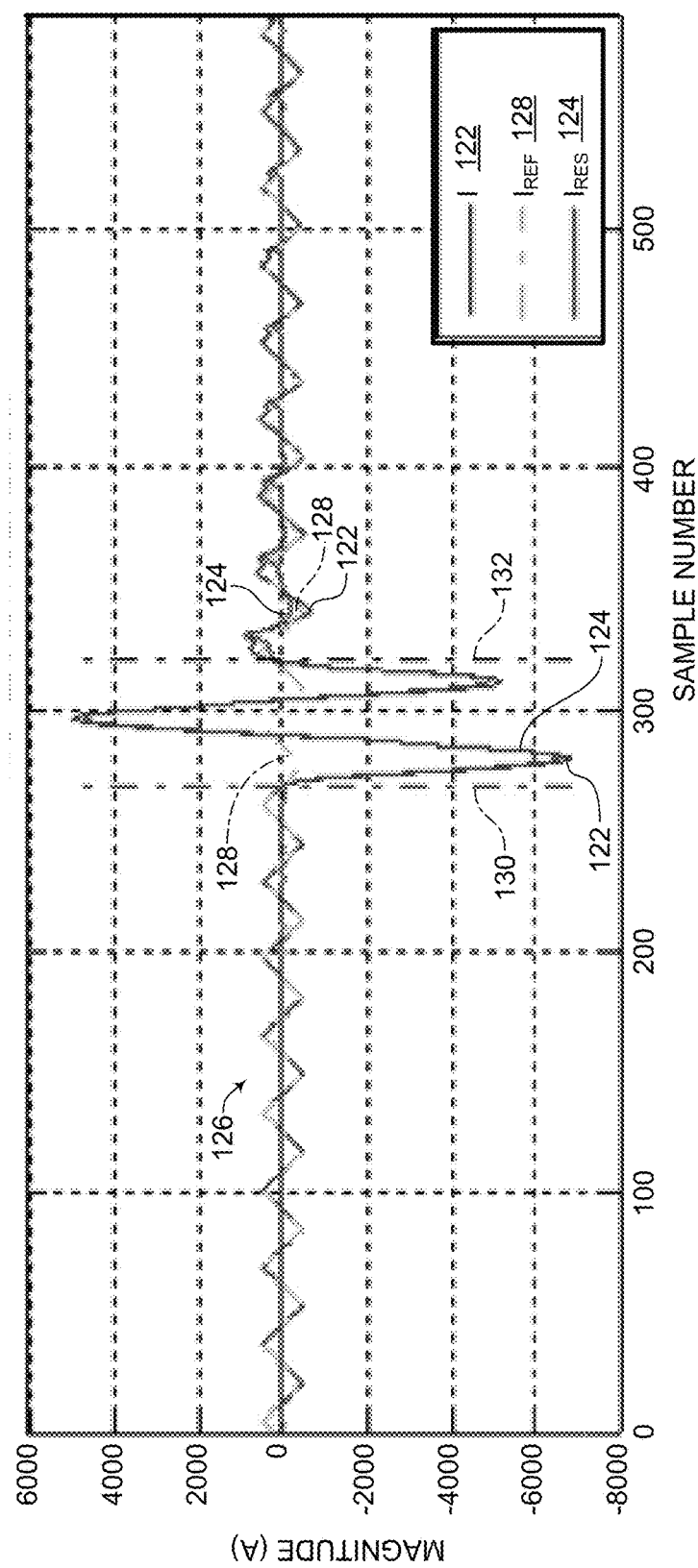
FIG. 6 is a graph showing a single-phase current (I) measured proximate a substation bus, a reference current ($I_{REF}$), and an estimated residual fault current ($I_{RES}$).

Such an estimation for the residual fault data is graphically illustrated in FIG. 6 for a single-phase fault current measured at the substation bus (I). As may be seen in FIG. 6, the residual fault current passed through the device ($I_{RES}$) 124 is estimated by extrapolating the pre-fault data 126 over a period of time corresponding to the measured fault current 122 to provide a reference current ($I_{REF}$) 128 that is subtracted from the measured current 122 to estimate the residual fault current ($I_{RES}$) 124. The estimated fault inception time 130 and fault clearance time 132 may be determined from the estimated residual fault current ($I_{RES}$) 124, such as by determining the times, or sample number, at which the residual fault current violates, or ceases to violate, certain thresholds. In some examples, the estimated fault duration is determined from the estimated fault inception and clearance times.

Figure 7:
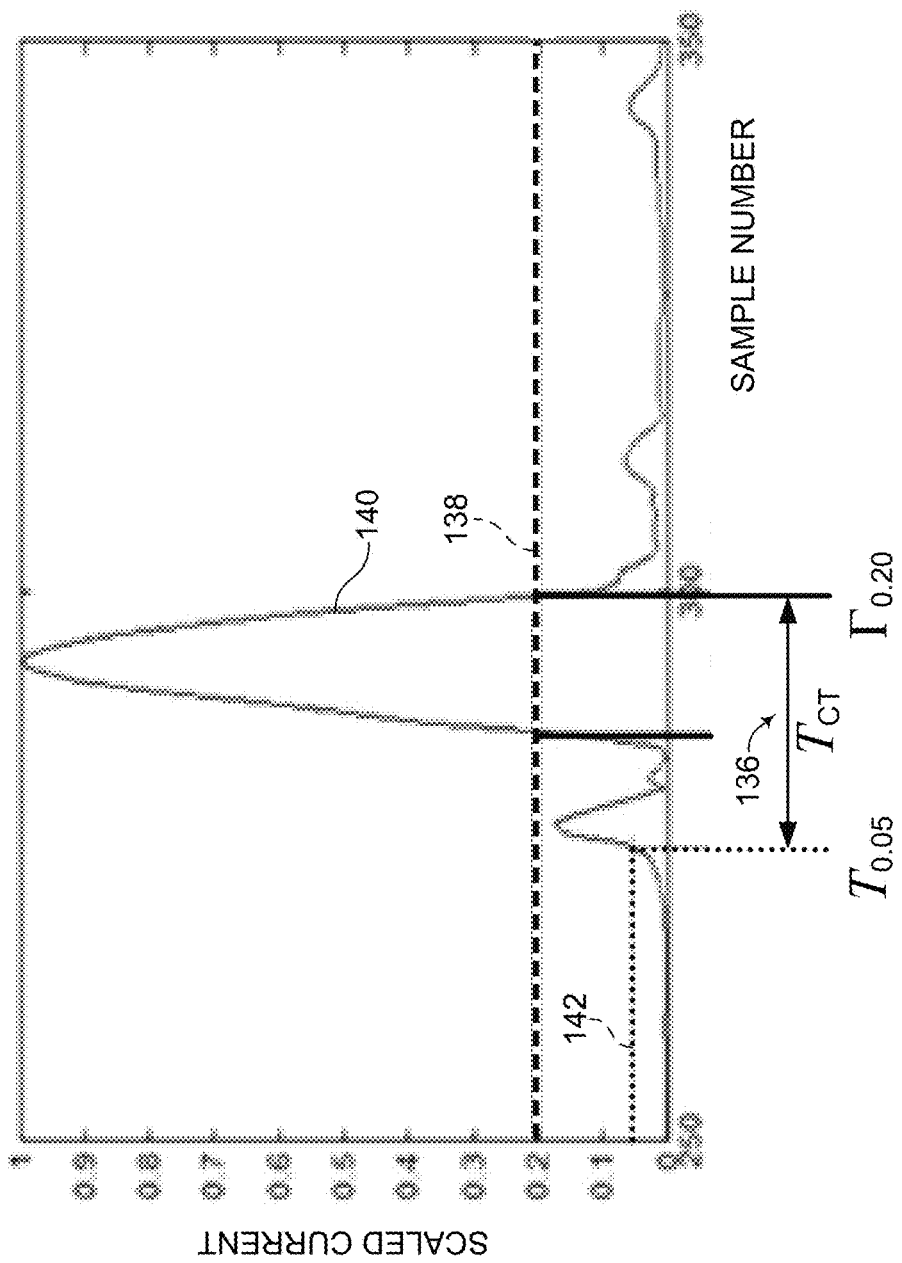
FIG. 7 is a graph of a normalized current magnitude such as may be obtained by applying Park's transformation to three-phase currents.

A clearing time $T_{CT}$ may be estimated for the fault based on the residual fault data. As used herein, the clearing time $T_{CT}$ corresponds to the time during which the fault current flows through the device prior to the device operating to clear the fault. With reference to FIG. 7, the clearing time $T_{CT}$ 136 may be estimated from the residual fault data by normalizing the magnitude of the Park's equivalent current and applying at least one fixed threshold (Th=0.2) 138 to the resulting normalized or scaled current 140. The Park's transformation allows transformation of any instantaneous value of a three-phase system, having phases a, b and c, into one complex vector using the 120° operator set out in equation (4):

$$a = \exp\left(\frac{2\pi}{3}j\right), \quad a^2 = \exp\left(\frac{4\pi}{3}j\right) \quad (4)$$

Let I=[$i_a,i_b,i_c$] be the matrix of phase currents. Each of the current vectors, $i_a,i_b,i_c$, consists of $N_s$ values. For example, $i_a=[i_1,i_2,\ldots,i_{N_s}]^T$, $i_a \in \Re^{N_s}$ where $N_s$ defines the number of samples in each record. The Park's vector for phase currents is set out in equation (5):

$$\vec{i}_p=2/3(i_a+ai_b+a^2i_c)=|\vec{i}_p|e^{j\theta}=i_pe^{j\theta} \quad (5)$$

Although a single fixed threshold may be used, such as Th=0.2, one can increase the degrees of freedom by defining a second fixed threshold 142, such as Th=0.05, as shown in FIG. 7. Thus, for example, the clearing time $T_{CT}$ may be estimated using equations (6) and (7) as:

$$T_{CT}=T_{0.20}-T_{0.05} \quad (6)$$

where $$\text{find}\left\{k \left| \frac{i_r[k]}{\max\{i_r\}} \geq Th \right.\right\} \Rightarrow T_{0.05}=\min\{k\}-2, T_{0.20}=\max\{k\}+2 \quad (7)$$

where k is an integer corresponding to the sample number, $i_r$ corresponds to the vector of amplitudes of residuals, as calculated for the Park transformed phase currents, with $i_r[k]$ corresponding to the k-th sample in the vector $i_r$. With reference to the example shown in FIG. 7, $T_{0.05}$ corresponds to the time at which the scaled current 140 first rises above the fixed threshold 142 (Th=0.05), and $T_{0.20}$ corresponds to the time at which the scaled current 140 decreases permanently below the fixed threshold 138 (Th=0.2). It should be understood that the particular combination of thresholds 138, 142 illustrated in FIG. 7 is for purposes of illustration, and any suitable threshold, or combination of thresholds, may be used in a given example or for a given purpose. As will be understood, the particular threshold, or combination of thresholds, used in a particular situation can be selected based on the particular data features the system or method is intended to identify or capture. For example, at least one relatively lower threshold, such as Th=0.05, may be used when detecting animal contacts, while a single relatively higher threshold, such as Th=0.2, may be used when characterizing a fault clearing device, such as a fuse.

In some examples, the number of most-affected phases ($N_{Ph}$) may be determined for a power line, such as a feeder, having phases a, b and c by using equation (8):

$$N_{Ph} = \text{Nearest integer}\left\{\frac{\sum_{k\in\{a,b,c\}} I_{RMS,k}}{\max_{p\in\{a,b,c\}}\{I_{RMS,p}\}}\right\} \quad (8)$$

where $I_{RMS,k}$ is the root mean square (RMS) current through a k-th one of the phases a, b and c, and $I_{RMS,p}$ is the RMS current through a p-th one of the phases a, b and c. The RMS value for the fault current passed through the fault-clearing device on the k-th one of phases a, b and c ($I_{RMS,k}$) is calculated using equation (9):

$$I_{RMS,k} = \sqrt{\frac{1}{T_{CT}}\sum_{n=1}^{T_{CT}}[i_{f,k}[n]]^2} \quad (9)$$

where n=1 corresponds to the first sample taken during the faulted condition, $T_{CT}$ corresponds to the total number of samples during the faulted condition, as determined by equation (6). In some examples, the most-affected $N_{Ph}$ phase or phases of phases a, b and c may be identified as the $N_{Ph}$ phase or phases having a larger RMS current passing therethrough than do the remaining ones of phases a, b and c.

The systems and methods disclosed herein may use the residual fault data to estimate a characteristic of the device that operated to clear the fault. For example, as discussed above, a range estimator may provide a range estimation for a characteristic and/or a point estimator may provide a point estimation, such as an estimated and/or most-probable value, for a characteristic.

In some examples, the range estimator provides an estimated size range for the device by comparing an empirical or estimated operating point for the device against the TCC curves for a plurality of device sizes. As will be seen from the description below, the range estimator may be considered to operate in an unsupervised manner because it can estimate a range of device sizes based on the estimated fault data without reference to prior fault records or history information. For example, the range estimator may determine that the operating device was a fuse, sized between 40 A and 65 A.

Figure 8:
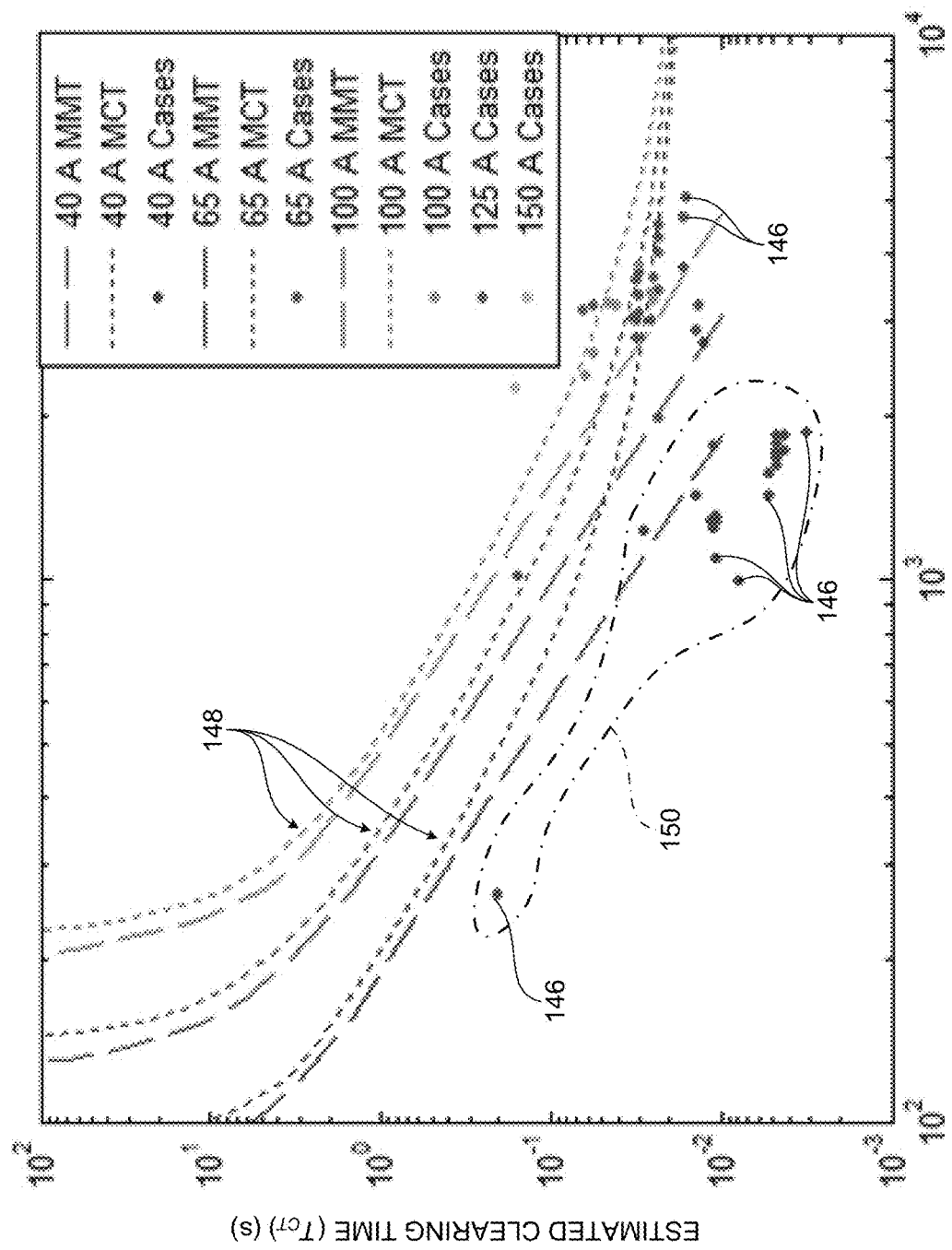
FIG. 8 is a graph showing a plurality of estimated operating points and the MMT and MCT curves of the TCC curves for a plurality of fuse sizes.

Selection of the plurality of device sizes used for comparison may depend on the particular power distribution system being considered. For example, the plurality of device sizes may be selected based on knowledge of the devices used on the particular power line(s), feeder or feeders under consideration, or the plurality of device sizes may correspond to the particular device sizes known to be used and/or stocked by the power distribution system operator. The estimated clearing time ($T_{CT}$) and the estimated RMS fault current passed through the device ($I_{RMS}$), both estimated from the current ($i_{abc}$) measured proximate the substation bus, define the operating point ($I_{RMS}, T_{CT}$). A plurality of nonexclusive illustrative examples of estimated operating points are generally illustrated in FIG. 8 at 146, along with the TCC curves 148 for several illustrative device sizes. The estimated fault energy is defined by equation (10):

$$I_{RMS}^2 T_{CT} \qquad (10)$$

In some examples, the plurality of device sizes may be selected based on the fault energy. For example, when the device is a fuse, the fault energy corresponds to the energy available to melt the fuse. Thus, for a given fault energy, the only fuses that could have operated to clear the fault are those for which the given fault energy would have been above the minimum melt energy. Accordingly, the range estimator may determine a maximum device size based on the fault energy being above the minimum melt energy for the fuses within the size range, and the range estimator may exclude from further consideration those devices that have a higher threshold operating fault energy than the fault energy estimated by $I_{RMS}^2 T_{CT}$.

The particular functioning of the range estimator is discussed below in the context of a nonexclusive illustrative example configured for use with a fuse. However, it should be understood that the range estimator, as disclosed herein, may be configured for use with fault-clearing devices other than fuses, such as breakers and reclosers.

A fuse operates to clear a fault if the fault magnitude and duration provide adequate energy to melt the fuse element, and the fuse does so with the speed specified by the fuse's TCC curve. The TCC curve for a fuse includes both a Minimum Melt Time (MMT) curve and a Maximum Clearing Time (MCT) curve, where the minimum melt time may be defined as 90% of the average melting time to account for manufacturer's tolerances, and the maximum or total clearing time may be defined as the sum of the average melting time, the arcing time, and the manufacturer's tolerances. Thus, for a fuse of a given size to have operated to clear a fault, the estimated or empirical operating point ($I_{RMS}, T_{CT}$) for the device that operated to clear the fault should lie between the MMT and MCT curves for the given fuse size, with the MMT and MCT curves being adjusted to account for the manufacturer's tolerances, loading conditions, ambient temperature, or the like. However, in some examples, there may be more than one fuse size that satisfies these conditions. For example, given the actual fuse sizes utilized on a particular power line or feeder, the estimated operating point may satisfy the conditions for more than one of the utilized fuse sizes, such as at larger fault currents, where fuse operating regions may overlap, as may be seen in FIG. 8. Accordingly, the range estimator determines a range of potential fuse sizes by evaluating the estimated operating point against the MMT and MCT curves for fuses having a minimum melt energy that could have been met by the estimated operating point.

In some examples, the range estimator may estimate a most probable fuse size based on the minimum Euclidean distance (d) between the estimated operating point OP=($x_p, y_p$) and the MMT curves (x,y) where $$d = \min(d_k((x,y), OP)) = ((x_i^k - x_p)^2 + (y_i^k - y_p)^2)^{1/2} \qquad (11)$$

and where $x_p$ corresponds to $I_{RMS}$, and $y_p$ corresponds to $T_{CT}$. In particular, the most probable device size may correspond to the device size for which the TCC curve, and more particularly the MMT curve and/or the MCT curve, is closest to the estimated operating point. By way of example, the range estimator may estimate that the cluster of operating points 146 identified in FIG. 8 at 150 corresponds to a most probable fuse size of 40 A.

In some examples, the range estimator automates the comparison of an estimated operating point ($I_{RMS}, T_{CT}$) to the TCC curves by forming closed polygons from the MMT and MCT curves for each fuse size and determining whether or not the estimated operating point is within the polygon, which determination may be automatically performed by a computer. The range estimator may then identify the range of possible fuse sizes for the device that operated to clear the fault as including those fuse sizes for which the estimated operating point was determined to be within the closed polygon formed from the MMT and MCT curves, and for which the operating energy could have met the minimum melt energy, as discussed above.

Figure 9:
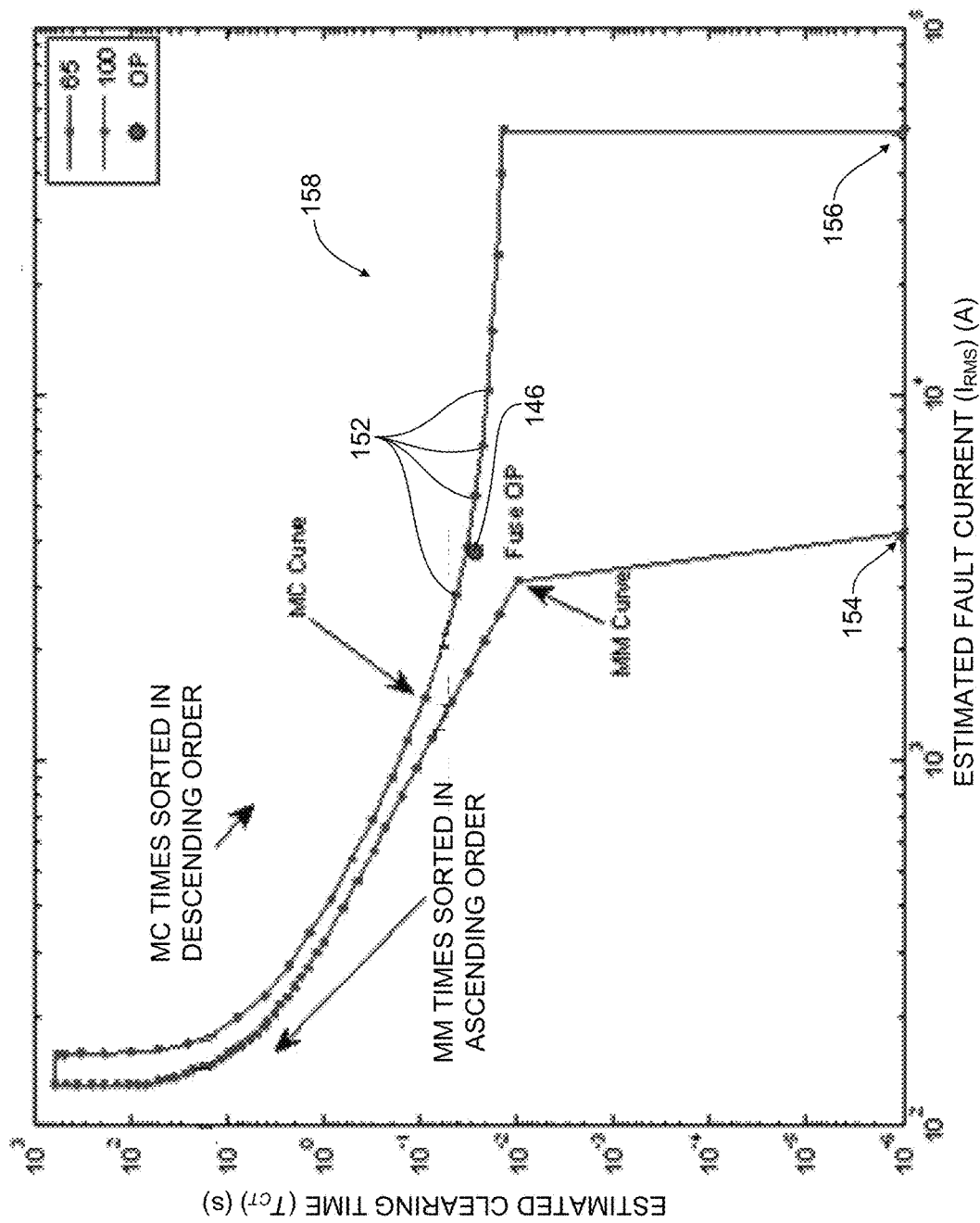
FIG. 9 illustrates a closed polygon formed from the MMT and MCT curves for a particular fuse size.

As shown in FIG. 9, the MMT and MCT curves may be expressed in a 2-D plane by a set of current-time data points 152. To address the areas not specified by the TCC curves, such as for near-zero clearing times, two new data points 154, 156 are artificially defined and added to the set of data points. As shown in FIG. 9, the data point 154 corresponds to the x-intercept of a straight line extending from the first two MMT data points having the highest current value, but with the y-value of the new data point set to a near-zero value, such as 1*E-6, so as to avoid division by zero. The data point 156 corresponds to the one of the MCT data points corresponding to the highest current, but with the y-value of the new data point set to a near-zero value, such as 1*E-6.

To form a directional closed polygon 158 for comparison purposes, the data points of the extended MMT and MCT curves are group sorted based on the second column (time) in ascending and descending order, respectively, as indicated in FIG. 9, and combined as one set of $I_s$ & $t_s$ for each device size. The polygon 158 includes N vertices ($x_i, y_i$), where i ranges from 0 to N−1. The polygon is assumed to be closed such that the last vertex ($x_N, y_N$) is the same as the first vertex ($x_0, y_0$).

Figure 10:
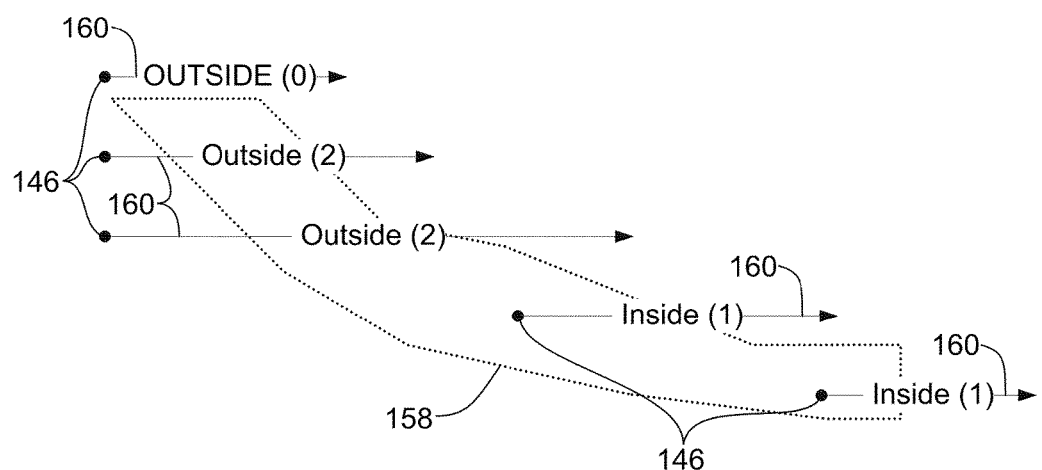
FIG. 10 schematically illustrates the determination of whether or not a given estimated operating point is within the closed polygon.

To determine whether or not an estimated operating point ($x_p, y_p$) 146 is within the polygon 158, a horizontal ray 160 emanating from ($x_p, y_p$) and extending to the right, as shown in FIG. 10, is assumed. For an estimated operating point to be inside the polygon 158, the ray 160 will intersect the line segments making up the polygon an odd number of times. If the ray 160 intersects the line segments making up the polygon 158 an even number of times, the operating point will be identified as being outside the closed polygon. The test for even or odd is based on modulus 2. If the number of intersections modulus 2 is 0 then the number is even, if it is 1 then it is odd, with 0 being considered even in this test.

The point estimator, as discussed above, may provide an estimated and/or most-probable value for the device characteristic. Although discussed with reference to fuses, it should be understood that the point estimator, as disclosed herein, may be configured for use with fault-clearing devices other than fuses, such as breakers and reclosers.

Figure 11:
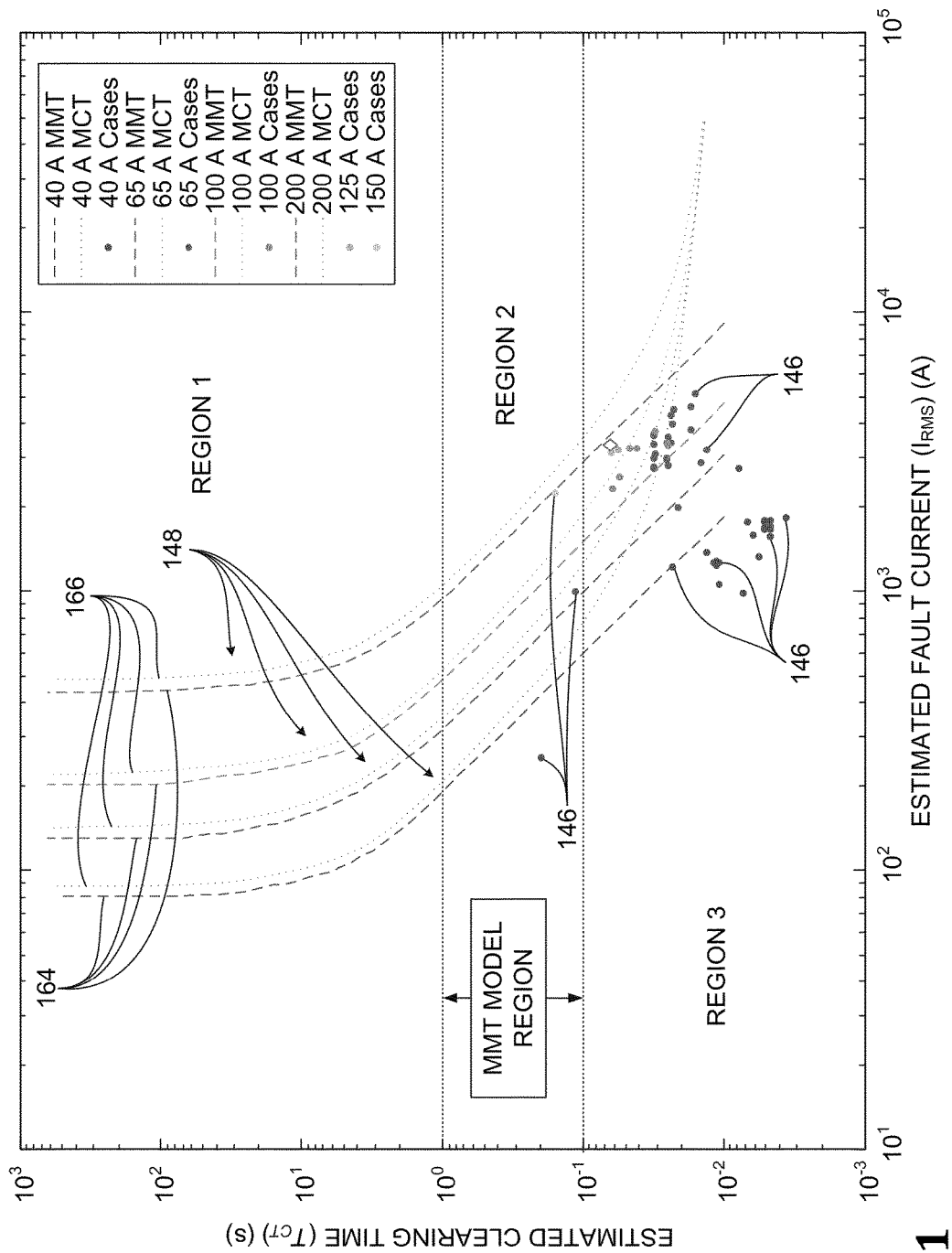
FIG. 11 is a graph showing a plurality of estimated operating points along with the TCC curves for a plurality of fuse sizes and illustrating the division of the time-current space into three regions.

With regard to point estimation for the size of the device that operated to clear a fault, examination of the TCC curves 148 plotted in FIG. 11 identifies three regions within the 2-D time-current space for a given set of TCC curves. In particular, the behavior of the set of TCC curves differs between the three regions. Region 1 corresponds to estimated clearing times longer than 1 second, which seldom occur because a primary or back-up protection device will typically operate to clear a fault within 1 second. Region 2 corresponds to estimated clearing times between 0.1 and 1 second, and Region 3 corresponds to estimated clearing times of less than 0.1 second. The methods for point estimation for operating points 146 lying within Regions 2 and 3 will be set out below.

As may be seen from FIG. 11, the TCC curves 148 for the various device sizes do not overlap in Region 2. More particularly, the MMT and MCT curves 164, 166 for a given device do not overlap the MMT and MCT curves for any of the other candidate devices. Thus, a size may be estimated for the device that operated to clear the fault by comparing the estimated operating point to a plurality of TCC curves. In particular, the estimated operating point may be compared to a provided set of MMT 164 curves corresponding to a set of candidate device sizes, which may correspond to the device sizes used in the PMZ and/or to the device sizes used and/or stocked by the power distribution system operator. The comparison may be performed by comparing an operating parameter to a set of modeled parameters, where the operating parameter is calculated from the estimated operating point of the device that operated to clear the fault, while each of the modeled parameters is calculated from one of the set of MMT curves.

Figure 12:
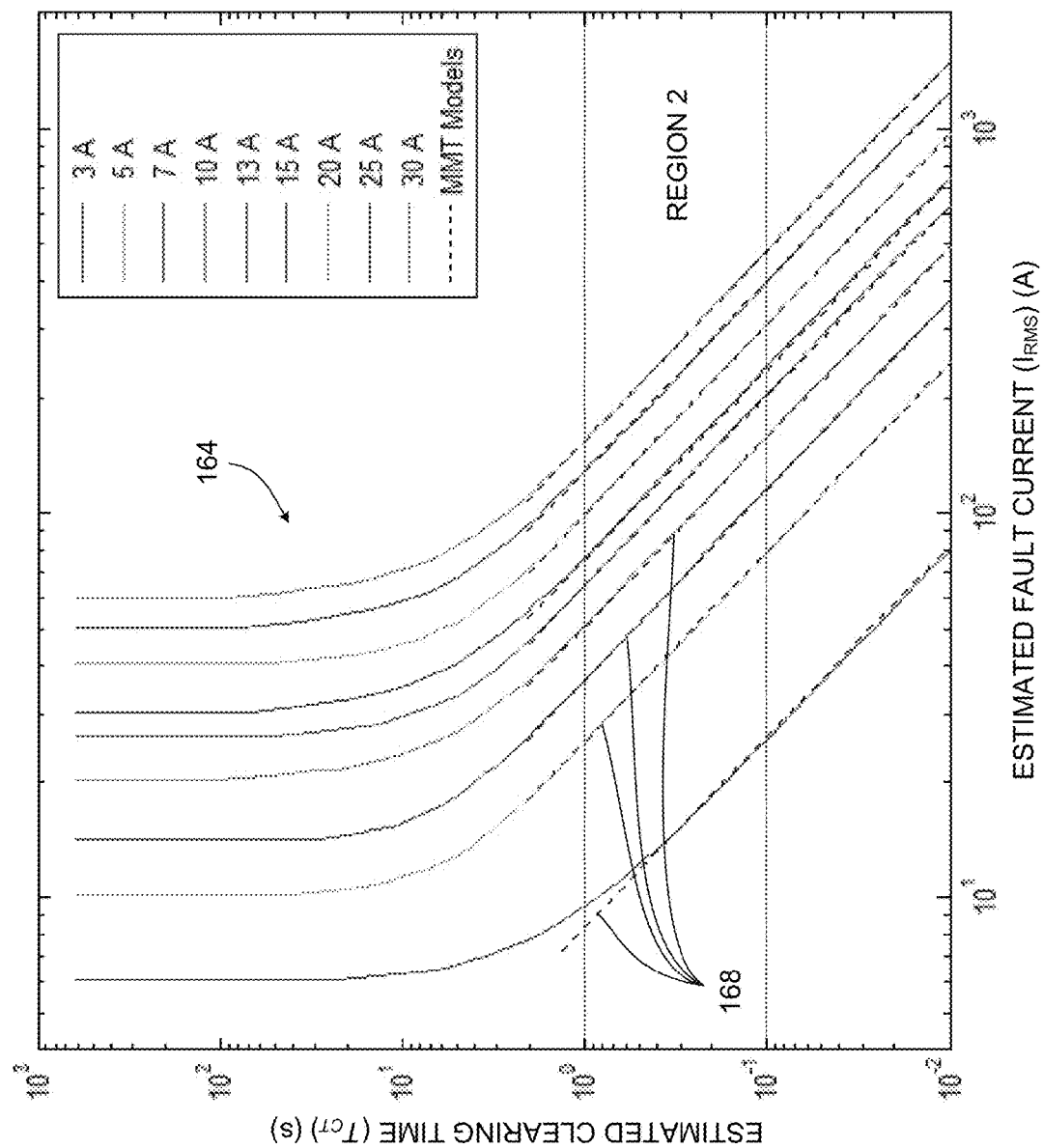
FIG. 12 is a graph showing the MMT curves for a plurality of small device sizes, ranging between 3 A and 30 A, along with the modeled curves in Region 2.
Figure 13:
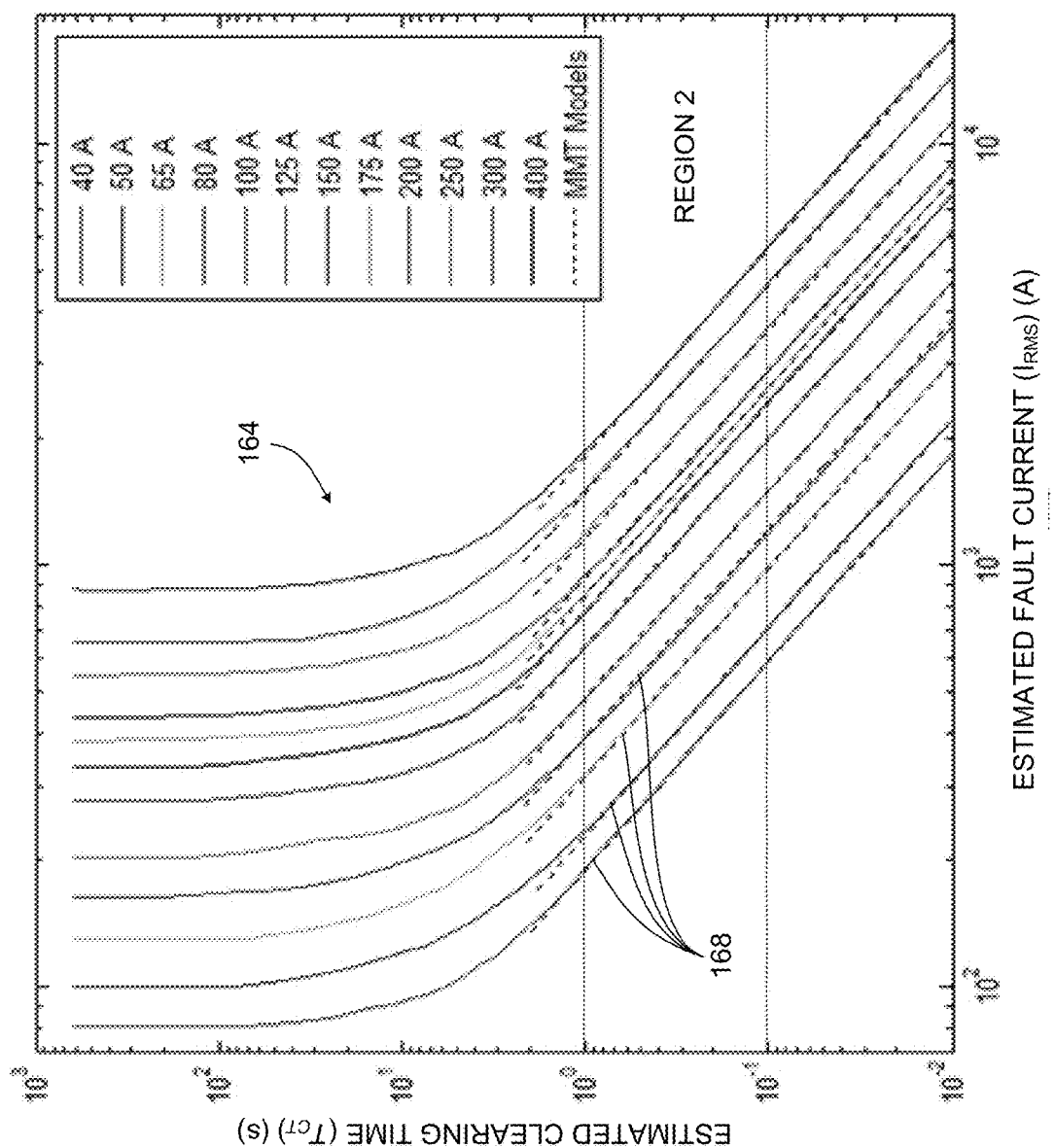
FIG. 13 is a graph showing the MMT curves for a plurality of medium and large device sizes, ranging between 40 A and 400 A, along with the modeled curves in Region 2.

As may be seen from FIGS. 11-13, the MMT curves 164 are, in general, sufficiently linear in the log-log coordinate system within Region 2 that the MMT curves may be linearly modeled. For example, the MMT curve for each candidate device size may be modeled for Region 2, in the log-log coordinate system, using a parameter $A_{Fuse}$ and a constant $a_0$, as given by equation (12):

$$T_{MMT} = 10^{-2.0243 \left[ \log_{10} \left( \frac{I_{f,RMS}}{4.75 A_{Fuse} + a_0 A_{Fuse}} \right) \right]} \quad (12)$$
$$= \left( \frac{4.75 A_{Fuse} + a_0 A_{Fuse}}{I_{f,RMS}} \right)^{2.0243}$$

where the model parameters 4.75 and 2.0243 are estimated from the TCC curve data; $A_{Fuse}$ is a nominal current value for a particular device size, such as 65 for a 65 A fuse; and $I_{f,RMS}$ is the fault current passed through the faulted phase. In some examples, such as for 40 A and larger fuses, $a_0$ may be set to zero, such that equation (12) may be simplified to equation (13):

$$T_{MMT} = 10^{-2.0243 \left[ \log_{10} \left( \frac{I_{f,RMS}}{4.75 A_{Fuse}} \right) \right]} = \left( \frac{4.75 A_{Fuse}}{I_{f,RMS}} \right)^{2.0243} \quad (13)$$

Models for the MMT curves 164 illustrated in FIGS. 12 and 13 are plotted using the dashed lines 168.

The $A_{Fuse}$ values for each of the candidate device sizes may then be grouped into a sorted vector for the set of candidate device sizes ($A_{Fuse}$). For example, where the candidate device sizes include 40 A, 65 A, 100 A, 125 A and 200 A fuses, $A_{Fuse} = [A_{Fuse40}, A_{Fuse65}, A_{Fuse100}, A_{Fuse125}, A_{Fuse200}]$, where $A_{Fuse40}$ is the $A_{Fuse}$ value for the 40 A fuse, $A_{Fuse65}$ is the $A_{Fuse}$ value for the 65 A fuse, $A_{Fuse100}$ is the $A_{Fuse}$ value for the 100 A fuse, $A_{Fuse125}$ is the $A_{Fuse}$ value for the 125 A fuse, and $A_{Fuse200}$ is the $A_{Fuse}$ value for the 200 A fuse.

The estimated $\tilde{A}_{Fuse}$ may be calculated for the device that operated to clear the fault based on the estimated fault current ($I_{f,RMS}$) passed through the fault-clearing device and the estimated clearing time ($\tilde{T}_{CT}$), both as determined above, using equation (14):

$$\tilde{A}_{Fuse} = \frac{I_{f,RMS} T_{CT}^{0.494}}{4.75 + a_0} \quad (14)$$

As noted above, $a_0$ may be set to zero in some examples, such as for 40 A and larger fuses, such that equation (14) may be simplified to equation (15):

$$\tilde{A}_{Fuse} = \frac{I_{f,RMS} T_{CT}^{0.494}}{4.75} \quad (15)$$

An estimated device size may then be determined by comparing the estimated $\tilde{A}_{Fuse}$ to the sorted vector for the set of candidate device sizes ($A_{Fuse}$). For example, if $\tilde{A}_{Fuse} < A[1]$, which is $A_{Fuse40}$ in the present example, A[1] is identified as the $A_{Fuse}$ corresponding to the estimated device size. If $\tilde{A}_{Fuse} > A[End]$, which is $A_{Fuse200}$ in the present example, A[End] is identified as the $A_{Fuse}$ corresponding to the estimated device size. Otherwise, find k such that $A[k] \le \tilde{A}_{Fuse} \le A[k+1]$ and identify A[k] as the $A_{Fuse}$ corresponding to the estimated device size, which corresponds to determining a largest one of a set of modeled parameters that is not greater than an estimated operating parameter, and identifying as an estimate for the operating device size the one of the set of candidate device sizes corresponding to the determined largest one of the set of modeled parameters.

In some examples, the device size estimation method discussed above with regard to estimated operating points lying in Region 2 may be modified for use with estimated operating points lying in Region 1. In such examples, the modeling of the MMT curves would be adjusted to account for the different behavior or shape of the MMT curves within Region 1 as compared to the behavior in Region 2.

With regard to estimated operating points lying within Region 3, examination of the TCC curves 148 plotted in FIG. 11 shows that the MMT and MCT curves overlap for the various device sizes, especially for faster clearing times and higher fault currents. Thus, comparing estimated operating points lying within Region 3 to the TCC curves for a plurality of device sizes may not uniquely identify a particular characteristic for the device that operated to clear the fault. Accordingly, the point estimator may use a probabilistic characteristic estimation to identify the most probable device size for estimated operating points lying within Region 3.

The probabilistic characteristic estimation, is based on previously recorded fault data. In particular, information and/or data regarding prior fault clearances or other events may be used to generate one or more template operating points such that the probabilistic characteristic estimation may provide a supervised approach to characteristic estimation. In some examples, such as where insufficient prior fault data is available, one or more range estimations from the range estimator may be used to provide one or more templates for the probabilistic characteristic estimation.

In general, the estimated clearing time ($T_{CT}$) is a random variable that depends on the estimated fault current passed through the fault-clearing device ($i_f$) and the size of the melted fuse ($A_{Fuse}$). Accordingly, the estimated clearing time ($T_{CT}$) may expressed as:

$$T_{CT} = P_{Fuse}(i_f, A_{Fuse}) \quad (16)$$

Identification of the device size ($A_{Fuse}$) is the inverse problem set out in equation (17).

$$A_{Fuse}=P_{Fuse}^{-1}(i_f T_{CT}) \quad (17)$$

However, use of equations (16) and (17) is hindered by the fact that the function $P_{Fuse}$ is unknown and the dimensions of the equations are high, such as 256.

In the disclosed example of probabilistic characteristic estimation, information about the fuse size is extracted from the estimated fault current ($i_{f,k}[n]$, n=1, . . . , N), by way of a Fourier transform and then projected to lower l-dimensional feature space by a projection matrix. The result is an l-dimensional feature vector $x=[x_1, x_2, \ldots, x_l]$.

Thus, equation (17) may be replaced by a plurality of density functions that are specified or calculated for a plurality expected or candidate device sizes. Each density function ($p_k$) (k=1, 2, . . . , number of candidate device sizes) estimates the density of data points in the region of the feature space into which a particular device size is mapped. The joint distribution of l random variables x is estimated by an l-dimensional Gaussian distribution as defined in equation (18):

$$p_k(x, C_k, \Sigma_k) = \frac{1}{(\sqrt{2\pi})^l \sqrt{\det \Sigma}} \exp[-1/2(x-C_k)\Sigma_k^{-1}(x-C_k)^T] \quad (18)$$

where $C_k$ is the l-dimensional centroid vector, and $\Sigma_k$ is the covariance matrix estimated for device size candidate k.

The features x used in the probabilistic characteristic estimation are calculated in the following way. At first a vector $s=[s[1], s[2], s[3], \ldots, s[N/2+1]]$ of amplitudes of the squared values of estimated fault currents in the frequency domain are calculated using a Fourier transform as $$s[k+1] = \left|\sum_{n=0}^{N-1} w_H[n](i_{f,k}[n])^2 \exp[(-j(2\pi/N)kn)]\right|/\rho, \quad (19)$$

$$k = 0, 1, 2, \ldots, N/2$$

where $w_H[n]$ are coefficients of the Hanning window and $\rho$ is the normalizing factor $$\rho = \sum_{n=0}^{N-1} w_H[n]/2 \quad (20)$$

The amplitudes in the vector are projected onto lower dimensional space by equation (21):

$$x = P^l s (l < N/2), \quad (21)$$

where $P^l$ is the projection matrix and the vector x consists of l principal components.

Figure 14:
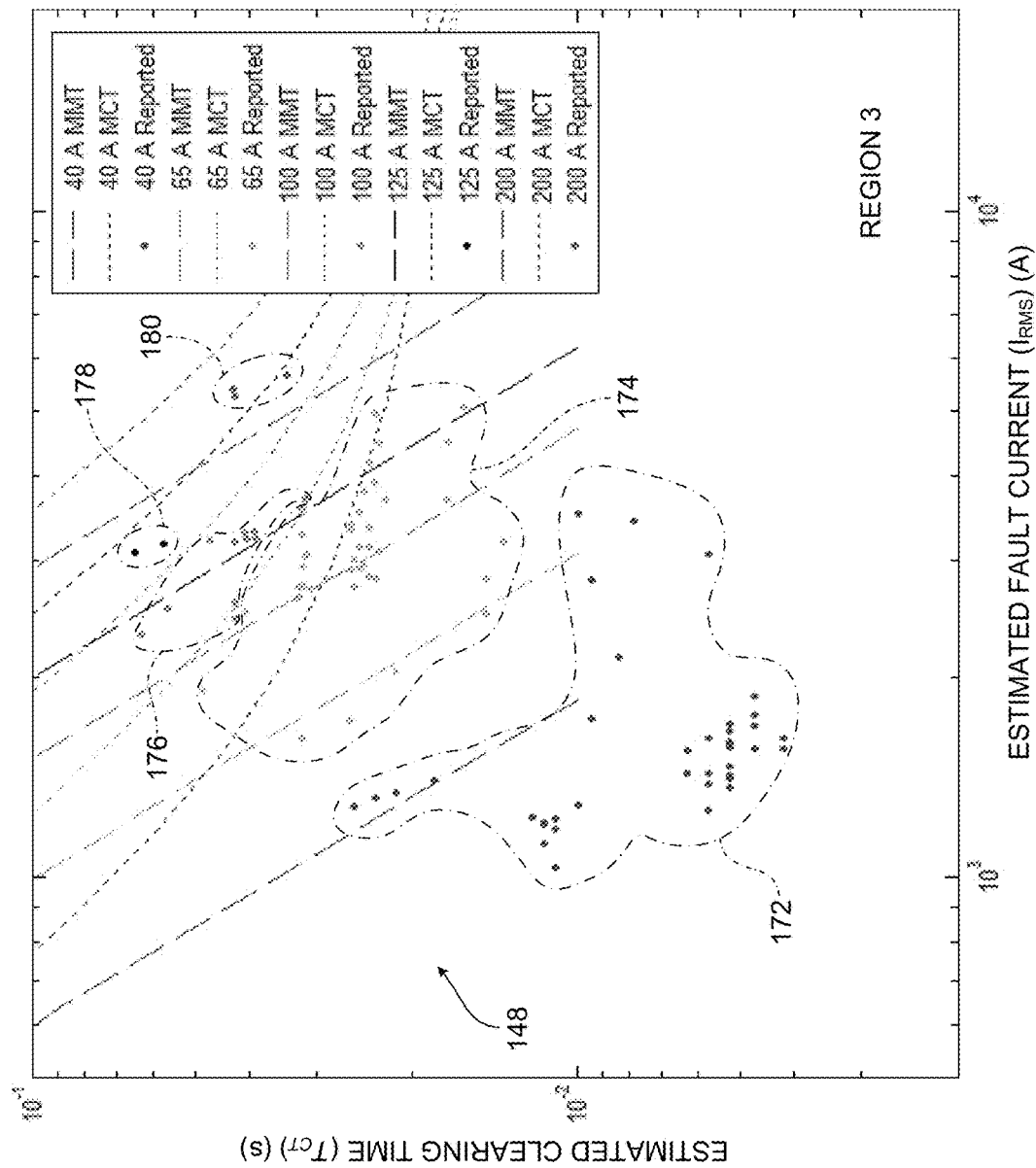
FIG. 14 is a graph showing the MMT and MCT curves for a series of five fuse sizes along with a plurality of reported operating points for the series of fuse sizes.

By way of example, FIG. 14 shows the TCC curves 148 for five fuse sizes (40 A, 65 A, 100 A, 125 A and 200 A), along with a plurality of reported operating points for each fuse size (172 for 40 A, 174 for 65 A, 176 for 100 A, 178 for 125 A and 180 for 200 A). The plurality of reported operating points for each fuse size are plotted in the principal component space in FIG. 15, along with the estimated contours of the two-dimensional Gaussian density functions for the five fuse sizes (182 for 40 A, 184 for 65 A, 186 for 100 A, 188 for 125 A and 190 for 200 A). Although the illustrated example uses two-dimensional Gaussian density functions, it should be understood that the methods disclosed herein could also or alternatively be performed based on one-dimensional, or even three-dimensional or higher, Gaussian density functions.

Figure 15:
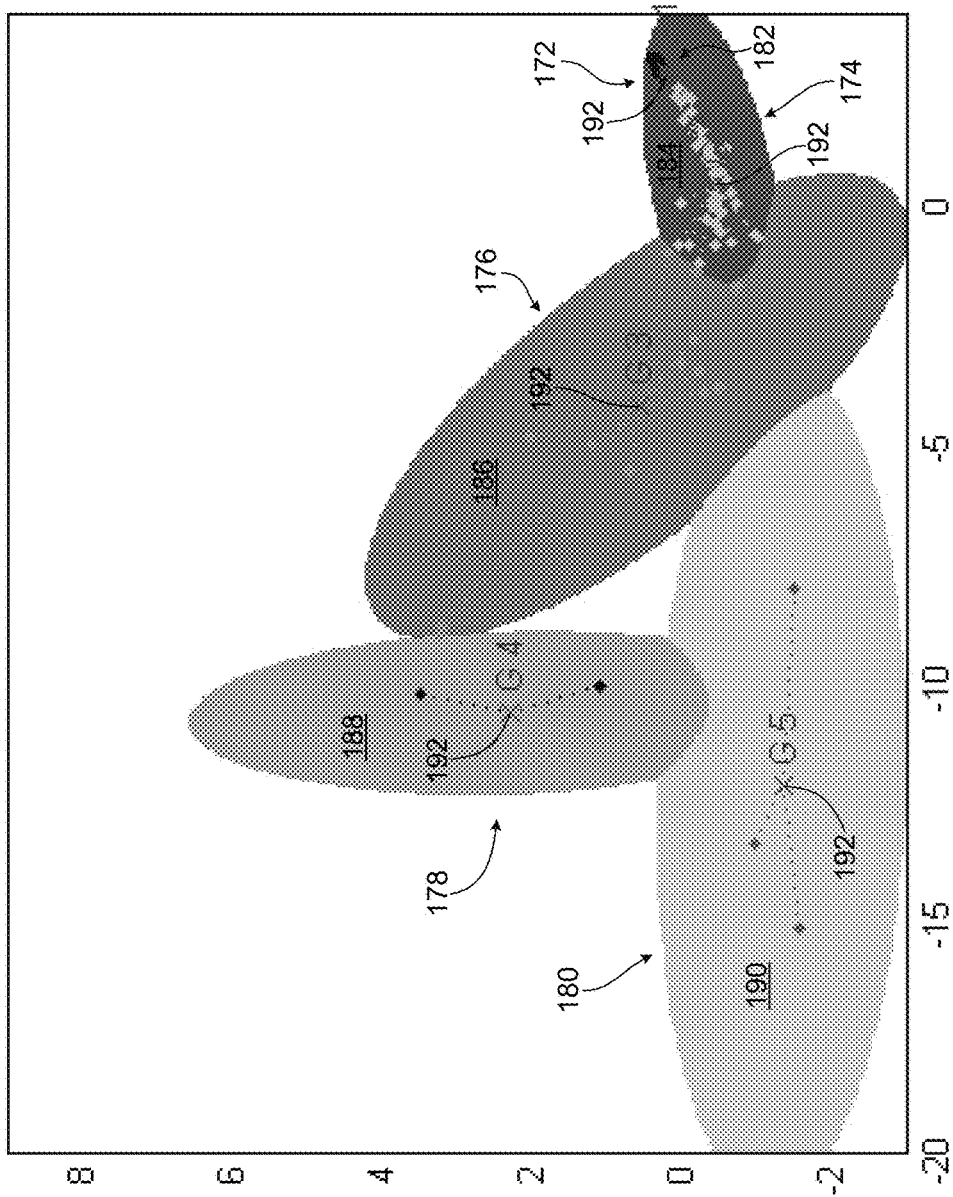
FIG. 15 is a component space plot of the five reported groups of operating points shown in FIG. 14 along with the corresponding density function contours.

The cluster centers 192 shown in FIG. 15 serve as templates in the probabilistic characteristic estimation, with characteristics being estimated for new operating point cases based on these templates and a proximity measure based on the squared Mahalanobis distance. The data-dependent squared Mahalanobis distance is calculated using equation (22):

$$d_M^2(x, C_k, \Sigma_k) = [x-C_k]^T \Sigma_k^{-1} [x-C_k] \quad (22)$$

where x is the feature vector, and $C_k$ is the centroid vector, and $\Sigma_k$ is the covariance matrix estimated for the device size candidate k. The most probable characteristic, which is the most probable one of the plurality of device sizes in this example, is identified by calculating for the estimated operating point a Mahalanobis distance for each of the cluster centers $C_k$, with the most probable device size being the one of the plurality of device sizes corresponding to the smallest Mahalanobis distance.

As is apparent from the above discussion, the probabilistic characteristic estimation may be performed without reference to the TCC curves, which may reduce estimation errors that may otherwise occur due to the inherent variability in device operating times due to normal wear and tear and aging, which may not be accounted for in TCC curves. Thus, although probabilistic characteristic identification may be most useful for device operating points lying in Region 3, due to the overlapping TCC curves therein, probabilistic characteristic estimation may also be used for operating points in Regions 1 and 2 to reduce reliance on the TCC curves and any associated estimation errors.

In some examples, the disclosed systems and methods may be supplemented and/or the output thereof interpreted in view of knowledge of the devices likely or actually used on a particular power line(s), feeder or feeders under consideration, or the plurality of candidate device sizes may correspond to the particular device sizes known to be used and/or stocked by the power distribution system operator. In particular, a given feeder or monitoring zone may be known to include, for example, only 20 A, 40 A and 60 A fuses. Accordingly, with regard to such a feeder or monitoring zone, an estimated size range of 30 A-50 A from the range estimator, or a point estimate from the point estimator of, for example, 35 A, may be interpreted as determining that the device that operated to clear the fault was actually a 40 A fuse.

Figure 16:
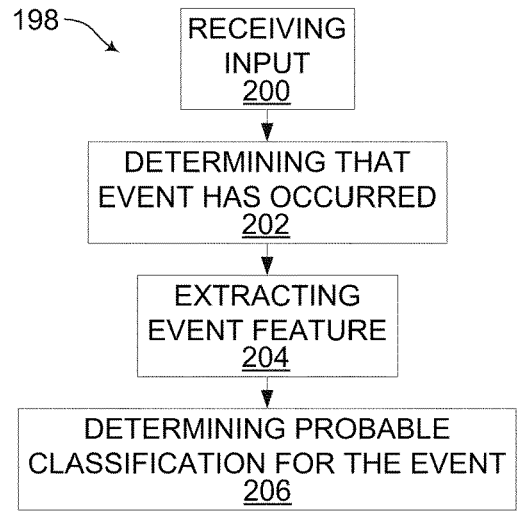
FIG. 16 is a flow chart showing a nonexclusive illustrative example of a method for classifying a power line event.

A nonexclusive illustrative example of a process or method for classifying power line events, such as by way of the event type classification module 94, is schematically illustrated in a flow chart at 198 in FIG. 16. Although the actions of the method may be performed in the order in which they are presented below, it is within the scope of this disclosure for the following actions, either alone or in various combinations, to be performed before and/or after any of the other following actions. The illustrated method 198 includes receiving input in the form of measured data or a measured signal, as indicated at block 200, determining that a power line event has occurred in at least one phase based on the measured data or signal, as indicated at 202, extracting at least one event feature from the measured data or signal, as indicated at 204, and determining at least one probable classification for the power line event based at least partially on the extracted feature, as indicated at 206.

Although various aspects of the method 198 are explained in further detail below with reference to the distribution feeder shown in FIG. 2, it should be understood that the method 198 and its various aspects may be used for classifying other power line events such as transmission line events.

When receiving input data, the systems and methods disclosed herein may receive measured data corresponding to a signal measured by an IED protecting a power line, such as proximate a substation bus. The measured signals may include current or currents measured along a power line, such as proximate a substation bus, and/or voltages measured proximate the substation bus. For example, measured three-phase substation bus currents ($i_{abc}$) may be received from the IED 72 shown in FIG. 2, which is connected to the feeder 70 and configured to measure current along the feeder 70 proximate the substation 78. The subscripts a, b and c of $i_{abc}$ correspond to the three phases 70a, 70b and 70c of the feeder 70. In some examples, the data measured for $i_{abc}$ may be digitally sampled.

Figure 17:
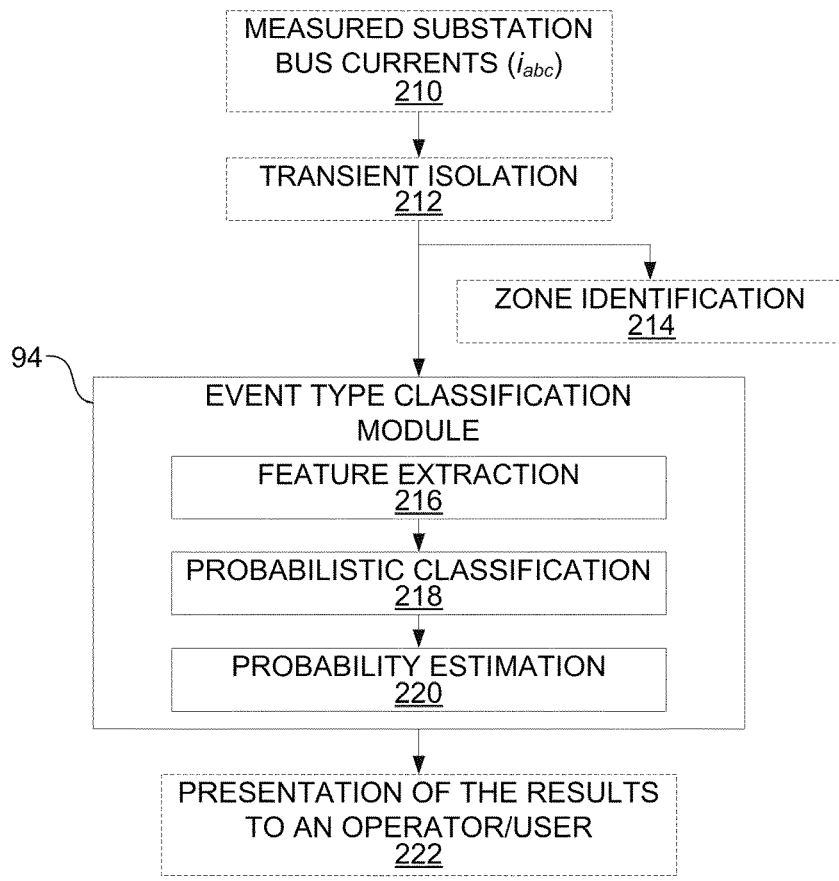
FIG. 17 is a block diagram of a nonexclusive illustrative example of an event type classification module along with associated inputs and outputs.

A nonexclusive illustrative example of an event type classification module 94, which may embody the systems and methods for classifying power line events, is shown in FIG. 17 along with nonexclusive illustrative examples of inputs to, and outputs from, the module. The event type classification module 94 receives input 210 in the form of a signal, such as for example, three-phase substation bus currents ($i_{abc}$), measured proximate a substation bus. In some examples, the input signal may optionally include a voltage measured at or proximate the substation bus. The signal may be measured by an IED connected to a power line and configured to measure, for example, current along the power line proximate the substation bus. In some examples, the three-phase substation bus currents ($i_{abc}$) may be measured outside the substation, such as at any suitable location along the power line.

In some examples, the input to the event type classification module 94 may be processed and/or enhanced prior to being input to the module, such as to reduce computational complexity and/or to estimate the beginning, end and/or duration of a transient that caused an event. For example, as shown in FIG. 17, a transient isolation may be performed on the measured signal, as indicated at 212, such that three-phase transient substation bus currents are input to the module 94. In some examples, the event zone identification module may use the isolated transient to identify the zone in which the event occurred, as indicated at 214.

As shown in FIG. 17, the illustrated event type classification module 94, and the methods embodied therein, proceeds through three elements: event feature extraction, as indicated at 216, probabilistic event classification, as indicated at 218, and a probability estimation regarding the confidence that the classification of the event is correct, as indicated at 220. As indicated at 222, the event type classification module 94 produces results or output, which may be presented to an operator/user and/or utilized by other aspects of the electrical power distribution automation system. The outputs may be in the form of a probable classification for the event along with an estimated probability that characterizes the confidence that the event was correctly classified.

In examples where a transient isolation is performed on the measured signal, as indicated at 212, transient data, or a transient signal, corresponding to the power line event may be isolated from the measured data or signal. In such examples, the event feature extracted from the measured data or signal may be extracted from the isolated transient data or the isolated transient signal. In some examples, the system 80, such as by way of the event zone identification module 92, may identify a probable one of the monitoring zones in which a power line event occurred based at least partially on the isolated transient data or the isolated transient signal.

In some examples, approximately 80%-90% of sampled values are "noise" and unwanted. However, in the context of the present disclosure, such noise is not random noise. Rather the "noise" is the normal sinusoidal or deterministic part of the signal, which can be modeled with a reasonable accuracy. The "signal-to-noise" ratio (S/N) defines statistical properties of the calculated characteristics. For example, a high S/N ratio results in small variability and is preferred to remove or mitigate noise components to the extent possible.

Figure 18:
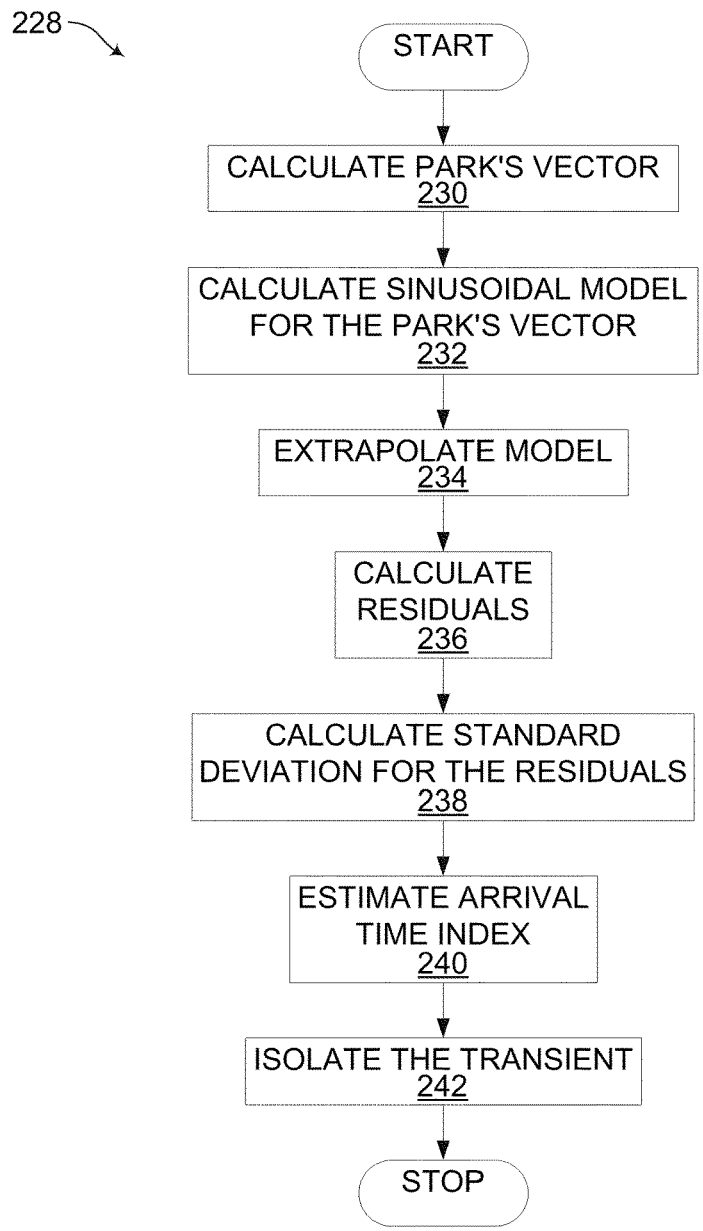
FIG. 18 is a flowchart showing a nonexclusive illustrative example of a method of transient isolation.

A nonexclusive illustrative example of a process or method for disturbance or transient isolation is schematically illustrated in a flow chart at 228 in FIG. 18. Although the actions of the method may be performed in the order in which they are presented below, it is within the scope of this disclosure for the following actions, either alone or in various combinations, to be performed before and/or after any of the other following actions. The transient isolation method 228 includes calculating Park's vector, as indicated at 230, calculating a sinusoidal model for the Park's vector, as indicated at 232, extrapolating the model, as indicated at 234, calculating residuals, as indicated at 236, calculating standard deviation for the residuals, as indicated at 238, estimating the arrival time index, as indicated at 240, and isolating the transient, as indicated at 242.

At 230, the Park's transformation is applied to the three-phase event data to calculate the Park's vector for the phase currents $i_a, i_b, i_c$. As noted above, the Park's transformation allows transformation of any instantaneous value of a three-phase system, having phases a, b and c, into one complex vector by using the 120° operator set out above in equation (4). The Park's vector for phase currents was set out above in equation (5).

Figure 19:
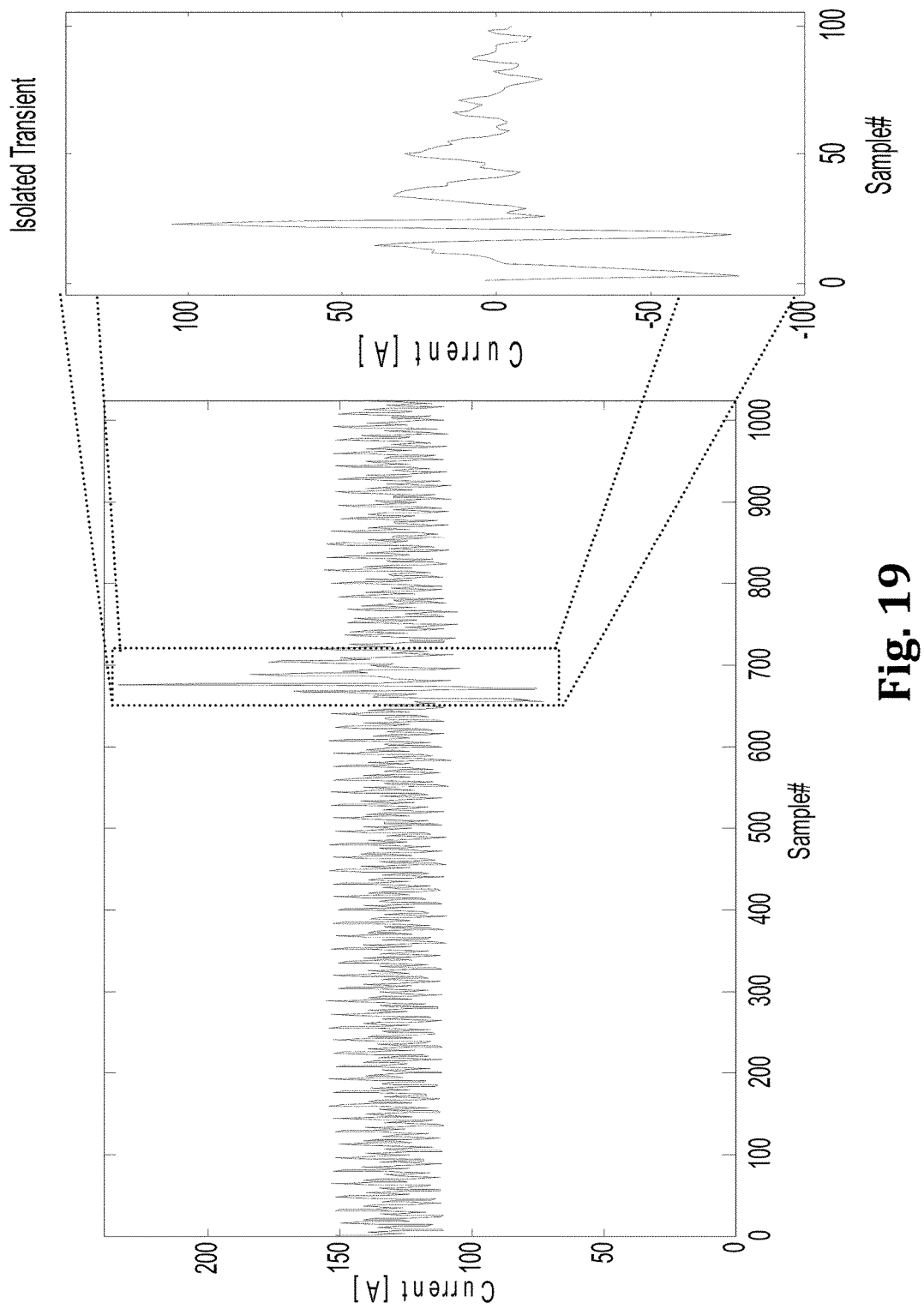
FIG. 19 is a graph showing the magnitude of the Parks vector, with isolated transient data, for a nonexclusive illustrative example of an event in the form of a cable failure on an adjacent feeder.

A nonexclusive illustrative example of the calculated magnitude of the Parks vector $\bar{i}_p$ for an event is shown in FIG. 19, along with an enlarged transient portion. The event illustrated in FIG. 19 is an AMZ cable fault in the form of a cable failure on an adjacent feeder.

Figure 20:
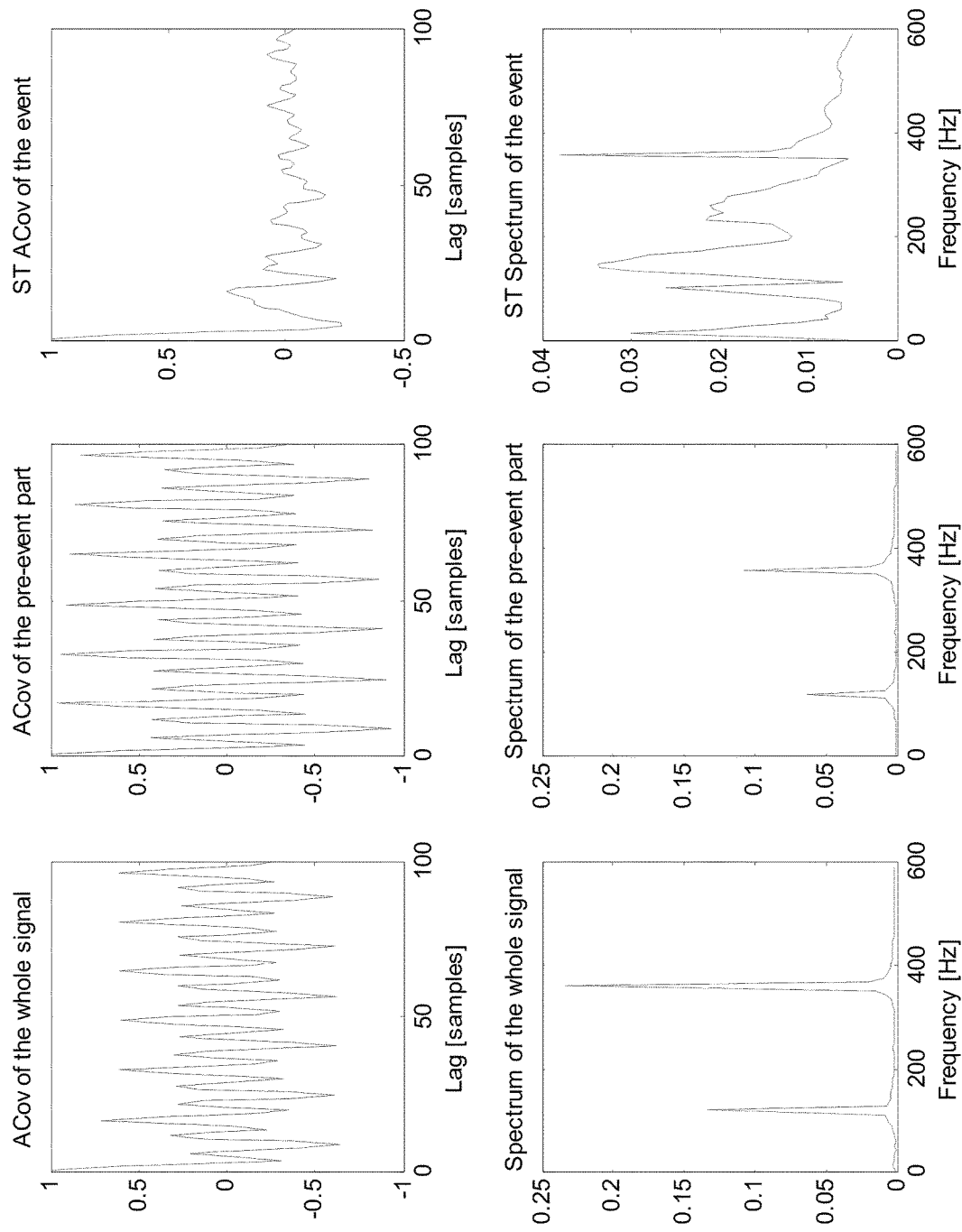
FIG. 20 is a comparison of the autocovariance function (upper row) and spectra (lower row) for the whole signal (left), the pre-event portion of the signal (middle), and the event portion of the signal (right).

The significance of transient isolation may be seen with reference to FIG. 20, which plots the autocovariance function (upper row) and spectra (lower row) for the whole Park's vector (left), for the stationary part of the Park's vector for the pre-event part (before the transient) of the signal (middle), and for the transient part only (right). As may be seen from FIG. 20, the "noise" covers the information in the transient. The shape of the autocovariance function calculated for the whole Park's vector and the pre-event part are similar, whereas the shape for the transient part is very different. The same is true for the spectra. Accordingly, the Park's transformation may ease the detection of the beginning and end points of an event.

When compared to the commonly used half-cycle discrete-time-Fourier-transform (HCDFT), the Park's transformation reduces the number of signals describing the event from six vectors to two and may reduce or eliminate any need to differentiate between phases in terms of having useful information about the event. Furthermore, no loss of information need be incurred because filtering is not applied to the principal signals. In addition, Park's transformation provides characteristics that help differentiate faults from non-faults.

Figure 21:
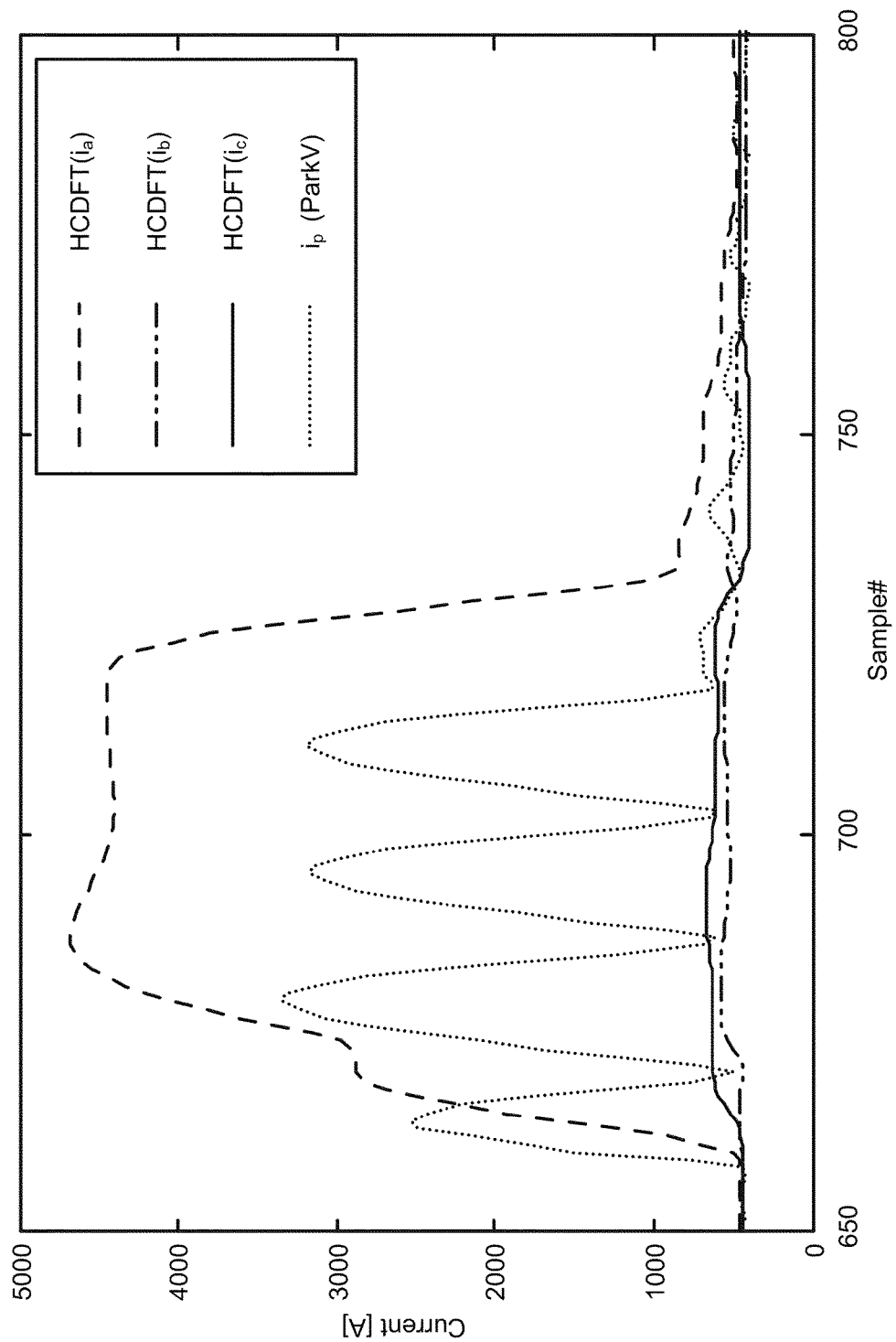
FIG. 21 is a graph showing the comparison between Half-Cycle Discrete-time Fourier Transform (HCDFT) and Park's transformation.

These above-described properties of the Park's transformation are illustrated in FIG. 21, wherein the HCDFT of the current $i_a$ increases first and the change in the HCDFT of the current $i_a$ is the largest, while the remaining phases increase at a later time. As may be seen, the HCDFT signal calculated for the current $i_a$ increases later and at a more gentle angle than the magnitude of the Park's vector $i_p$ due to the filtering. In addition, the HCDFT signal gives a longer estimate for the length of the event.

It is plausible to assume that a few cycles in the beginning of the recording represent normal line conditions and therefore define a deterministic part of the signal. Thus, at 232, the sinusoidal model for the Park's vector may be determined using the first $N_m = \eta_m N_c$ samples, which may capture, for example, the first 10 cycles. $N_m$ is a user settable parameter, $\eta_m$ is integer multiplier defining the length of the modeling sequence in cycles, and $N_c$ is the number of samples in one cycle. The Park's vector may be modeled using a sinusoidal model as set out in equation (23):

$$s[n] = \sum_{m=1}^{M} A_m \cos(\omega_1 mn + \phi_m) + \varepsilon[n], n = 1, \ldots, N_m \quad (23)$$

where $\omega_1$ is the line frequency, m is the harmonic number, n is the sample number, $\phi_m$ is the m-th phase angle, and M denotes the total number of harmonics in the model. The number of harmonics M in the model is a user settable parameter, which may be set based on the expected harmonic content of the power line, such as to 15, for example, and according to the maximum frequency content determined by the sampling frequency used in the digitization of the signals. The model parameters, $A_m$, $\phi_m$, may be estimated using maximum likelihood methods.

At 234, the sinusoidal model is extrapolated over the entire recording, as set out in equation (24):

$$s[n] = \sum_{m=1}^{M} A_m \cos(\omega_1 mn + \phi_m), n = N_m + 1, \ldots, N_s \quad (24)$$

At 236, the residuals are calculated by subtracting the extrapolated sinusoidal model s[n] from the original Park's vector signal $i_p[n]$, as set out in equation (25), which removes the "noise" components.

$$r[n] = i_p[n] - s[n], n = 1, \ldots, N_s \quad (25)$$

The resulting residual signal r[n] is used for the transient isolation.

After the "noise" is removed, the arrival time index for the event may be determined from the residual signal. The arrival time index is the specific sample correlating to the beginning of the event. In some examples, such as for many PMZ fault events, the current may increase very fast, or even jump to a higher level, at the very beginning of the event, which may provide a good "signal-to-noise" (S/N) ratio that facilitates detecting the arrival time index. Thus, a fixed threshold based on the standard deviation of the signal during normal conditions may be used. Accordingly, at 238, the standard deviation σ is calculated for the pre-event residuals, as set out in equation (26):

$$\sigma = std(r[n]), n = 1, \ldots, N_m \quad (26)$$

At 240, the arrival time index $T_0$ is estimated by searching for the first index k where the absolute value of the residual r[k] is greater than $\eta\sigma$, as set out in equation (27):

$$\text{find}(k||r[k]| \geq \eta\sigma), T_0 = \min\{k\} - N_c/2 \quad (27)$$

where $T_0$ is the arrival time index, and η is a threshold multiplier that may be selected from a suitable range such as 10 to 20.

At 242, the transient is isolated as set out in equation (28):

$$i_t[n - T_0 + 1] = r[n], n = T_0, T_0 + 1, \ldots, T_0 + N_t - 1 \quad (28)$$

where $i_t$ is the isolated transient, and $N_t$ is the predefined length for the transient.

As may be understood, by isolating the transient as set out above, an original data set that may have been, for example, 1000 samples can be simplified. The resulting data outputs from the transient isolation may include the residual plot, the arrival time index, and the event window. The event window, which includes the event start and end times, may be defined by the event start index and the length of the transient $N_t$. For certain analysis purposes, such as zone identification, the length of the transient $N_t$ may be a user settable parameter that may be set to a suitable value, such as, for example, 256 samples or 8 cycles in the case of a 60 Hz system.

Figure 22:
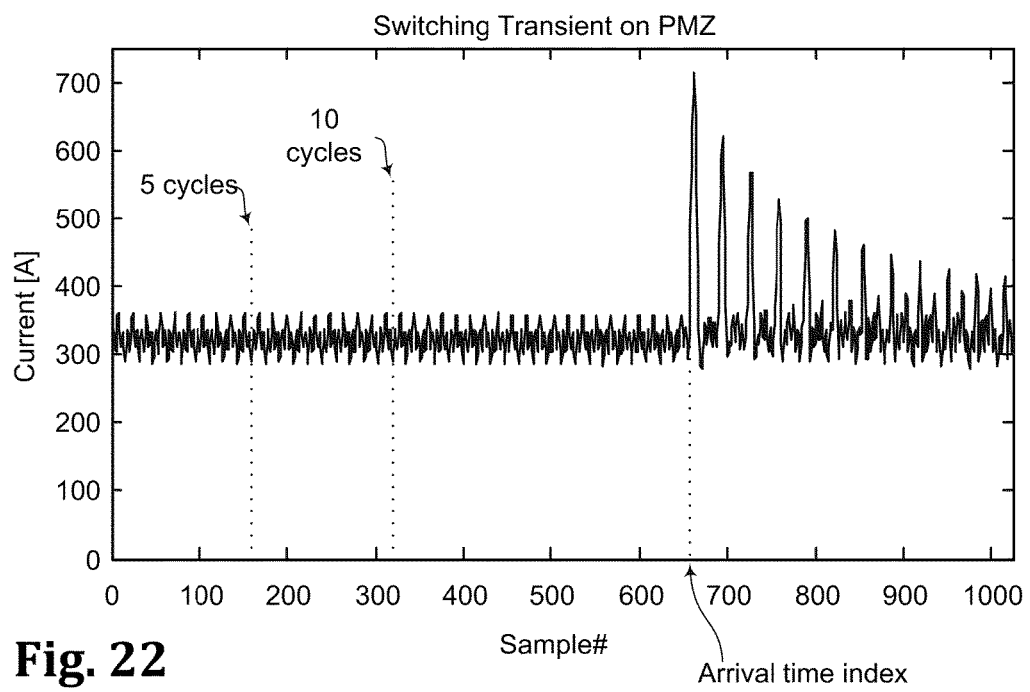
FIG. 22 is a graph of the Park's vector for a Primary Monitoring Zone (PMZ) switching transient event.
Figure 23:
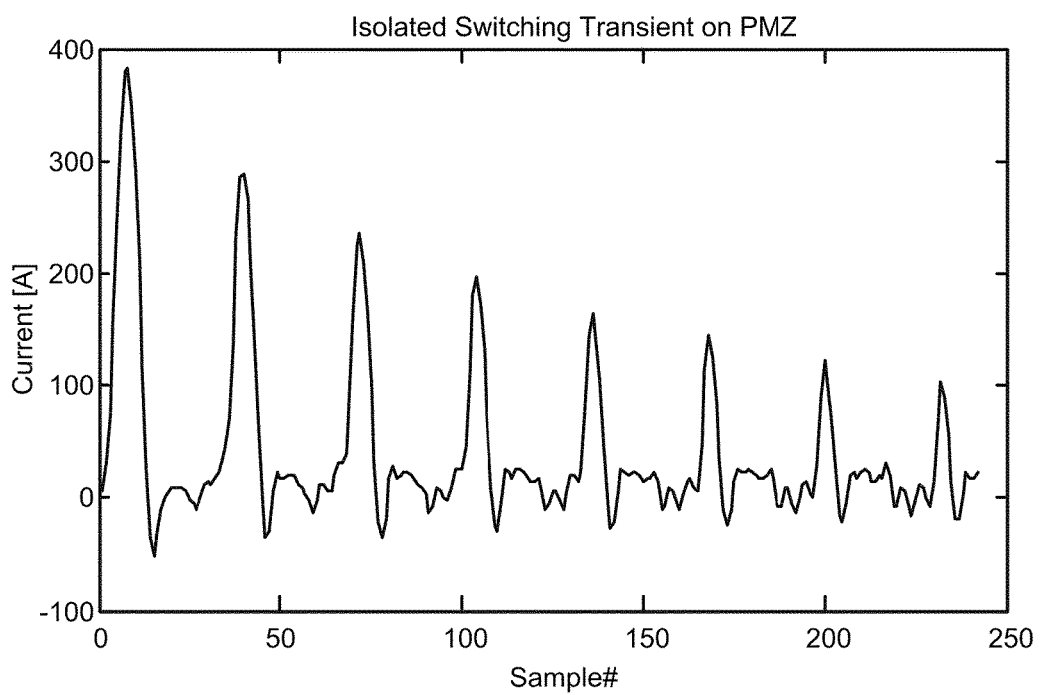
FIG. 23 is a graph of the isolated transient data for the switching transient of FIG. 22.

A nonexclusive illustrative example of transient isolation may be illustrated with reference to FIGS. 22 and 23. The Park's vector for a PMZ switching transient event is shown in FIG. 22. The corresponding isolated transient, which was isolated from the Park's vector using a threshold of 20σ, is shown in FIG. 23. As may be understood, the threshold multiplier η may be optimized for events in the other monitoring zones as well as PMZ events that do not exhibit PMZ fault characteristics.

Power line events may manifest themselves as voltage or current disturbances with differing characteristics, or combinations of characteristics, that depend upon the physical phenomenon that caused the event. When such characteristics are identified and differentiated, the type of a given event may be identified and/or classified by finding the closest match between the characteristics of the event and those of one or more known event types, which may provide a supervised classification of the event type. In some contexts, the characteristics associated with an event may be referred to as "features" of the event. The event features may be categorical, textual, or numerical. The numerical features may be computed in the time domain, the frequency domain, or any combination thereof.

The classification module 94 may assign or classify an identified or detected power line event into the closest one of a plurality of identified event classification groups according to a suitable distance measure, such as the Mahalanobis distance function, which is equivalent to classification on the largest posterior probability value according to Bayes rule. Nonexclusive illustrative examples of event groups include various types of faults with varying durations, switching events, transients, load pick-ups, or the like. As may be understood, the classification module 94 may attempt to assign an identified event to a group of events having features that are relatively similar to, or even the same as, the identified event. In some examples, the classification module 94 may form a new event group if the identified event is an outlier with features that are sufficiently distinct from even the closest one of the groups. Parameters needed for the probability models for the various event groups in each event zone (PMZ, AMZ, or UMZ) are centroids $C_i \in \Re^l$, variances $\xi_i \in \Re^l$, and projection matrices $P_i \in \Re^{l \times l}$ for each group i=1, . . . , K. In some examples, the number of event groups K for each zone may be adjusted to fit the initial dataset(s) associated with each of the zones.

Event classification may be performed using a known category structure, which may be modeled using probability density functions. Each probability density function estimates the density of data points in a region of the feature space into which a particular group of events is being mapped. A complete classification problem for K event groups includes the K probability density functions $P_1(x)$, $P_2(x)$, ..., $P_K(x)$ for the K event groups, the K prior probabilities $\xi_1, \xi_2, \ldots, \xi_K$ of the hypotheses $H_1, H_2, \ldots, H_K$ for the K event groups, and values $r_{ij}$ representing the cost of misidentifying an event belonging to the i-th group as being a member of the j-th group, which is the cost of errors. $H_j$ denotes the hypothesis that the event belongs to group j. Prior probabilities in the Bayesian framework are probabilities of group membership that are determined based on prior information about event group probabilities. For example, if a power line is known to be completely underground, the probability of having a vegetation related event, such as a tree contact, is low, and the prior probability for this event group may be practically set to zero.

Membership in a given group for a particular power line event may be predicted by the particular event's discriminant score, which is calculated using the prior probabilities and probability density functions. In some examples, the event type classification module 94 may proceed through a design phase during which classifier parameters, such as centroids $C_i \in \Re^l$, variances $\xi_i \in \Re^l$, and projection matrices $P_i \in \Re^{l \times l}$ for each group $i=1, \ldots, K$, are calculated for samples of known patterns. However, such a design phase need not be independent from the classification phase carried out by the event type classification module; that is, the classifier parameters may be updated and/or tuned based on classifications carried out during the classification phase for various detected events.

The parameters of the probability model may be estimated by calculating the spectra of the maximum norm or $l_\infty$ scaled transient, calculating a Principal Component Analysis (PCA) model for the spectra, storing the mean value and the global projection matrix P, and projecting the measured data onto a lower dimensional l-dimensional space, with the dimension l being adjustable to fit a particular dataset. Nonexclusive illustrative examples of values for the dimension l include two, three or even four or more. PCA is mathematically defined as an orthogonal linear transformation that transforms the data to a new coordinate system such that the greatest variance by any projection of the data comes to lie on the first coordinate (called the first principal component), the second greatest variance on the second coordinate, and so on. The PCA model for the spectra consists of the first l principal components. The orthogonal linear transformation is done by the projection matrix P, which is one of the results of PCA.

Figure 25:
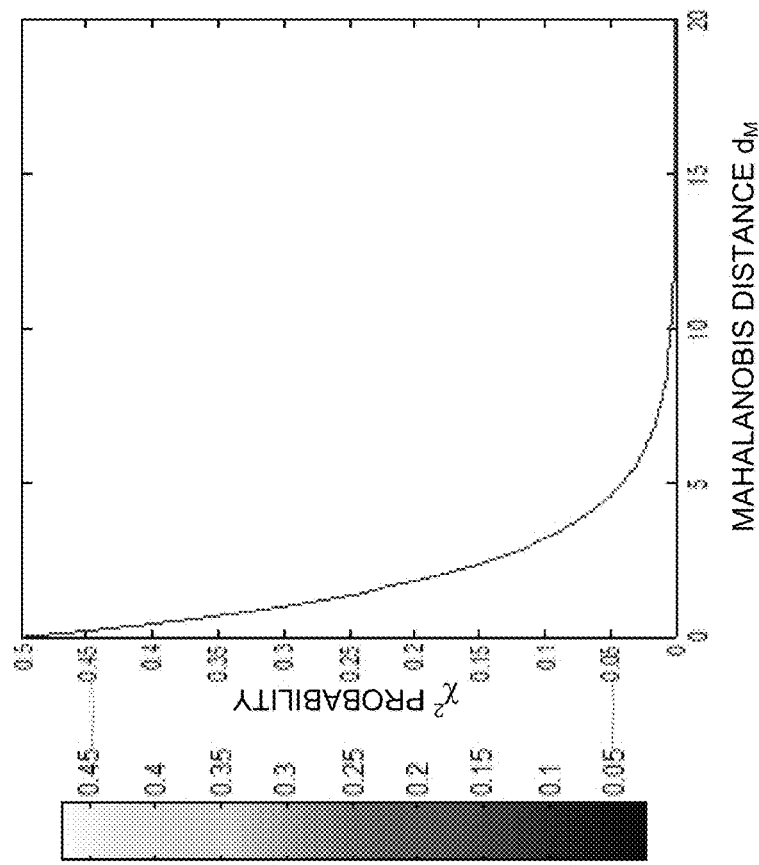
FIG. 25 is a plot of a $\chi^2$ density function corresponding to the gradient of FIG. 24, plotted as a function of the Mahalanobis distance $d_M$.
Figure 24:
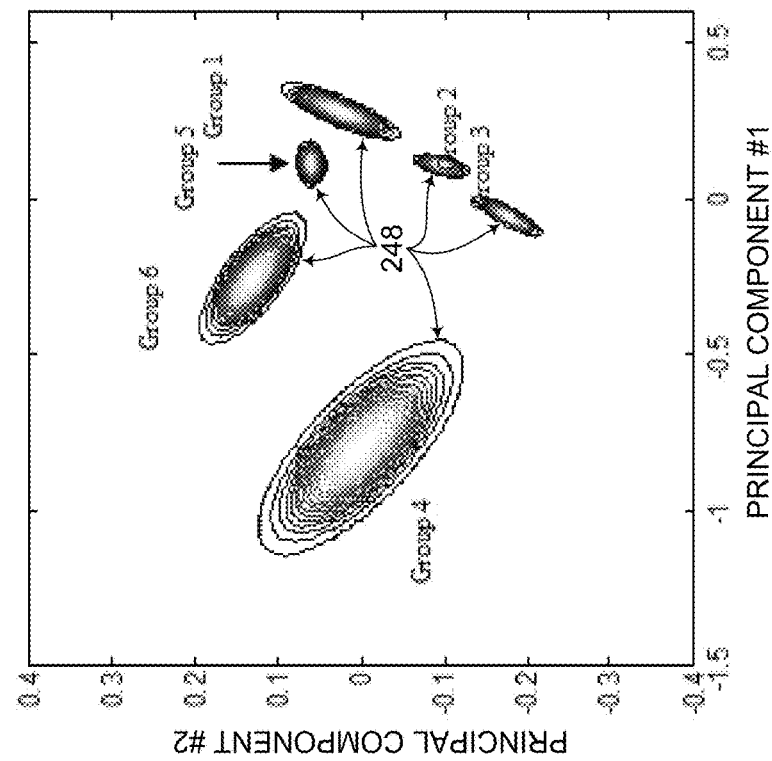
FIG. 24 is a plot of nonexclusive illustrative examples of contours for several probability density functions, with a gradient bar showing the probability values of the contours.

The parameters of the Gaussian probability model, which corresponds to the set of probabilities that a particular event belongs to each of a plurality of classification groups, may then be estimated or determined by calculating the centroid of the projected spectra of the events belonging to the i-th group, mean centering the projected spectra by subtracting the mean spectrum, calculating the local principal component model for the mean centered and projected spectra, and storing the centroid $C_i$, the local projection matrix $P_i$, and the standard deviations. In some examples, five parameters are estimated for each group; that is, two parameters for the centroid and three independent parameters for the covariance/variance matrix. In examples where there are only a few samples in the training data, a manual tuning may be used to get well behaving boundaries between the groups and correct classification in the training set. Nonexclusive illustrative examples of density function contours after manual tuning are illustrated at 248 in FIG. 24, with the $\chi^2$ density function corresponding to the gradient of FIG. 24 plotted as a function of the Mahalanobis distance $d_M$ in FIG. 25.

In some examples, the decision rule or rules used in classification may include a criterion of optimality, which may be based on minimizing the classification error, with the classification error including modeling errors and estimation errors. The modeling errors correspond to the difference between the selected probability density model and the "real" probability density function, while the estimation error corresponds to the accuracy of the estimation of the parameters in the model.

The necessary level of modeling complexity may be data-dependent. For example, where the groups are well separated and have about the same variance and shape, even a simple model consisting only of centroids of the groups may allow classification with an acceptable classification error.

As will be more fully set out below, event feature extraction may include scaling an isolated transient, spectrum calculation, and projection of the spectrum into a lower dimensional l-dimensional space. Parameters needed for event feature extraction may include the global projection matrix P and the mean value of spectra of $l_\infty$ scaled transients.

Figure 26:
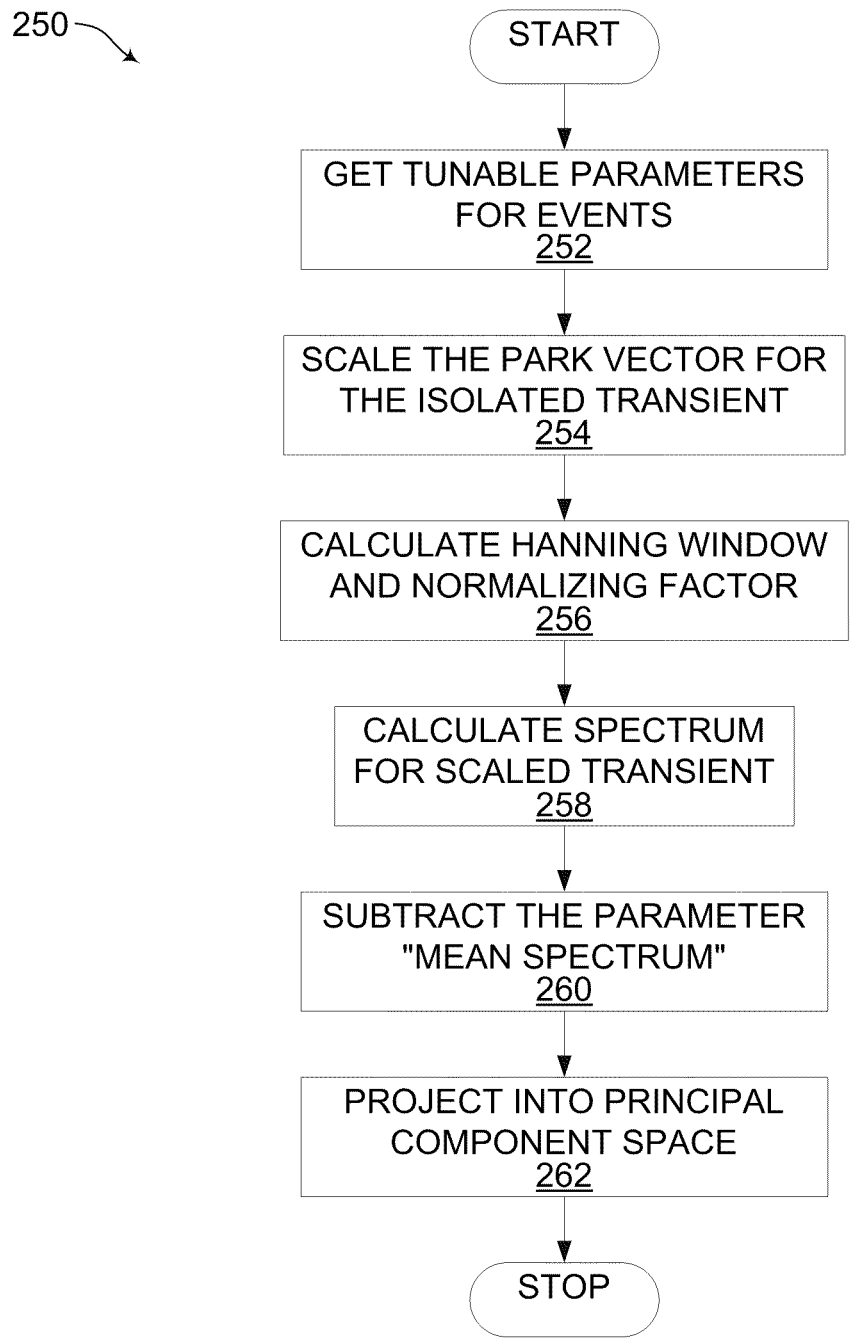
FIG. 26 is a flowchart showing a nonexclusive illustrative example of a method for feature extraction for classifying power line events.

A nonexclusive illustrative example of a feature extraction process or method for classifying power line events, such as for implementing the event feature extraction element 216 of the event type classification module 94, is schematically illustrated in a flow chart at 250 in FIG. 26. Although the actions of the method may be performed in the order in which they are presented, it is within the scope of this disclosure for the following actions, either alone or in various combinations, to be performed before and/or after any of the other following actions.

As shown in FIG. 26, feature extraction may include getting or retrieving tunable parameters for events, as indicated at 252, scaling the Park vector of the isolated transient, as indicated at 254, calculating a Hanning window and a normalizing factor, as indicated at 256, calculating a spectrum for the scaled transient, as indicated at 258, subtracting the parameter "mean spectrum," as indicated at 260, and projecting the spectrum onto its principal component space, as indicated at 262. The actions of the illustrative feature extraction method 250 are set out in more detail in the next paragraph with regard to equations (29) to (34).

The tunable parameters, which may be for events such as PMZ, AMZ and/or UMZ events, may include $\{S_m, P, Par\}$, where $S_m$ is the mean value of spectra of $l_\infty$ scaled transients, P is the global projection matrix, and Par is a set of parameters that includes centroids $C_k$, variances $\xi_k$, and projection matrices $P_k$ for each group $i=1, \ldots, K$. The isolated transient, $i_t[n]$, may be scaled to determine a scaled transient $i_{st}[n]$ using equation (29):

$$i_{st}[n] = i_t[n]/l_\infty(i_t), n=1, \ldots, N_t \quad (29)$$

where $l_\infty(i_t)$ is the maximum norm of the isolated transient, n is the element number, and $N_t$ is the length of the isolated transient. A Hanning window $w_h[k]$ for the k-th sample and a normalizing factor $\rho$ may be calculated using respective ones of equations (30) and (31):

$$w_h[k], \quad k=1, \ldots, N_t \quad (30)$$

$$\rho = \sum_{k=1}^{N_t} w_h[k]/2 \quad (31)$$

The spectrum S[k] for the scaled transient $i_{st}[n]$ may be calculated using equation (32):

$$S[k] = |DTFT(i_{st}[n]w_h[n])|/\rho, k=1, \ldots, N_t/2+1 \quad (32)$$

where $DTFT(i_{st}[n]w_h[n])$ is the discrete time Fourier transform, k is an index, and $N_t/2+1$ is the length of the spectrum. The parameter "mean spectrum" $S_m[k]$ is subtracted from the calculated spectrum S[k], as set out in equation (33), to determine the mean-centered spectrum $S_{mc}[k]$.

$$S_{mc}[k] = S[k] - S_m[k], k=1, \ldots, N_t/2+1 \quad (33)$$

The mean-centered spectrum $S_{mc}[k]$ is projected onto the principal component space to yield the feature vector t that will be used in the classification:

$$t = PS_{mc} \quad (34)$$

where $S_{mc}$ is the vector of elements $S_{mc}[k]$.

Cluster analysis of events may reveal a particular probability model or transformation that gives a desired classification. By way of example, a desired classification may partition the events into a relatively low number of homogeneous and well differentiated groups that beneficially serve the objective of the classification. For example, cluster analysis of PMZ events may reveal a particular transformation that gives a desired classification with respect to events that may be broadly categorized as fault and non-fault events. In such a classification, the groups may include various fault events, such as cable faults with different durations, animal contacts, transformer faults and various non-fault events, such as switching transients, load pickups, inrush events, or the like. In some examples, using the spectrum of $l_\infty$ scaled transients provides the desired classification with respect to fault and/or non-fault events.

The event type classification module may calculate a distance measure for a detected power line event with respect to each of the plurality of event classification groups and identify which of the event classification groups is associated with the smallest distance measure. Based on the calculated distance measures, the event type classification module may determine that the most probable classification for the power line event corresponds to the event classification group for which the distance measure is smallest.

In some examples, the distance measures may be a Mahalanobis distance to the centroid of each event group. By classifying an event into the closest event group according to the Mahalanobis distance $d_M$, the event is implicitly assigned to the group for which it has the highest probability of belonging. In examples where it is assumed that every case must belong to one of the groups, the probability of group membership for each group can be computed via the Bayes theorem, as set out in equation (35).

$$Pr(H_j | t) = \frac{\chi^2(d_M^2(t, C_j, \Sigma_j), 2)}{\sum_{i=1}^{K} \chi^2(d_M^2(t, C_i, \Sigma_i), 2)} \quad (35)$$

where $H_j$ is the hypothesis that event belongs to group j, $\chi^2(d_M^2(t,C_j,\Sigma_j),2)$ is the value of the $\chi^2$ density function for group j, $d_M^2(t,C_j,\Sigma_j)$ is the squared Mahalanobis distance for group j, t is the feature vector determined by equation (34), $C_j$ is the center of group j, $\Sigma_j$ is the covariance/variance matrix of the distribution model for the members of group j, and the posterior value $Pr(H_j|t)$ gives the probability that the event belongs to group j. As may be understood, when it is assumed that every case must belong to one of the groups, these probabilities sum to unity or 1.0 over all the groups, and classification on the largest of these values also is equivalent to using the smallest Mahalanobis distance $d_M$. However, the training samples may not be representative of all types of events, and it is possible to capture or identify an event that might belong to an unknown group, in which case the sum of the probabilities may not add up to unity.

Figure 27:
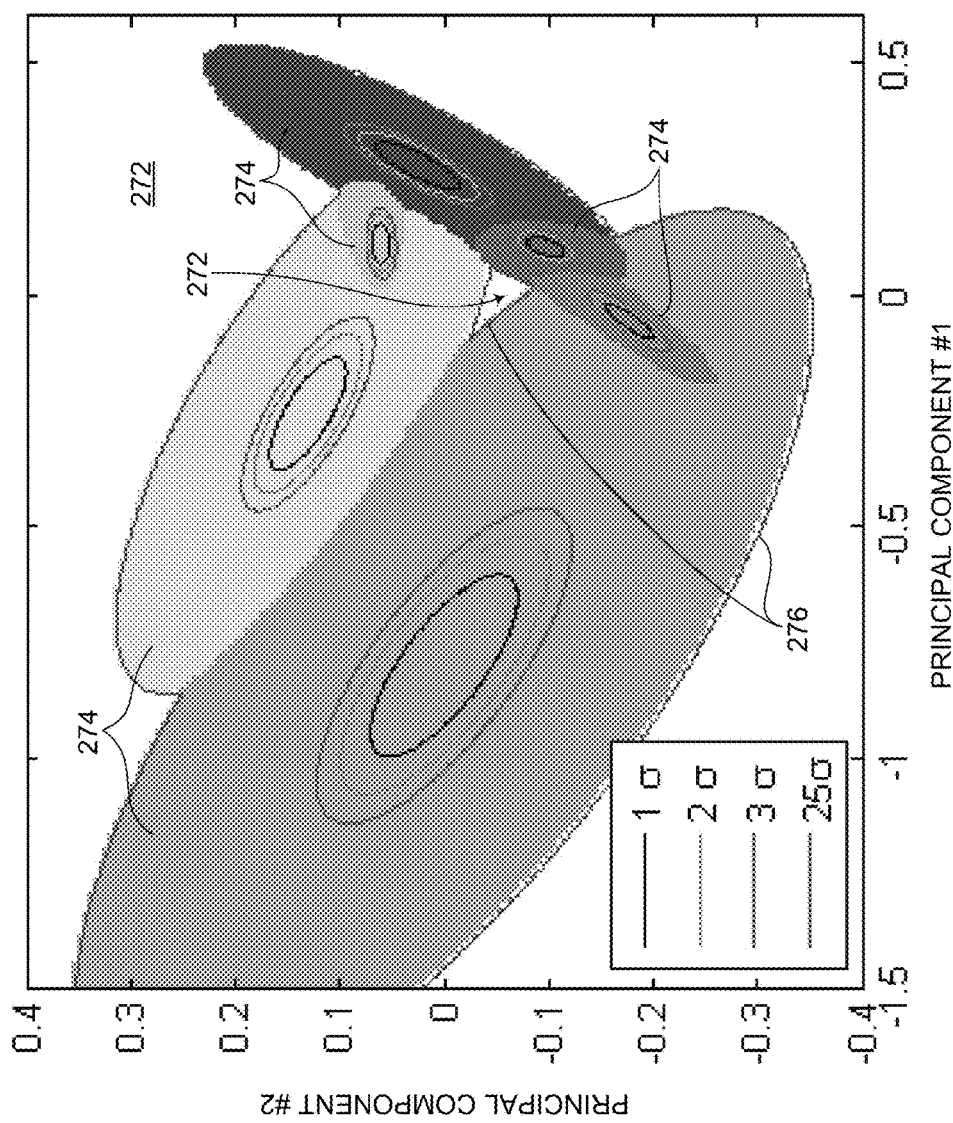
FIG. 27 is a plot of a nonexclusive illustrative example of a division of a projected sample space for power line events, with the projected sample space being divided into six regions that correspond to six event classification groups.

In some examples, the event type classification module may determine that none of the plurality of event classification groups corresponds to a probable classification for a given event. For example, where the smallest one of the distance measures for a detected event is larger than a predetermined threshold, such as where the event is very far from all the groups such that all of the probabilities are small, the event type classification module may determine that the event is an outlier or a new unobserved event that does not correspond to any of the event classifications corresponding to the plurality of event classification groups. Thus, in some examples, the event classification group for which the distance measure is smallest may only be identified as corresponding to the most probable classification when or if the smallest distance measure is less than or below a predetermined threshold, which may be a distance-reject threshold. By way of example the white regions 272 shown in FIG. 27 correspond to the region of samples, for which the distance measure to the closest one of the groups 274 is larger than the predetermined threshold, which is indicated by 276, such that any sample in the white regions 272 may be considered outside the projected sample space.

The predetermined threshold may be determined or defined, such as by using a training set and minimizing the region of rejected data points inside the region that is surrounded by the groups. In some examples, the predetermined threshold may be set such that the distance measure to the centroid of a particular group needs to be less than a particular number of standard deviations ($\sigma$) for that group. Nonexclusive illustrative examples of such predetermined thresholds include $1\sigma$, $2\sigma$, $3\sigma$, $7\sigma$, $10\sigma$, $20\sigma$, or even $25\sigma$, which is the predetermined threshold illustrated in FIG. 27 at 276.

Figure 28:
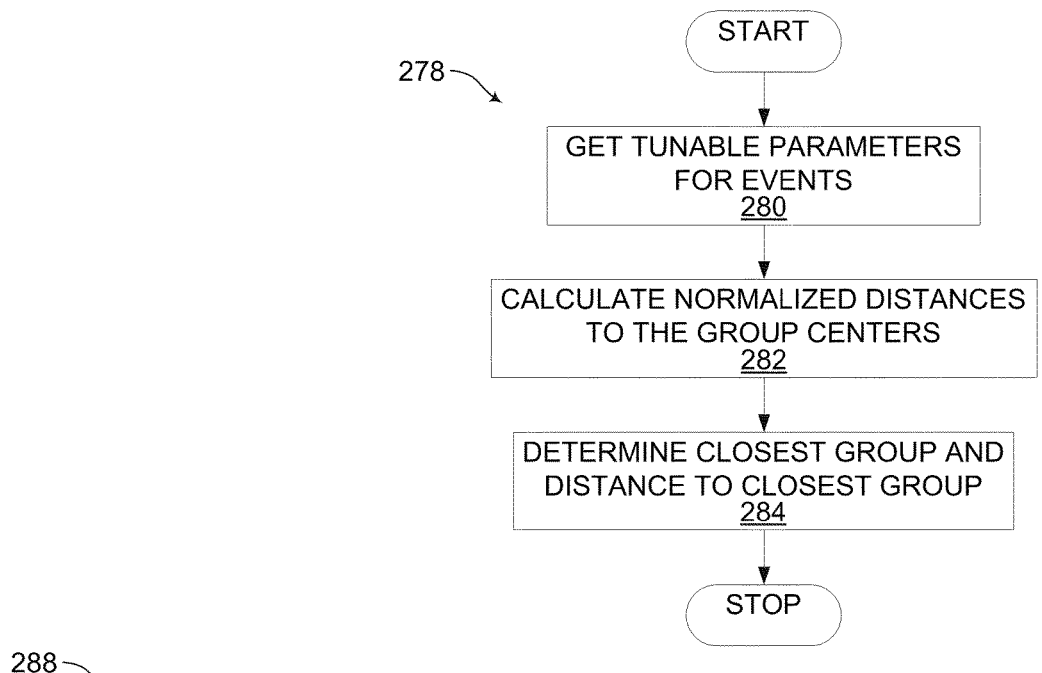
FIG. 28 is a flowchart showing a nonexclusive illustrative example of a method for probabilistic classification of power line events.

A nonexclusive illustrative example of a probabilistic classification process or method, such as for implementing the probabilistic event classification element 218 of the event type classification module 94, is schematically illustrated in a flow chart at 278 in FIG. 28. Although the actions of the method may be performed in the order in which they are presented below, it is within the scope of this disclosure for the following actions, either alone or in various combinations, to be performed before and/or after any of the other following actions. As shown in FIG. 28, probabilistic classification may include getting or retrieving tunable parameters for events, as indicated at 280, calculating the normalized distances to the group centers, as indicated at 282, and determining the closest group, which may be identified as the classification for the event, and the distance to the closest group, as indicated at 284.

The tunable parameters, which may be for events such as PMZ, AMZ and/or UMZ events, may include {Par,K}, where Par is a set of parameters that includes centroids $C_k$, variances $\xi_k$, and projection matrices $P_k$ for each group $i=1, \ldots, K$. The number of groups K for each monitoring zone may be adjusted to fit the dataset(s) associated with each of the zones, and the values of the parameters may be different for each zone.

The Mahalanobis distances $d=[d[1], \ldots, d[K]]$ to the group centers may be calculated as set out in equation (36):

$$t_k = P_k(t - C_k) \tag{36}$$

$$d[k] = \sqrt{\sum_{i=1}^{l} \left(\frac{t_k[i]}{\xi_k[i]}\right)^2}, k = 1, \ldots, K$$

where t is the feature vector, as determined above by equation (34), $C_k$ is the center, $\xi_k$ is the variance, and $P_k$ is the projection matrix of the group k. The closest one $k_{min}$ of the event classification groups may be determined with equation (37), while the distance $d_{min}$ to the closest group may be determined using equation (38).

$$k_{min} = \underset{k=1,\ldots,K}{\operatorname{argmin}}\{d[k]\} \tag{37}$$

$$d_{min} = d[k_{min}] \tag{38}$$

In addition to determining a probable event classification group membership for a given event, the accuracy of the class prediction may be determined. For example, the posterior value $Pr(H_j|t)$ that the event belongs to group j when it is classified to belong to group j by the classifier may be close to 100% if the groups are very well separated from each other. Under Bayes rule, the sample space is divided into mutually exclusive regions, with $\Omega_j$ being the region for the group j. Thus, in contrast to the posterior value $Pr(H_j|t)$, the probability $Pr(t \in \Omega_j|H_j)$ provides an estimate of the proportion of cases in the j-th group's population that are further from the centroid than t. Accordingly, the probability $Pr(t \in \Omega_j|H_j)$ may be used to develop an empirical estimate for the classification result, such as in the manner of an outlier detector.

Figure 29:
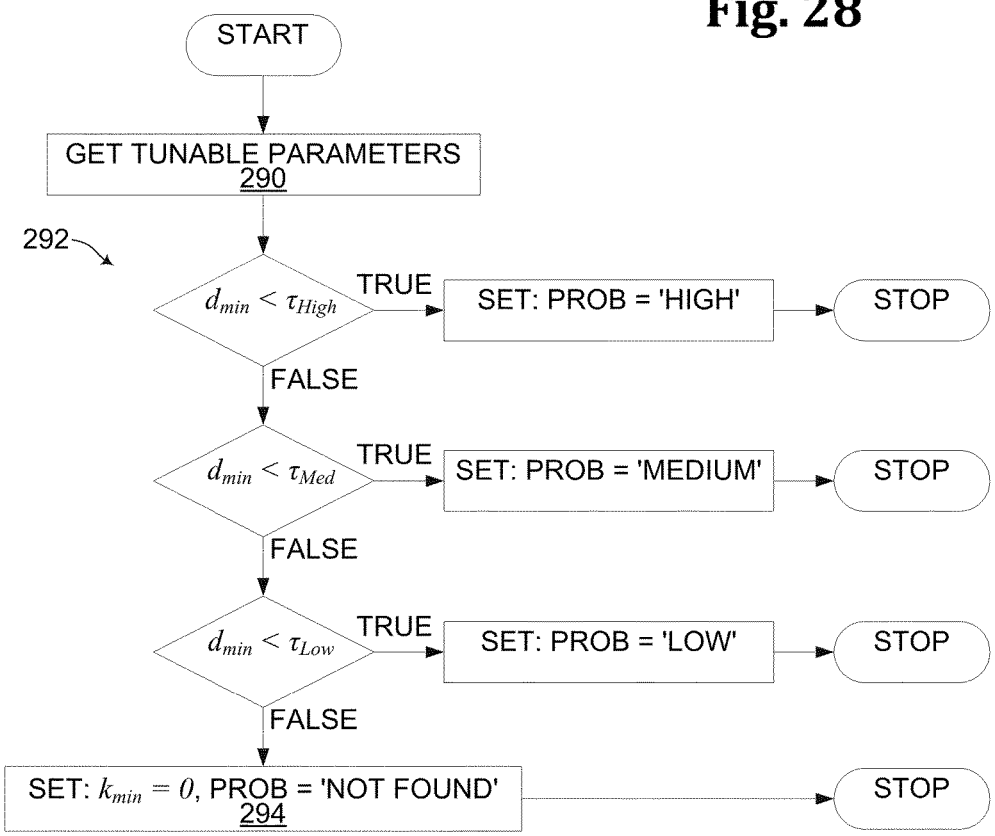
FIG. 29 is a flowchart showing a nonexclusive illustrative example of a method for estimating the relative probability of correctly classifying a power line event.

A nonexclusive illustrative example of a probability estimation process or method for estimating the probability of correctly classifying a power line event, such as for implementing the probability estimation element 220 of the event type classification module 94, is schematically illustrated in a flow chart at 288 in FIG. 29. Although the actions of the method may be performed in the order in which they are presented below, it is within the scope of this disclosure for the following actions, either alone or in various combinations, to be performed before and/or after any of the other following actions.

As shown in FIG. 29, tunable parameters $\{\tau_{High}, \tau_{Med}, \tau_{Low}\}$ may be acquired as indicated at 290, with $\tau_{High}$ being a threshold for a high relative probability of correct classification, $\tau_{Med}$ being a threshold for a medium relative probability of correct classification, and $\tau_{Low}$ being a threshold for a low relative probability of correct classification. Subsequently, based on the results of the decision tree 292, a determination may be made whether there is a high, medium or low probability of a correct classification, or whether the classification is incorrect. As may be understood, when the calculations are based on example groups used in the design phase, such a probability estimation gives "relative" probabilities. For example, if $d_{min} < \tau_{High}$, a high probability of a correct classification relative to the example groups is indicated; if $d_{min} \geq \tau_{High}$ but $d_{min} < \tau_{Med}$, a medium probability of a correct classification relative to the example groups is indicated; and if $d_{min} \geq \tau_{Med}$ but $d_{min} < \tau_{Low}$, a low probability of a correct classification relative to the example groups is indicated. If $d_{min} \geq \tau_{Low}$, set $k_{min} = 0$ and indicate that, in a relative sense, the group corresponding to the smallest distance measure is not a correct classification for the event, as indicated at 294.

The tunable parameters may be adjusted to suit a particular dataset. For example, almost all the data points are usually inside the 3σ-limit or threshold. Thus, for example, the probability of correct classification may be deemed "High" if the data point is inside the 3σ-limit ($\tau_{High} = 3\sigma$). The probability of correct classification may be deemed "Medium" if the data point is outside the 3σ-limit but within the 7σ-limit ($\tau_{Med} = 7\sigma$). The probability of correct classification may be deemed "Low" if the data point is located between the 7σ-limit and a distance rejection threshold such as the 25σ-limit ($\tau_{Low} = 25\sigma$).

It should be understood the above-disclosed methods may be applicable to classifying PMZ, AMZ and/or UMZ power line events.

Figure 30:
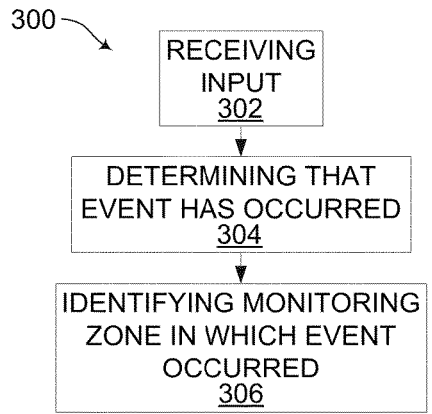
FIG. 30 is a flow chart showing a nonexclusive illustrative example of a method for power line event zone identification.

A nonexclusive illustrative example of a process or method for power line event zone identification, such as for implementing the event zone identification module 92, is schematically illustrated in a flow chart at 300 in FIG. 30. Although the actions of the method may be performed in the order in which they are presented below, it is within the scope of this disclosure for the following actions, either alone or in various combinations, to be performed before and/or after any of the other following actions. As shown in FIG. 30, the illustrated method 300 includes receiving input, such as measured data corresponding to a signal measured on a power line at block 302, determining from the measured data that a power line event has occurred at block 304, and identifying a probable one of at least two monitoring zones in which the power line event occurred at block 306. In some examples, the at least two monitoring zones may be defined for an IED such as the IED 36 shown in FIG. 1. For example, the at least two monitoring zones may include any two or more of the PMZ 40, the AMZ 42 and the UMZ 44. Although various aspects of the method 300 are explained in further detail below with reference to the distribution feeder shown in FIG. 2, it should be understood that the method 300 and its various aspects may be used for zone identification of other power line events such as transmission line events.

When receiving input data or signals, the systems and methods disclosed herein may receive measured data corresponding to a signal measured by an IED protecting a power line, such as proximate a substation bus. The measured signals may include current or currents measured along a power line, such as proximate a substation bus, and/or voltages measured proximate the substation bus. For example, measured three-phase substation bus currents ($i_{abc}$) may be received from the IED 72 shown in FIG. 2, which is connected to the feeder 70 and configured to measure current along the feeder 70 proximate the substation 78. The subscripts a, b and c of $i_{abc}$ correspond to the three phases 70a, 70b and 70c of the feeder 70. In some examples, the data measured for $i_{abc}$ may be digitally sampled.

Figure 31:
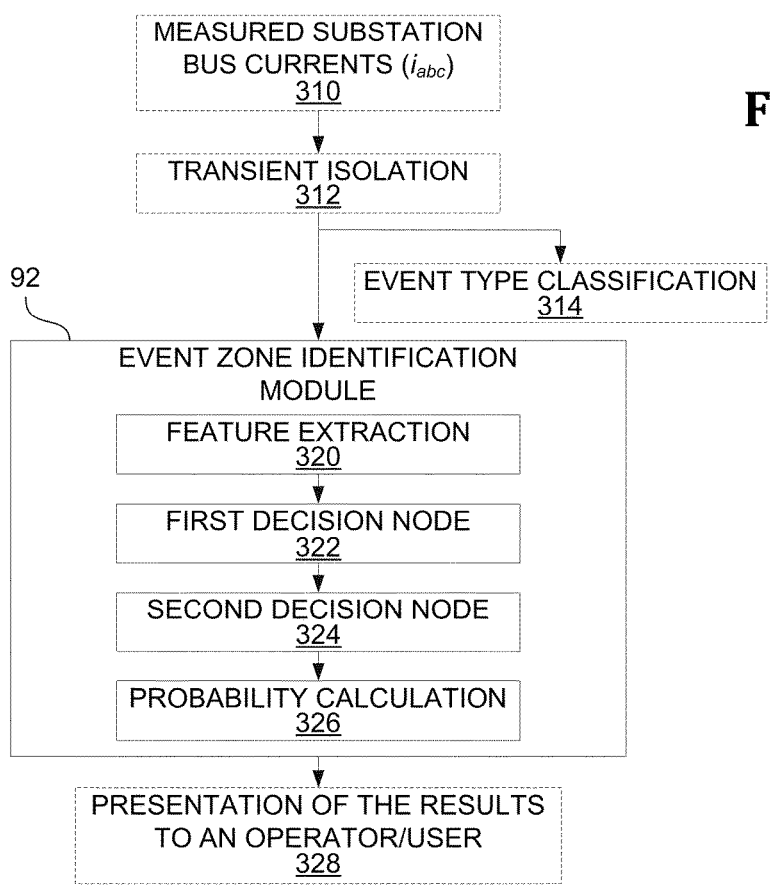
FIG. 31 is a block diagram of a nonexclusive illustrative example of a zone identification module along with associated inputs and outputs.

A nonexclusive illustrative example of an event zone identification module 92, which may embody the systems and methods for power line event zone identification, is shown in FIG. 31 along with nonexclusive illustrative examples of inputs to, and outputs from, the module. The event zone identification module 92 receives input 310 in the form of a signal, such as for example, three-phase substation bus currents ($i_{abc}$) measured proximate a substation bus. In some examples, the input signal may optionally include a voltage measured at or proximate the substation bus. The signal may be measured by an IED connected to a power line and configured to measure, for example, current along the power line proximate the substation bus. In some examples, the three-phase substation bus currents ($i_{abc}$) may be measured outside the substation, such as at any suitable location along the power line.

In some examples, the input to the event zone identification module 92 may be processed and/or enhanced prior to being input to the module, such as to reduce computational complexity and/or to estimate the beginning, end and/or duration of a transient that caused an event. For example, as shown in FIG. 31, a transient isolation may be performed on the measured signal, as indicated at 312, such that three-phase transient substation bus currents are input to the module 92. Transient data, or a transient signal, corresponding to the power line event may be isolated from the measured data or signal using any suitable approach such as the transient isolation method 158 discussed above. In some examples, the system 80, such as by way of the event type classification module 94, may provide a probable classification for the event, as indicated at 314, based at least partially on the isolated transient data or the isolated transient signal.

As shown in FIG. 31, the illustrated event zone identification module 92, and the methods embodied therein, may proceed through four elements: event feature extraction, as indicated at 320, a first decision node, as indicated at 322, a second decision node, as indicated at 324, and a probability calculation, as indicated at 326. As indicated at 328, the event zone identification module 92 produces results or output, which may be presented to an operator/user and/or utilized by other aspects of the electrical power distribution automation system. The outputs may be in the form of a probable, or even a most probable, identification of the zone in which the event occurred, and may include, in some examples, a probability indicator or an estimated probability that characterizes the confidence that the event zone was correctly identified.

Figure 32:
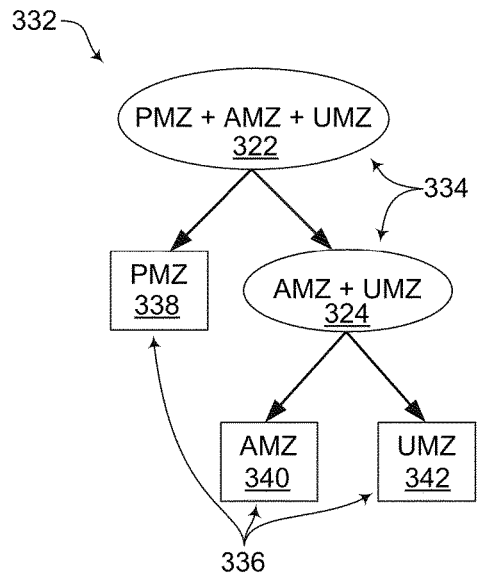
FIG. 32 is a binary decision tree illustration for a nonexclusive illustrative example of a zone identification method.

In some examples, event zone identification may be accomplished after the transient isolation procedure and event feature extraction by using a binary decision tree such as the binary decision tree 332 shown in FIG. 32. The decision tree 332 is an upside-down tree composed of two decision nodes 334, which are represented by ovals, and three leaves 336, which are represented by squares. In the illustrated example, at the first decision node 322, a decision is made whether the event is probably a PMZ event (PMZ class), as indicated by leaf 338, or the event is probably a non-PMZ event (non-PMZ or AMZ+UMZ class). At the second decision node 324, a decision is made whether the event is probably an AMZ event (AMZ class), as indicated by leaf 340, or probably a UMZ event (UMZ class), as indicated by leaf 342. As may be understood, the leaves represent the results of the decisions made at the decision nodes, such as based on the transient characteristics defined for each decision node.

In the first decision node 322 (PMZ class or non-PMZ class), the decision may be a binary hypothesis testing based on a first feature, $f_1$. The two hypotheses, $H_1$ and $H_2$, are set out in equations (39) and (40):

$H_1$: Event belongs to PMZ class (39)

$H_2$: Event belongs to AMZ+UMZ class (40)

Two probability density functions may be assumed, one for each hypothesis: $P_1(f_1)$ under $H_1$ and $P_2(f_1)$ under $H_2$. In some examples, the Neyman-Pearson criterion, which is a strategy based on the likelihood ratio, may be used for the decision making and formulated as set out in equation (41):

$$\left\{ \frac{P_2(f_1)}{P_1(f_1)} \geq \lambda \right\} \Rightarrow \rightarrow H_2 \qquad (41)$$

The decision level $\lambda$ may be determined by any suitable method, such as using a pre-assigned value of the probability of the event being a PMZ event. As the likelihood ratio depends only on $f_1$, a decision level $\tau_1$ for $f_1$ that corresponds to $\lambda$ can be numerically calculated from the equality set out in equation (42):

$$\frac{P_2(\tau_1)}{P_1(\tau_1)} = \lambda. \qquad (42)$$

In some examples, the same or a similar method may be used for the second decision node 324 (AMZ class or UMZ class).

A number of attributes or features may be utilized in the first decision node 322 for distinguishing PMZ events (PMZ class) from AMZ or UMZ events (non-PMZ class). However, the suitability of a particular proposed feature may depend on the feature's simplicity and/or its discriminating power. For example, the first feature, $f_1$, may be defined as in equation (43).

$$f_1 = \frac{\min_{n=1,\ldots,N_c}\{i_t[n]\}}{\max_{n=1,\ldots,N_t}\{i_t[n]\} - \min_{n=1,\ldots,N_c}\{i_t[n]\}} \qquad (43)$$

where the minima are calculated using the first $N_c$ samples (the number of samples being set, for example, by the hardware specifications) of the current transient and the maximum being calculated for the whole current transient ($N_t$ samples). In some examples, as with equation (43), the first feature $f_1$ may be calculated using only current signals; that is, without using voltage signals.

Figure 33:
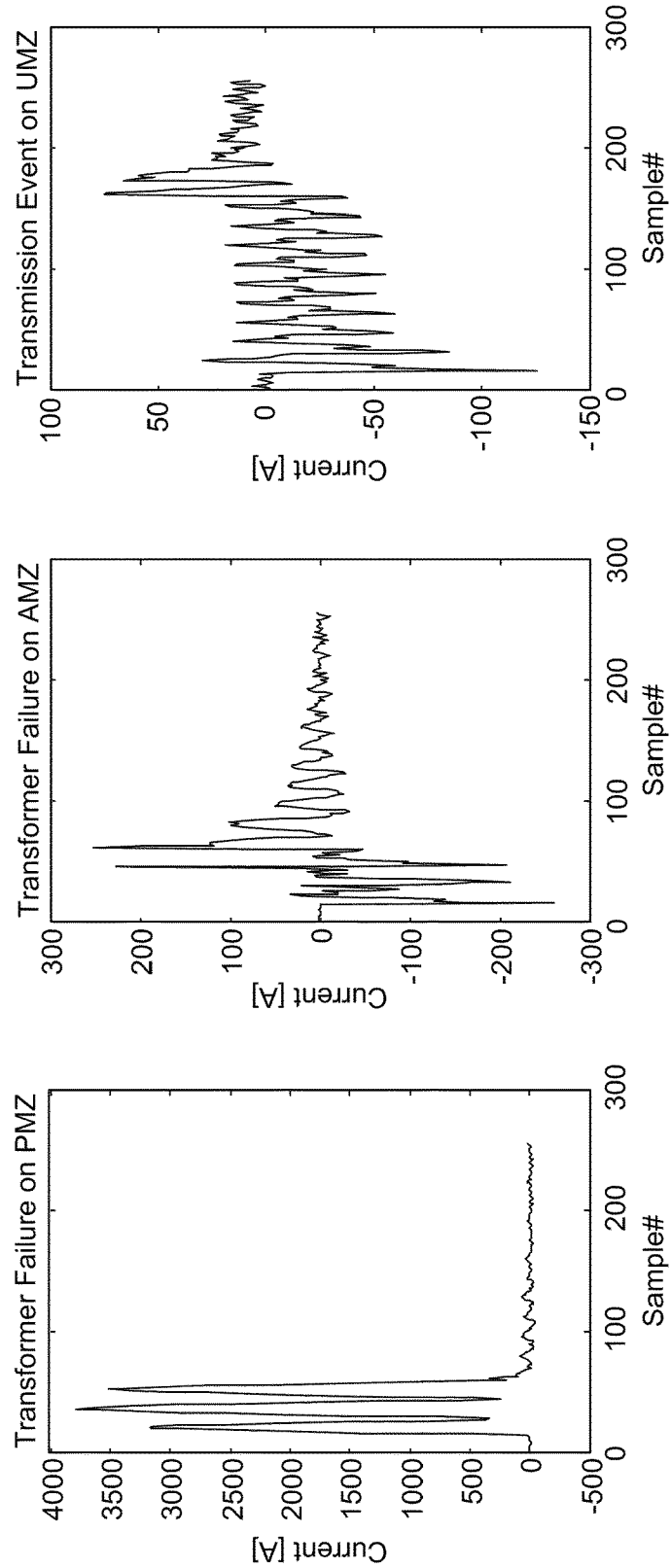
FIG. 33 includes graphs of illustrative isolated transient data for PMZ, Adjacent Monitoring Zone (AMZ) and Upstream Monitoring Zone (UMZ) events.
Figure 34:
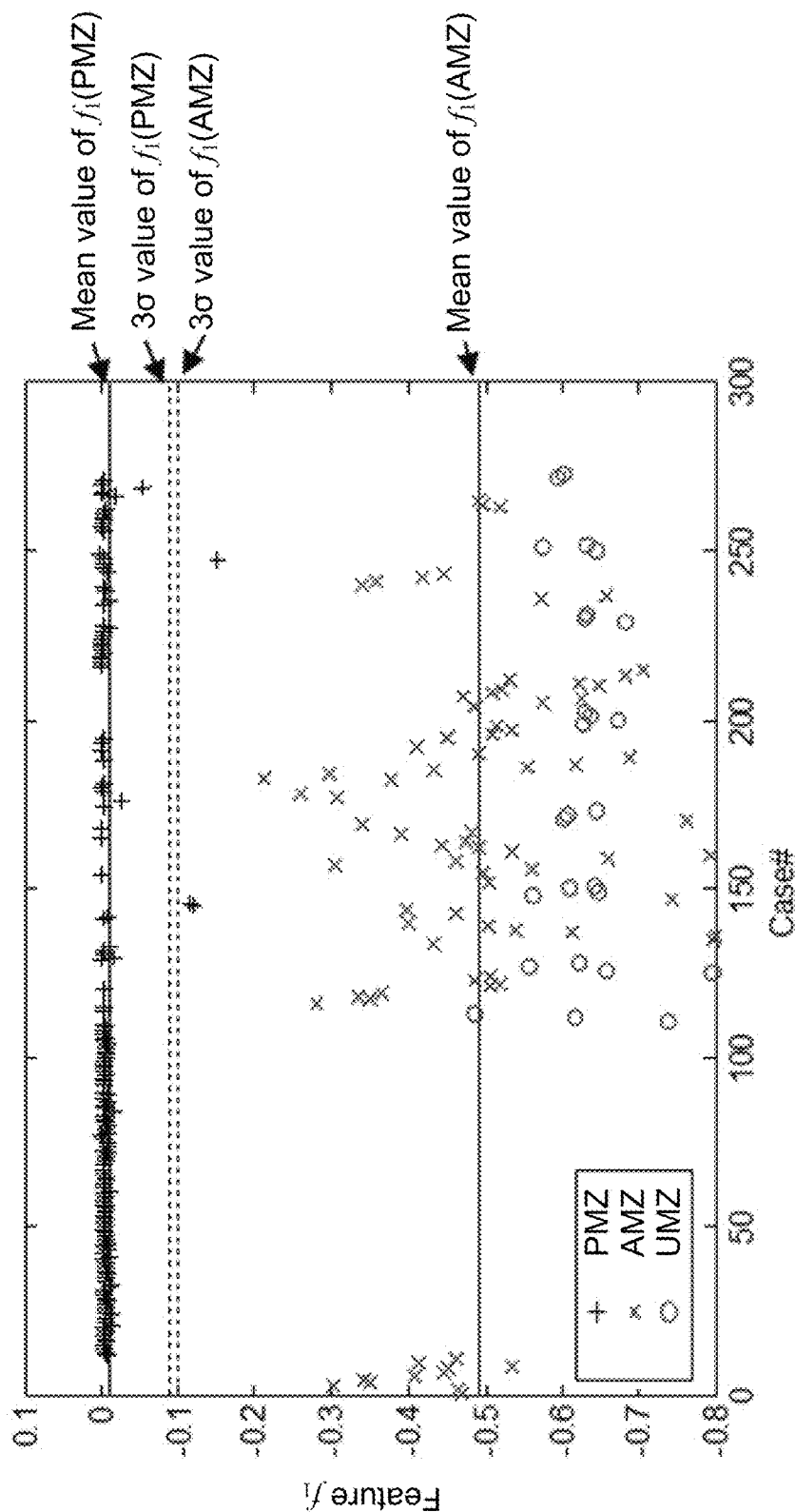
FIG. 34 is a scatter plot of illustrative first feature values such as may be obtained in the first zone identification decision nodes of FIGS. 31 and 32.
Figure 35:
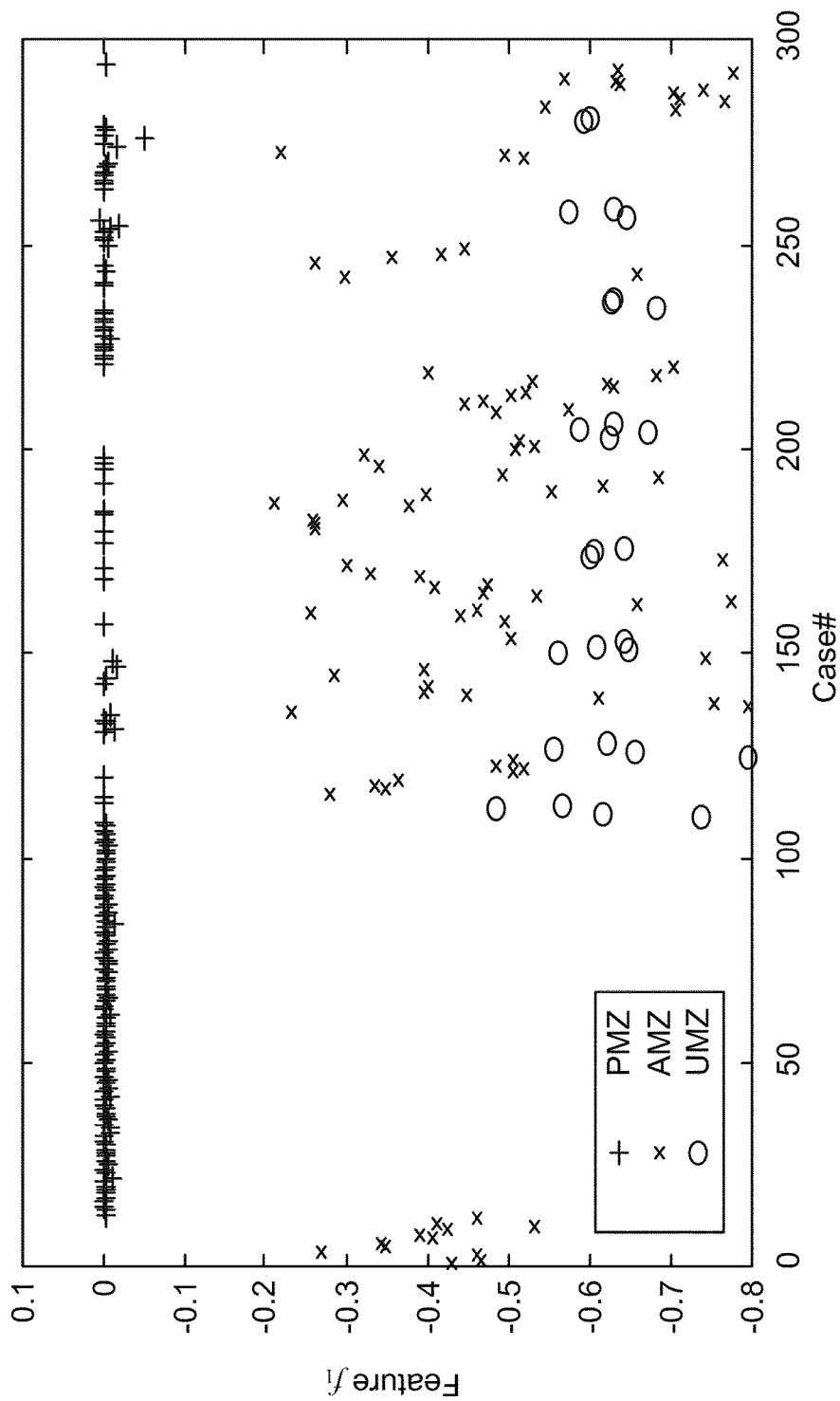
FIG. 35 is a scatter plot of "tuned" first feature values such as for the first feature values shown in FIG. 34.

The first feature $f_1$ defined in equation (43) relies on a unique underlying behavior of the Park's vector used in the transient isolation, as discussed above. In particular, as reflected in FIG. 33, the Park's vector has negative values during the first cycle of the transient for AMZ or UMZ events (middle and right graphs). In contrast, the Park's vector for a PMZ event are positive during the first cycle of the transient (left graph). The discriminating power of this definition for the first feature, $f_1$ is illustrated in the scatter plot of FIG. 34 for 300 cases. As may be seen, the PMZ events are generally well separated from AMZ and UMZ events, with minimum overlapping in the three-sigma ($3\sigma$) regions and only three PMZ cases outside the $3\sigma$-limits. The PMZ cases outside the $3\sigma$-limits in FIG. 34 may be switching transients with small negative values about one cycle from the beginning of the transient. However, by optimizing or tuning the transient window, for example, by using slightly less than $N_c$ samples, such as about 85%, these cases can also be correctly classified as shown in FIG. 35.

Figure 36:
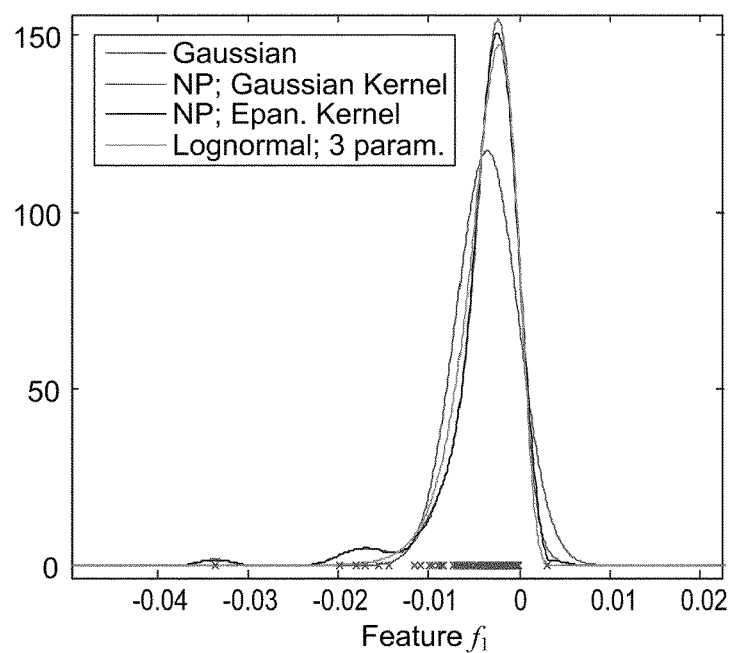
FIG. 36 plots the distributions obtained with several parametric and non-parametric models.
Figure 37:
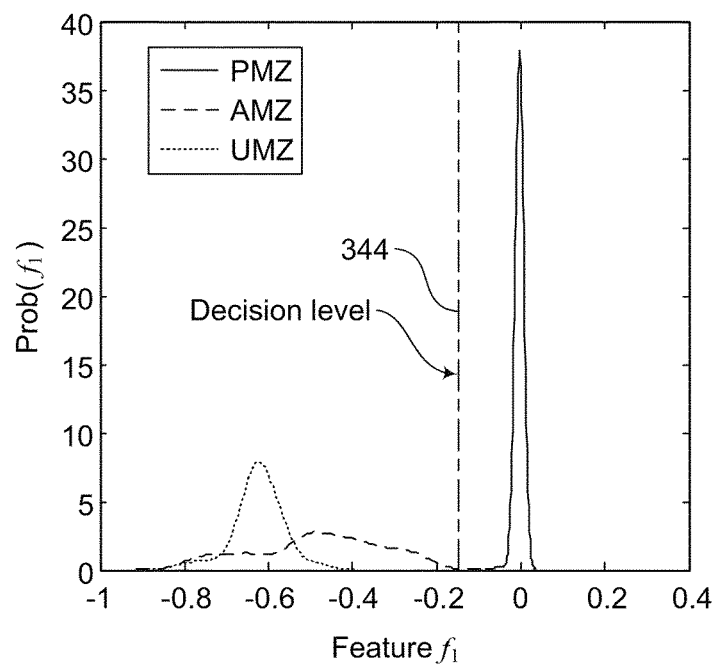
FIG. 37 is a plot of illustrative probability density functions for the "tuned" feature values for PMZ, AMZ and UMZ data shown in FIG. 35.

FIGS. 36 and 37 show the estimated distribution functions for $f_1$ using candidate kernel functions. FIG. 36 compares the distributions obtained with two parametric models (Gaussian model and 3-parameter lognormal model) and two non-parametric models (Gaussian and Epanechnikov kernels). As may be seen from FIG. 36, the non-parametric models are quite similar for this data set, and the 3-parameter lognormal model may be used for probability calculations. FIG. 37 shows the estimated probability distributions for all three classes of data (PMZ, AMZ, and UMZ events). As may be seen from FIG. 37, with the decision level 344 set at −0.15, the probability of identifying or determining that an event occurred in the PMZ is better than about 99.99%, while the probability of falsely or incorrectly identifying or determining that an event occurred in the PMZ, when the event actually occurred in the AMZ or in the UMZ, is less than about 0.50%.

Figure 38:
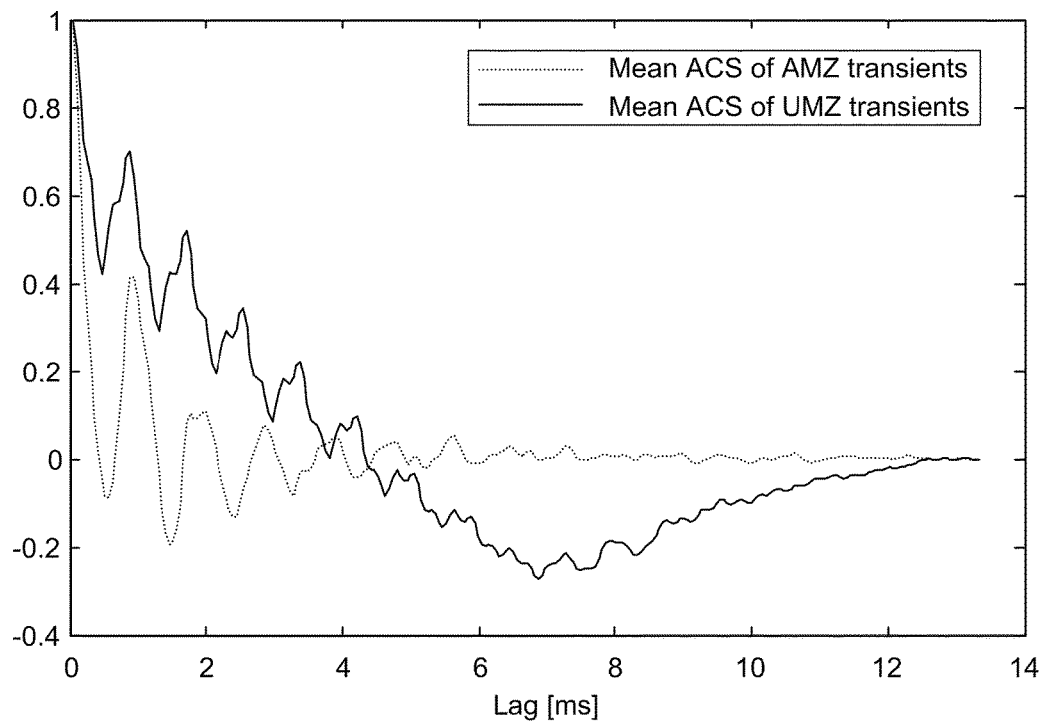
FIG. 38 is a plot of illustrative autocorrelation sequences for AMZ and UMZ transients.
Figure 39:
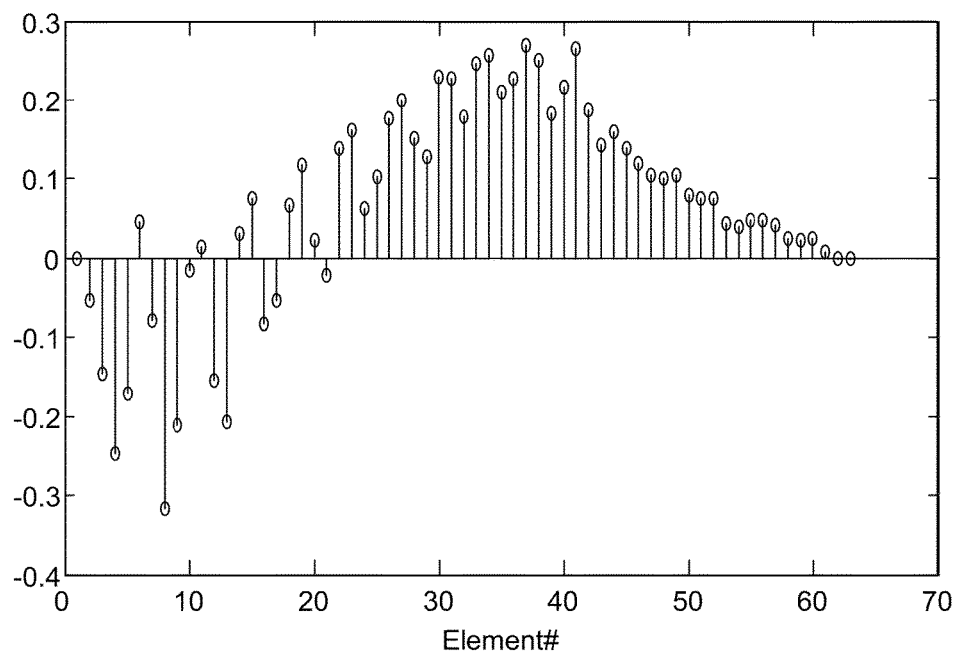
FIG. 39 is a plot of the elements of an illustrative transformation vector g.

However, as may be seen from the strong overlapping of the AMZ and UMZ event classes in FIG. 37, the first feature $f_1$, as defined in (43), has a relatively low discriminating power with regard to AMZ and UMZ event classes such that $f_1$ is not an appropriate attribute for the second decision node 324. Thus, for the second decision node 324 (AMZ class or UMZ class), a second feature, $f_2$, or set of features may be developed for class discrimination. An example attribute may be based on the autocorrelation sequence as depicted in FIG. 38. The mean values of the autocorrelation sequences of the transient current calculated for AMZ and UMZ events differ noticeably from each other. This characteristic can be developed into a feature by finding the best linear transformation that maps the autocorrelation sequence into one number using linear discriminate analysis (LDA). The transformation matrix, in this case a vector g, found by LDA is presented in FIG. 39. Accordingly, the second feature $f_2$ may be defined in equation (44) as:

$$f_2 = \sum_{n=1}^{N_{ac}} g[n] r_{ii}[n] \tag{44}$$

where g[n] is an element of the transformation vector g and $r_{ii}$ is the autocorrelation sequence of the transient $i_t$. The autocorrelation sequence is normalized so that the autocorrelations at zero lag are identically equal to one. As with the first feature $f_1$, in some examples, the second feature $f_2$ may be calculated using only current signals.

Figure 40:
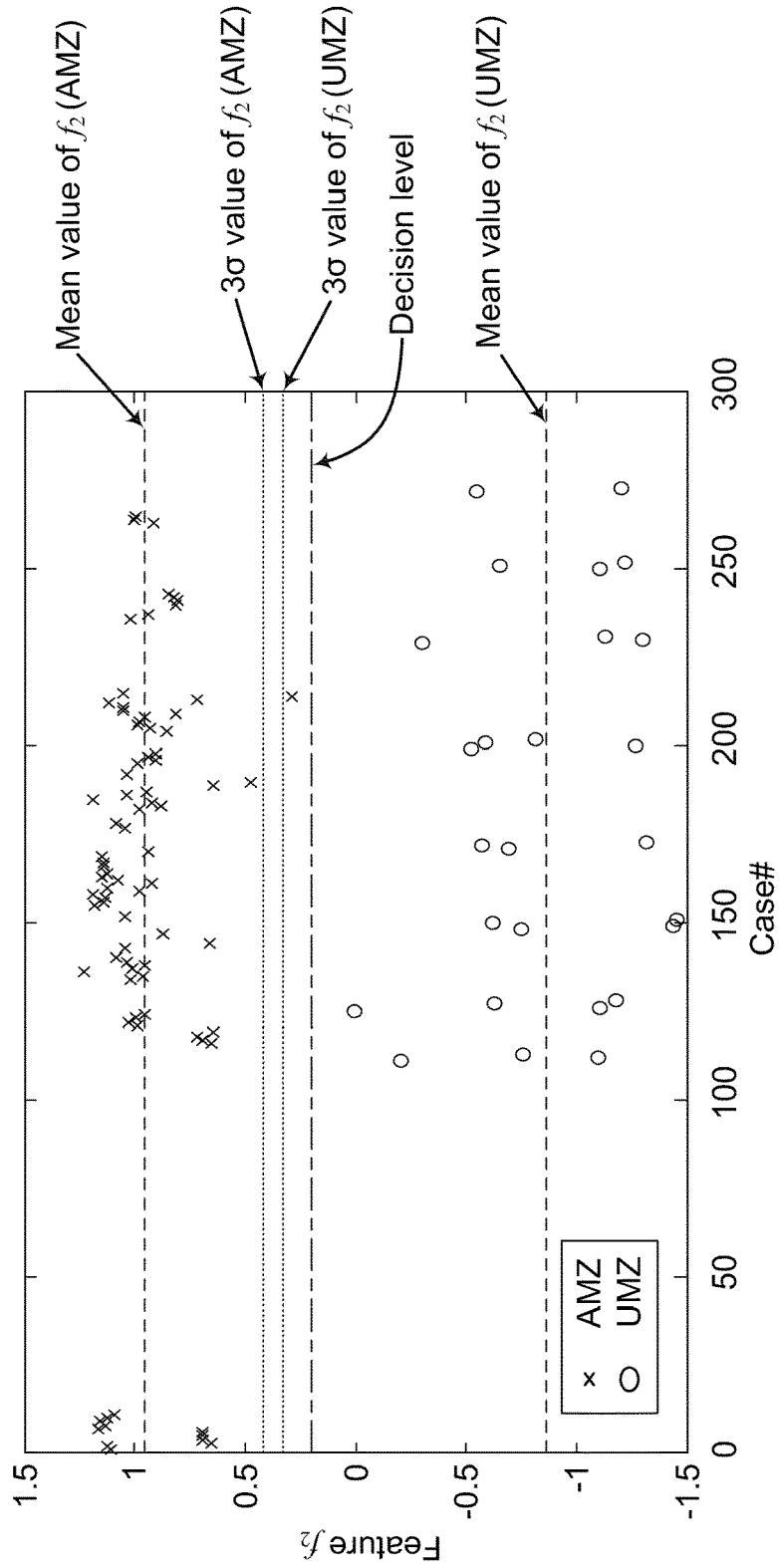
FIG. 40 is a scatter plot of illustrative second feature values such as may be obtained in the second zone identification decision nodes of FIGS. 31 and 32.
Figure 41:
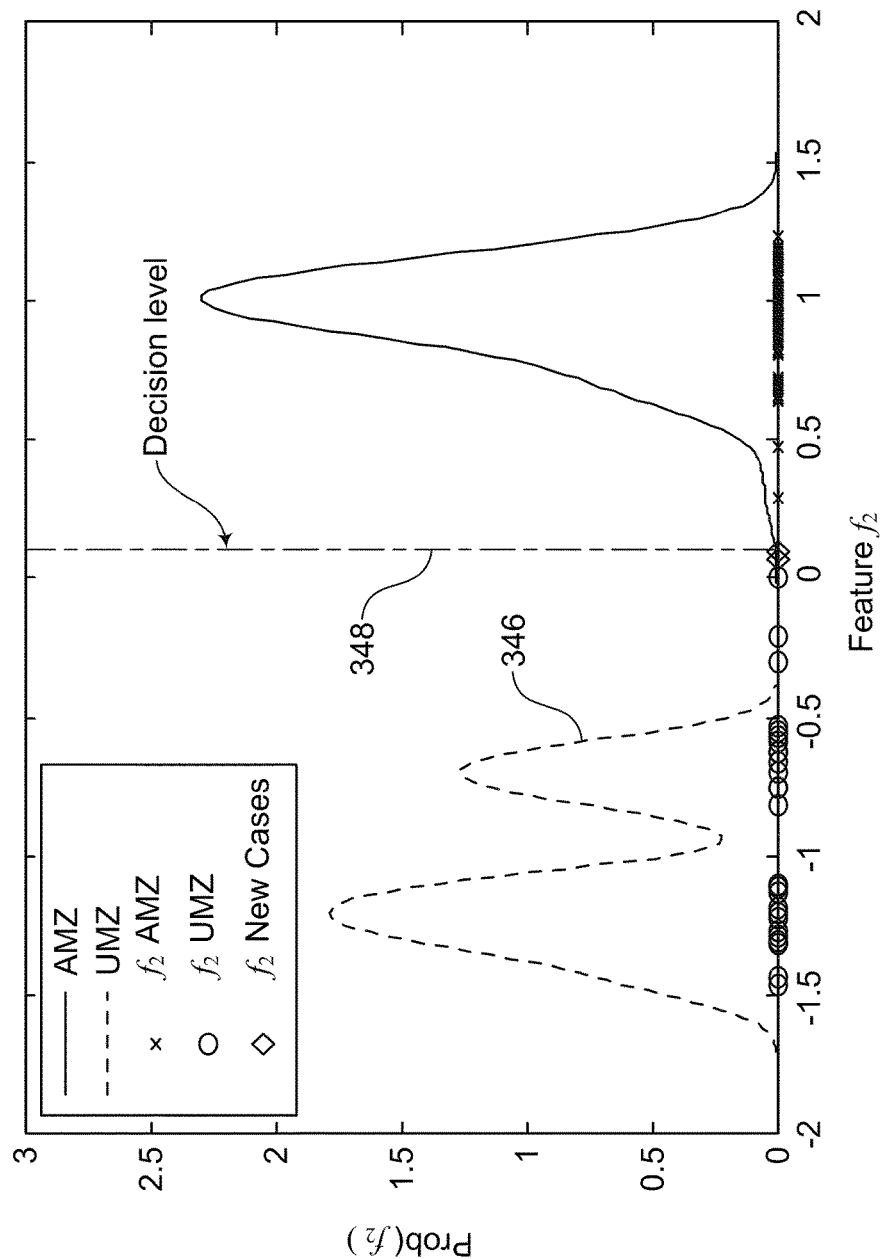
FIG. 41 is an estimate of illustrative AMZ and UMZ probability density functions.

A scatter plot of the second feature $f_2$ is shown in FIG. 40 with estimated probability density functions depicted in FIG. 41. As may be seen in FIGS. 40 and 41, the AMZ events are now well separated from the UMZ events, including at the 3σ-limits. As may be seen, only one AMZ value is outside the 3σ-limits.

Figure 42:
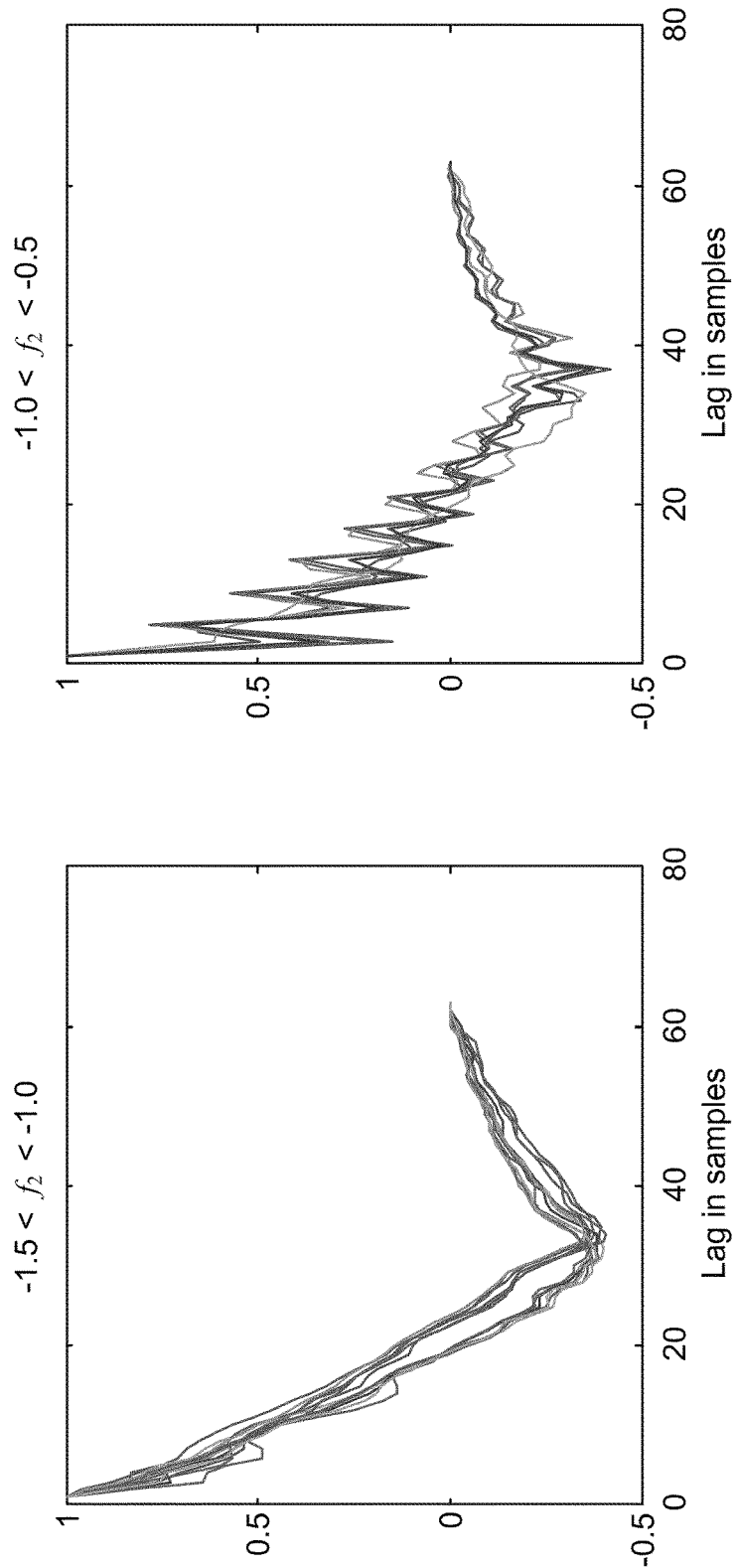
FIG. 42 includes plots of illustrative autocorrelation sequences calculated for UMZ events, with $-1.5<f_2<-1.0$ on the left and $-1.0<f_2<-0.5$ on the right.

As may be seen in FIG. 41, the density function 346 for UMZ events is bimodal, which can be verified from the autocorrelation sequences calculated for UMZ events, which are shown in FIG. 42. The bimodal density function for UMZ events indicates that there are two distinct UMZ events in the example data set. However, for the sake of classification in the second decision node 324, the normality approximation may be sufficient. As may be seen from FIG. 41, with the decision level 348 set at 0.10, the probability of identifying or determining that an event occurred in the AMZ is better than about 99.99%, while the probability of falsely or incorrectly identifying or determining that an event occurred in the UMZ, when it actually occurred in the AMZ, is less than about 0.50%.

Figure 43:
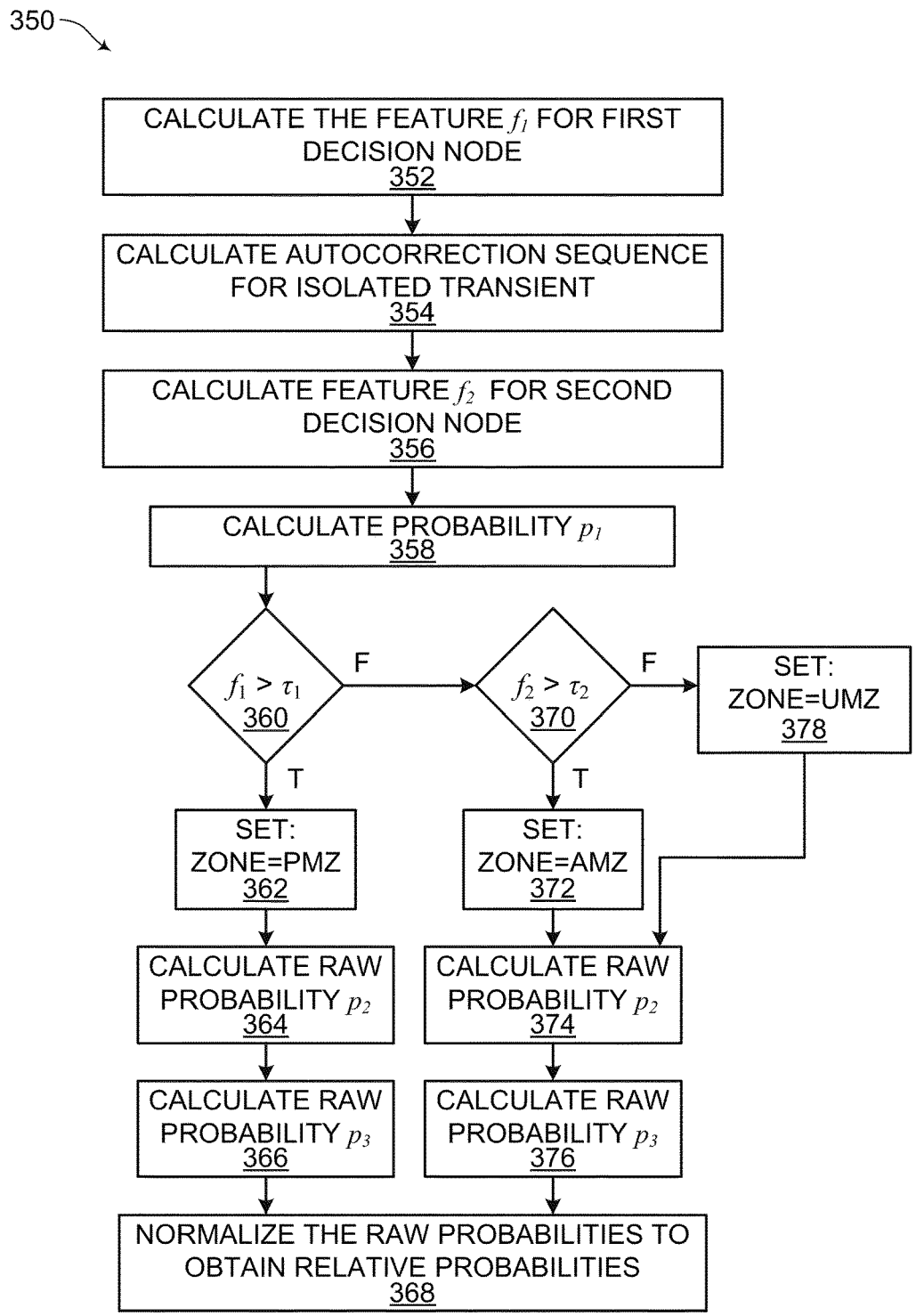
FIG. 43 is a flowchart showing another nonexclusive illustrative example of a method for power line event zone identification.

A nonexclusive illustrative example of a method for power line event zone identification, such as for execution by or with the event zone identification module 92, is schematically illustrated in a flow chart at 350 in FIG. 43. Although the actions of the method may be performed in the order in which they are presented, it is within the scope of this disclosure for the following actions, either alone or in various combinations, to be performed before and/or after any of the other following actions.

As shown in FIG. 43, a first feature $f_1$ may be calculated for the first decision node 322, as indicated at 352. In some examples, the first feature $f_1$ may be calculated according to equation (43). An autocorrelation sequence $r_{ii}[n]$ may be calculated for the isolated current transient $i_t$, as indicated at 354. A second feature $f_2$ may be calculated for the second decision node 324, as indicated at 356. In some examples, the second feature $f_2$ may be calculated according to equation (44).

As indicated at 358, a first probability $p_1$ may be calculated. In some examples, $p_1$ may be calculated using equation (45) based on assumptions that a given event is a PMZ event and the first feature $f_1$ follows a 3-parameter lognormal distribution:

$$p_1 = \frac{1}{z\sigma_{11}\sqrt{2\pi}} \exp\left[\frac{-(\ln(z) - \mu_{11})^2}{2\sigma_{11}^2}\right] \tag{45}$$

where $$z = \xi - f_1 \tag{46}$$

where ln(z) is normally distributed, and the 3-parameter lognormal distribution has a mean $\mu_{11}$ a standard deviation $\sigma_{11}$, and a threshold $\xi$.

A determination may be made at a first decision block 360 whether the first feature $f_1$ is greater than a first threshold or decision level $\tau_1$. If $f_1$ is greater than the first threshold $\tau_1$, the zone is set to PMZ, as indicated at 362, and a second probability $p_2$ may then be calculated, as indicated at 364. In some examples, $p_2$ is calculated using equation (47) based on assumptions that a given event is an AMZ event and the feature $f_1$ follows the normal distribution.

$$p_2 = \frac{1}{\sigma_{12}\sqrt{2\pi}} \exp\left(-0.5 * \left(\frac{f_1 - \mu_{12}}{\sigma_{12}}\right)^2\right) \tag{47}$$

with the mean $\mu_{12}$ and standard deviation $\sigma_{12}$.

At 366 a third probability $p_3$ is calculated. In some examples, $p_3$ is calculated using equation (48) based on assumptions that a given event is a UMZ event and the feature $f_1$ follows the normal distribution.

$$p_3 = \frac{1}{\sigma_{13}\sqrt{2\pi}} \exp\left(-0.5 * \left(\frac{f_1 - \mu_{13}}{\sigma_{13}}\right)^2\right) \tag{48}$$

with the mean $\mu_{13}$ and standard deviation $\sigma_{13}$.

Next, at 368, the raw probabilities may be normalized to obtain relative probabilities according to equations (49), (50) and (51):

$$p_1 = \frac{p_1}{(p_1 + p_2 + p_3)} \tag{49}$$

$$p_2 = \frac{p_2}{(p_1 + p_2 + p_3)} \tag{50}$$

$$p_{31} = \frac{p_3}{(p_1 + p_2 + p_3)} \quad (51)$$

If, at the first decision block 360, feature $f_1$ is not greater than or above threshold $\tau_1$, a determination may be made at a second decision block 370 whether $f_2$ is above a second threshold or decision level $\tau_2$. If $f_2$ is greater than the second threshold $\tau_2$, the zone is set to AMZ, as indicated at 372, and a second probability $p_2$ may then be calculated, as indicated at 374. In some examples, $p_2$ is calculated using equation (52) based on assumptions that a given event is an AMZ event and the feature $f_2$ follows the normal distribution.

$$p_2 = \frac{1}{\sigma_{21}\sqrt{2\pi}} \exp\left(-0.5 * \left(\frac{f_2 - \mu_{21}}{\sigma_{21}}\right)^2\right) \quad (52)$$

with the mean $\mu_{21}$ and standard deviation $\sigma_{21}$.

At 376, a third probability $p_3$ is calculated. In some examples, $p_3$ is calculated using equation (53) based on assumptions that a given event is a UMZ event and the feature $f_2$ follows the normal distribution.

$$p_3 = \frac{1}{\sigma_{22}\sqrt{2\pi}} \exp\left(-0.5 * \left(\frac{f_2 - \mu_{22}}{\sigma_{22}}\right)^2\right) \quad (53)$$

with the mean $\mu_{22}$ and standard deviation $\sigma_{22}$.

Next, at 368, the raw probabilities $p_1$, $p_2$ and $p_3$ may be normalized as discussed above. If, at the second decision block 370, $f_2$ is not greater than or above $\tau_2$, then the zone is set to UMZ, as indicated at 378, a second probability $p_2$ is calculated, as indicated at 374, and a third probability $p_3$ is calculated, as indicated at 376. In some examples, $p_2$ may be calculated according to equation (52), and $p_3$ may be calculated according to equation (53). At 368 the raw probabilities $p_1$, $p_2$ and $p_3$ are normalized as discussed above.

Thereafter, results such as the zone in which an event occurred and a probability value regarding the zone identification may be output to an operator, as indicated at 328 in FIG. 31. For example, the system or method may identify the PMZ as the zone where the event probably occurred. Additionally, where the system or method indicates a high probability that the event occurred in the PMZ, an operator can have relatively high confidence in the accuracy of the PMZ identification. In some examples, other or additional outputs might be provided to advanced users/engineers, such as an event classification or the characteristics of a device that operated in response to the event, such as to clear a fault.

The following paragraphs describe nonexclusive illustrative examples of methods for power line event zone identification and variations thereof, using the concepts and components disclosed herein. Although the actions of the disclosed methods and variations thereof may be performed in the order in which they are presented below, it is within the scope of this disclosure for the actions, either alone or in various combinations, to be performed before and/or after any of the other actions. Methods for power line event zone identification may include receiving measured data corresponding to a signal measured on a power line, determining from the measured data that a power line event has occurred, and identifying a probable one of at least two monitoring zones in which the power line event occurred. In some examples, the measured data may be received from the IED for which the at least two monitoring zones may be defined.

In some examples, the at least two monitoring zones for the IED may include a primary monitoring zone 40, an adjacent monitoring zone 42, and an upstream monitoring zone 44. In such examples, identifying the probable one of the monitoring zones may include deciding whether or not the power line event probably occurred in the primary monitoring zone.

In some examples, a first feature may be extracted from the measured data. In such examples, identifying the probable one of the monitoring zones may include deciding that the power line event probably occurred in the primary monitoring zone when the first feature is greater than a first threshold.

In some examples, a second feature may be extracted from the measured data. In such examples, identifying the probable one of the monitoring zones may include deciding that the power line event probably occurred in either the adjacent monitoring zone or the upstream monitoring zone when the first feature is not greater than the first threshold, deciding that the power line event probably occurred in the adjacent monitoring zone when the second feature is greater than a second threshold, and deciding that the power line event probably occurred in the upstream monitoring zone when the second feature is not greater than the second threshold.

In some examples, the signal may be a current along the power line measured proximate a substation bus, with at least one of the first and second features being extracted from the measured current.

In some examples, transient data corresponding to the power line event may be isolated from the measured data, with the probable one of the monitoring zones in which the power line event occurred being identified from the isolated transient data. The first and/or second feature may be extracted from the isolated transient data. In some examples, isolating the transient data may include applying Park's transformation to the measured data. In some examples, at least one event feature may be extracted from the isolated transient data, and at least one probable classification for the power line event may be determined at least partially from the at least one event feature.

In some examples, the power line event may be a fault that occurred in at least one phase and was cleared. In such examples, reference data may be subtracted from the measured data to estimate residual fault data, and a characteristic of a device that operated to clear the fault may be estimated from the residual fault data.

As may be understood, the system 80 and/or the methods embodied therein may perform any combination of the methods and processes disclosed herein. For example, in addition to identifying a probable monitoring zone in which a power line event occurred, the disclosed systems and methods may classify the event and/or estimate a characteristic of a device that operated in response to the event, such as where the event was a fault that was cleared and the characteristics of a device that operated to clear the fault are estimated. Likewise, in addition to classifying a power line event, the disclosed systems and methods may identify a probable monitoring zone in which the event occurred and/or estimate a characteristic of a device that operated in response to the event, such as where the event was a fault that was cleared and the characteristics of a device that operated to clear the fault are estimated. In some examples, in addition to estimating a characteristic of a device that operated in response to an event, such as where the event was a fault that was cleared and the characteristics of a device that operated to clear the fault are estimated, the disclosed systems and methods may classify the event and/or identify a probable monitoring zone in which the event occurred.

Although the above disclosure includes examples directed to general power line events as well as examples directed more specifically to faults, it is within the scope of the present disclosure that the various concepts of the disclosed systems and methods, including those discussed with regard to faults, may be applicable to general power line events as well as to faults.

The disclosed methods and systems may be embodied as or take the form of the methods and systems previously described, as well as of a transitory or non-transitory computer readable medium having computer-readable instructions stored thereon which, when executed by a processor, carry out operations of the disclosed methods and systems. The computer-readable medium may be any medium that can contain, store, communicate, propagate, or transport the program instruction for use by or in connection with the instruction execution system, apparatus, or device and may, by way of example but without limitation, be an electronic, magnetic, optical, electromagnetic, infrared, or semiconductor system, apparatus, device, or propagation medium or other suitable medium upon which the program is recorded. More specific examples (a non-exhaustive list) of such a computer-readable medium may include: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Computer program code or instructions for carrying out operations of the disclosed methods and systems may be written in any suitable programming language provided it allows achieving the previously described technical results.

The instructions may be configured for execution on any device having sufficient processing power and access to the required data, which may support or allow real-time operation and/or automated notification or operation. For example, the processor that executes the instructions may be communicatively linked to the IED and located in any suitable location, such as in a computer, server or gateway located at the substation or in a control room. In some examples, the method may be performed at least partially within the IED. For example, some IEDs may have sufficient processing power such that the methods may be fully embedded into an IED platform.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the disclosure includes all novel and non-obvious combinations and subcombinations of the various elements, features, functions and/or properties disclosed herein. Similarly, recitation in the disclosure and/or the claims of "a" or "a first" element, or the equivalent thereof, should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

What is claimed is:

1. A method for power line event zone identification, wherein at least two monitoring zones are defined for an Intelligent Electronic Device (IED) that is configured to monitor and/or numerically process sampled values in an electrical power system, wherein the IED is linked to or within at least one computer processor, the at least two monitoring zones comprise a primary monitoring zone and an adjacent monitoring zone, the primary monitoring zone corresponds to a power line monitored by the IED, and the adjacent monitoring zone corresponds to a power line other than the power line monitored by the IED, the method comprising:
    connecting the IED to the power line;
    measuring, with the IED, a signal on the power line monitored by the IED;
    sending from the TED to the at least one computer processor measured data corresponding to the signal measured by the TED; and
    receiving from the at least one computer processor information about a probable one of the at least two monitoring zones in which the power line event occurred, wherein the at least one computer processor is further configured to:
        determine from the measured data that a power line event has occurred;
        determine a result from the measured data regarding which of the primary monitoring zone or adjacent monitoring zone is the probable one of the at least two monitoring zones in which the power line event occurred; and
        display the result to a user/operator of the computer processor,
    wherein:
        the at least two monitoring zones comprise an upstream monitoring zone;
        the power line monitored by the IED is a first distribution feeder coupled to a substation bus;
        the adjacent monitoring zone comprises a second distribution feeder coupled to the substation bus; and
        the upstream monitoring zone comprises an upstream network connected to the substation bus;
        the at least one computer processor being configured to determine the result from the measured data regarding which of the primary monitoring zone or the adjacent monitoring zone is the probable one of the at least two monitoring zones in which the power line event occurred comprises the at least one computer processor being configured to decide based on the measured data if the power line event probably occurred on either the first distribution feeder, the second distribution feeder or the upstream network.

2. The method of claim 1, wherein the at least one computer processor is configured to:
  isolate from the measured data transient data corresponding to the power line event; and
  determine from the isolated transient data if either the primary monitoring zone or the adjacent monitoring zone is the probable one of the at least two monitoring zones in which the power line event occurred.

3. The method of claim 1, wherein the at least one computer processor is configured to extract a feature from the measured data, and the at least one computer processor being configured to determine a result from the measured data regarding which of the primary monitoring zone or the adjacent monitoring zone is the probable one of the at least two monitoring zones comprises the at least one computer processor being configured to decide that the power line event probably occurred in the primary monitoring zone when the feature is greater than a threshold.

4. The method of claim 3, wherein the feature is a first feature, the threshold is a first threshold, the at least one computer processor is configured to extract a second feature from the measured data, and the at least one computer processor being configured to determine a result from the measured data regarding which of the primary monitoring zone or the adjacent monitoring zone is the probable one of the at least two monitoring zones comprises the at least one computer processor being configured to:
  decide that the power line event probably occurred in one of the adjacent monitoring zone and the upstream monitoring zone when the first feature is not greater than the first threshold; and
  decide that the power line event probably occurred in the adjacent monitoring zone when the second feature is greater than a second threshold.

5. The method of claim 4, wherein the at least one computer processor being configured to determine a result from the measured data regarding which of the primary monitoring zone or the adjacent monitoring zone is the probable one of the at least two monitoring zones comprises the at least one computer processor being configured to decide that the power line event probably occurred in the upstream monitoring zone when the second feature is not greater than the second threshold.

6. The method of claim 4, wherein the signal is a current along the power line measured proximate the substation bus, and at least one of the first and second features is extracted from the measured current.

7. The method of claim 3, wherein the at least one computer processor is configured to isolate from the measured data transient data corresponding to the power line event, wherein the feature is extracted from the isolated transient data.

8. The method of claim 7, wherein the at least one computer processor being configured to isolate the transient data comprises the at least one computer processor being configured to apply Park's transformation to the measured data.

9. The method of claim 7, wherein the at least one computer processor is configured to:
  extract at least one event feature from the isolated transient data; and
  determine at least partially from the at least one event feature at least one probable classification for the power line event.

10. The method of claim 1, wherein the power line event is a fault that occurred in at least one phase and was cleared, and the at least one computer processor is configured to:
  subtract reference data from the measured data to estimate residual fault data; and
  estimate from the residual fault data a characteristic of a device that operated to clear the fault.

11. The method of claim 10, wherein the at least one computer processor is configured to determine at least one probable classification for the power line event.

12. A system for power line event zone identification, the system comprising:
  an Intelligent Electronic Device (IED) connected to a power line and configured to measure a signal on the power line, wherein the IED is further configured to monitor and/or numerically process sampled values in an electrical power system, wherein at least two monitoring zones are defined for the IED, the at least two monitoring zones comprise a primary monitoring zone and an adjacent monitoring zone, the primary monitoring zone corresponds to the power line monitored by the IED, and the adjacent monitoring zone corresponds to a power line other than the power line monitored by the IED; and
  a processor linked to or within the IED that is configured to execute instructions to perform a method, the instructions comprising instructions to:
    determine from a signal measured on the power line by the IED and provided to the processor by the IED that a power line event has occurred;
    determine a result from the measured signal regarding which of the primary monitoring zone and the adjacent monitoring zone is a probable one of the at least two monitoring zones in which the power line event occurred; and
    display the result to a user/operator of the processor,
  wherein:
    the at least two monitoring zones comprise an upstream monitoring zone;
    the power line monitored by the IED is a first distribution feeder coupled to a substation bus;
    the adjacent monitoring zone comprises a second distribution feeder coupled to the substation bus;
    the upstream monitoring zone comprises an upstream network connected to the substation bus;
    the processor being configured to determine a result from the measured signal regarding which of the primary monitoring zone and the adjacent monitoring zone is the probable one of the at least two monitoring zones in which the power line event occurred comprises the processor being configured to decide based on the measured signal if the power line event probably occurred on either the first distribution feeder, the second distribution feeder or the upstream network.

13. The system of claim 12, wherein the instructions comprise instructions to:
  isolate from the measured signal a transient signal corresponding to the power line event; and
  determine from the isolated transient signal if either the primary monitoring zone or the adjacent monitoring zone is the probable one of the at least two monitoring zones in which the power line event occurred.

14. The system of claim 12, wherein the instructions comprise instructions to extract a feature from the measured signal, and the instructions to determine a result from the measured signal regarding which of the primary monitoring zone and the adjacent monitoring zone is the probable one of the at least two monitoring zones comprise instructions to decide that the power line event probably occurred on the distribution feeder when the feature is greater than a threshold.

15. The system of claim 14, wherein the feature is a first feature, the threshold is a first threshold, the instructions comprise instructions to extract a second feature from the measured signal, and the instructions to determine a result from the measured signal regarding which of the primary monitoring zone and the adjacent monitoring zone is the probable one of the at least two monitoring zones comprise instructions to:
  decide that the power line event probably occurred on either the second distribution feeder or the upstream network when the first feature is not greater than the first threshold;
  decide that the power line event probably occurred on the second distribution feeder when the second feature is greater than a second threshold; and
  decide that the power line event probably occurred on the upstream network when the second feature is not greater than the second threshold.

16. The system of claim 14, wherein the instructions comprise instructions to apply Park's transformation to the measured signal to isolate from the measured signal a transient signal corresponding to the power line event, and the feature is extracted from the isolated transient signal.

17. The system of claim 16, wherein the power line event is a fault that occurred in at least one phase and was cleared, and the instructions comprise instructions to:
  extract at least one event feature from the isolated transient signal;
  determine at least partially from the at least one event feature at least one probable classification for the power line event;
  subtract a reference signal from the measured signal to estimate a residual fault signal; and
  estimate from the residual fault signal a characteristic of a device that operated to clear the fault.

* * * * *